United States Patent
Lee et al.

(10) Patent No.: US 12,512,367 B2
(45) Date of Patent: Dec. 30, 2025

(54) METHOD FOR FABRICATING A SEMICONDUCTOR DEVICE

(71) Applicant: SAMSUNG ELECTRONICS CO., LTD., Suwon-si (KR)

(72) Inventors: Ui Hyoung Lee, Hwaseong-si (KR); Hyun Jun Ahn, Hwaseong-si (KR); Ho Nyun Park, Hwaseong-si (KR); Jong Seok Lee, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 771 days.

(21) Appl. No.: 17/708,201

(22) Filed: Mar. 30, 2022

(65) Prior Publication Data

US 2023/0058819 A1 Feb. 23, 2023

(30) Foreign Application Priority Data

Aug. 17, 2021 (KR) .................. 10-2021-0107793

(51) Int. Cl.
| | |
|---|---|
| *H01L 21/768* | (2006.01) |
| *B82Y 10/00* | (2011.01) |
| *H01L 21/56* | (2006.01) |
| *H01L 25/18* | (2023.01) |
| *H10B 12/00* | (2023.01) |
| *H10B 43/27* | (2023.01) |
| *H10D 30/01* | (2025.01) |
| *H10D 30/43* | (2025.01) |
| *H10D 30/67* | (2025.01) |
| *H10D 62/10* | (2025.01) |

(52) U.S. Cl.
CPC ...... *H01L 21/76874* (2013.01); *H01L 21/565* (2013.01); *H01L 21/76873* (2013.01)

(58) Field of Classification Search
CPC .................. H10B 43/27; H01L 25/18; H01L 2225/06541; H01L 21/76874; H01L 21/76873
See application file for complete search history.

(56) References Cited

U.S. PATENT DOCUMENTS

| | | | |
|---|---|---|---|
| 6,829,823 | B2 | 12/2004 | Downes, Jr. et al. |
| 6,863,794 | B2 | 3/2005 | Tsai et al. |
| 7,666,788 | B2 | 2/2010 | Sinha |
| 7,781,321 | B2 | 8/2010 | Gambino et al. |

(Continued)

FOREIGN PATENT DOCUMENTS

| | | |
|---|---|---|
| KR | 10-2015-0009401 A | 1/2015 |
| KR | 10-2016-0013765 A | 2/2016 |

*Primary Examiner* — Mohsen Ahmadi
(74) *Attorney, Agent, or Firm* — Muir Patent Law, PLLC

(57) ABSTRACT

A method for fabricating a semiconductor device includes forming a mold structure on a substrate, the mold structure including inter-electrode insulating films and sacrificial films alternately and repeatedly stacked in a first direction, forming a channel hole which penetrates the mold structure in the first direction, forming a vertical channel structure inside the channel hole, removing the sacrificial films to form trenches which expose the vertical channel structure, the trenches extending in a second direction perpendicular to the first direction, and forming metallic lines which fill the trenches, respectively, each of the metallic lines being formed as a single layer, using a wet deposition process.

17 Claims, 53 Drawing Sheets

(56) References Cited

U.S. PATENT DOCUMENTS

| | | | |
|---|---|---|---|
| 9,023,719 B2* | 5/2015 | Pachamuthu | H10D 30/0413 |
| | | | 257/326 |
| 9,287,207 B2 | 3/2016 | Sinha | |
| 9,391,054 B2* | 7/2016 | Dubin | H01L 25/167 |
| 2015/0079765 A1* | 3/2015 | Pachamuthu | H10B 43/35 |
| | | | 438/478 |
| 2016/0307908 A1* | 10/2016 | Sharangpani | H10B 41/27 |
| 2017/0069636 A1* | 3/2017 | Park | H10B 43/27 |
| 2017/0104000 A1* | 4/2017 | Park | H10B 43/27 |
| 2018/0323138 A1 | 11/2018 | Schuckman et al. | |
| 2020/0194451 A1* | 6/2020 | Lee | H01L 21/76831 |
| 2021/0288067 A1* | 9/2021 | Kanamori | H10B 43/27 |
| 2021/0313344 A1* | 10/2021 | Ryu | H10B 41/27 |
| 2021/0327892 A1* | 10/2021 | Jung | H10B 43/10 |
| 2022/0173118 A1* | 6/2022 | Kang | H10B 43/10 |
| 2022/0181345 A1* | 6/2022 | Hwang | H10B 43/40 |
| 2022/0199626 A1* | 6/2022 | Chung | H10B 12/50 |
| 2022/0336586 A1* | 10/2022 | Kim | H10B 43/27 |
| 2022/0344244 A1* | 10/2022 | Ryu | H01L 23/481 |
| 2022/0344368 A1* | 10/2022 | Kang | H10B 43/27 |
| 2022/0384477 A1* | 12/2022 | Kwon | H01L 23/535 |
| 2022/0384478 A1* | 12/2022 | Son | H10B 41/35 |
| 2022/0384479 A1* | 12/2022 | Song | H10B 43/10 |
| 2022/0392918 A1* | 12/2022 | Choi | H01L 21/02565 |
| 2022/0399273 A1* | 12/2022 | Yu | H10B 43/10 |
| 2022/0415909 A1* | 12/2022 | Lee | H10B 41/30 |
| 2023/0012115 A1* | 1/2023 | Kim | H10B 43/10 |
| 2023/0014037 A1* | 1/2023 | Jung | H10B 41/10 |
| 2023/0028532 A1* | 1/2023 | Kohji | H10B 43/35 |
| 2023/0054580 A1* | 2/2023 | Ie | C23C 16/45544 |
| 2023/0229073 A1* | 7/2023 | Kim | G03F 1/36 |
| | | | 716/53 |
| 2023/0232627 A1* | 7/2023 | Lee | H10B 43/27 |
| | | | 257/324 |
| 2023/0262980 A1* | 8/2023 | Sim | H01L 23/535 |
| | | | 257/324 |
| 2023/0284450 A1* | 9/2023 | Lee | H10B 41/40 |
| | | | 257/314 |
| 2024/0155840 A1* | 5/2024 | Chae | H10B 43/20 |

* cited by examiner

METHOD FOR FABRICATING A SEMICONDUCTOR DEVICE

CROSS-REFERENCE TO RELATED APPLICATION

This application claims priority from Korean Patent Application No. 10-2021-0107793 filed on Aug. 17, 2021, in the Korean Intellectual Property Office, and all the benefits accruing therefrom under 35 U.S.C. 119, the contents of which in its entirety are herein incorporated by reference.

BACKGROUND

1. Field

The present disclosure relates to a method for fabricating a semiconductor device.

2. Description of the Related Art

It is required to increase the degree of integration of semiconductor devices to satisfy the excellent performance and low price required by consumers. In the case of the semiconductor devices, because the degree of integration is an important factor in determining the price of a product, an increased degree of integration is particularly required. In the case of a two-dimensional or planar semiconductor device, the degree of integration is mainly determined by an area occupied by unit memory cells, and is therefore greatly affected by the level of a fine pattern forming technique.

However, since the miniaturization of patterns requires ultra-expensive apparatuses, the degree of integration of the two-dimensional semiconductor device is increasing, but it is still limited. As a result, three-dimensional semiconductor memory devices including memory cells arranged three-dimensionally has been proposed.

SUMMARY

According to an aspect of the present disclosure, there is provided a method for fabricating a semiconductor device, the method including, forming a mold structure in which an inter-electrode insulating film and sacrificial films are alternately and repeatedly stacked in a first direction, on a substrate, forming a channel hole which penetrates the mold structure in the first direction, forming a vertical channel structure inside the channel hole, removing the sacrificial film to form a trench which exposes the vertical channel structure and extends in a second direction perpendicular to the first direction; and forming a metallic line which fills the trench, wherein the metallic line is formed of a single layer, using a wet deposition process.

According to another aspect of the present disclosure, there is provided a method for fabricating a semiconductor device, the method including, forming a trench extending in a first direction, inside a substrate, forming a gate electrode that fills the trench, forming a conductive pattern extending in a second direction intersecting the first direction, on the gate electrode, and forming a capacitor on the conductive pattern, wherein the gate electrode is formed of a single layer, using a wet deposition process.

According to yet another aspect of the present disclosure, there is provided a method for fabricating a semiconductor device, the method including, forming an active pattern extending in a first direction, on a substrate, forming a dummy gate electrode which intersects the active pattern and extends in a second direction intersecting the first direction, on the active pattern, removing the dummy gate electrode to form a trench, and forming a gate electrode that fills the trench, wherein the gate electrode is formed of a single layer, using a wet deposition process.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, a metal layer deposition process according to some embodiments will be described referring to FIGS. 1A to 2D.

FIGS. 1A to 1D are diagrams for explaining the metal layer deposition process according to some embodiments.

Figure 1A:
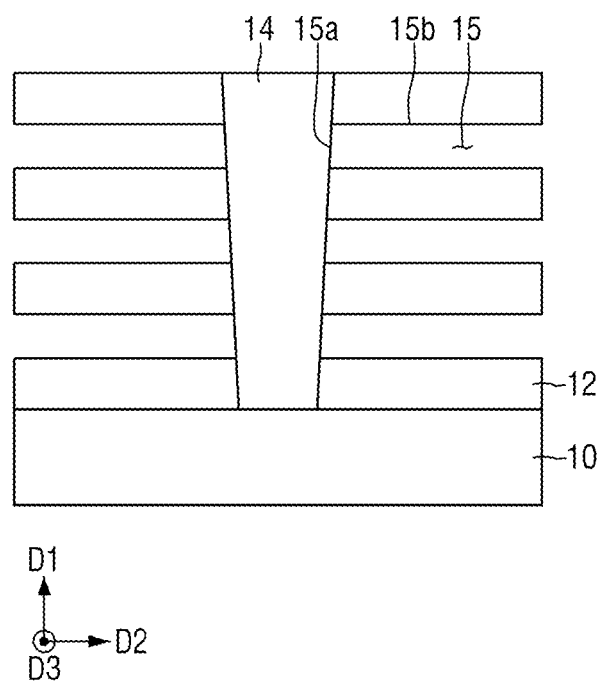
FIGS. 1A to 1D are diagrams for explaining a metal layer deposition process according to some embodiments.

Referring to FIG. 1A, an insulating film 12 and a sacrificial film may be formed on a first substrate 10. For convenience of explanation, the sacrificial film is not shown. The plurality of insulating films 12 and the plurality of sacrificial films may be alternately stacked on the substrate 10 in a first direction D1, e.g., on top of each other in a vertical direction.

Subsequently, a vertical structure 14 that penetrates the plurality of insulating films 12 and the plurality of sacrificial films may be formed. Side walls of the vertical structure 14 are shown as being tapered in FIG. 1A, but embodiments are not limited thereto.

The sacrificial film may then be removed to form a first trench 15. The first trench 15 may expose the vertical structure 14. The first trench 15 may expose the insulating film 12. The first trench 15 may extend in a second direction D2. The first trench 15 may extend in a third direction D3. The first direction D1 and the second direction D2 may be perpendicular to each other. The third direction D3 may be perpendicular to the first direction D1 and the second direction D2. That is, the first trench 15 may extend in the second direction D2 and the third direction D3 in a plane including the second direction D2 and the third direction D3.

In some embodiments, the first trench 15 may include a first side 15a that exposes the vertical structure 14, and a second side 15b that exposes the insulating film 12. The second side 15b may extend in the second direction D2. The first side 15a may extend along the side walls of the vertical structure 14. A width of the first trench 15 in the first direction D1 may be 20 nm or less. A width between the second sides 15b of the first trench 15 may be 30 nm or less. Preferably, the width between the second sides 15b of the first trench 15 may be 20 nm or less.

For example, the first substrate 10 may include, e.g., one of a silicon substrate, a silicon germanium substrate, a germanium substrate, an SGOI (silicon germanium on insulator), an SOI (silicon-on-insulator), and a GOI (Germanium-On-Insulator). In another example, the first substrate 10 may include semiconductor materials, e.g., indium antimonide, lead tellurium compounds, indium arsenic, indium phosphide, gallium arsenide or gallium antimonide. The insulating film 12 may include, e.g., silicon oxide. The vertical structure 14 may include semiconductor materials, e.g., silicon (Si), germanium (Ge) or mixtures thereof, insulating materials, e.g., silicon oxide and silicon nitride, and combinations thereof.

Figure 1B:
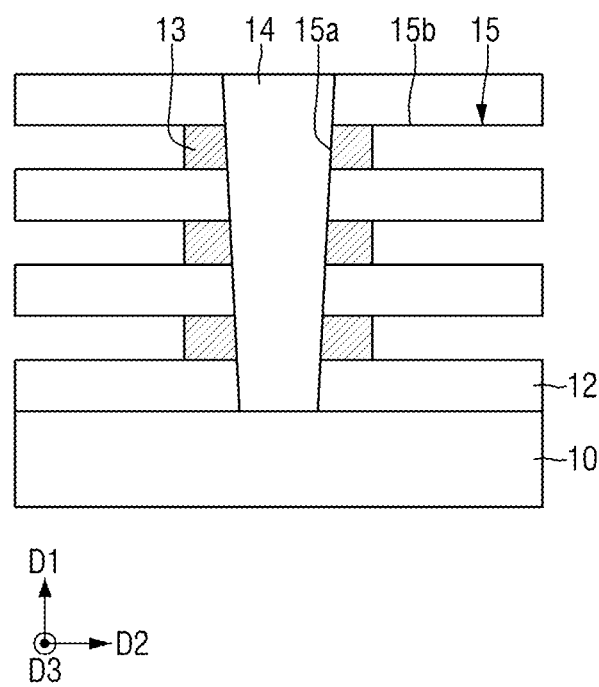
Figure 1C:
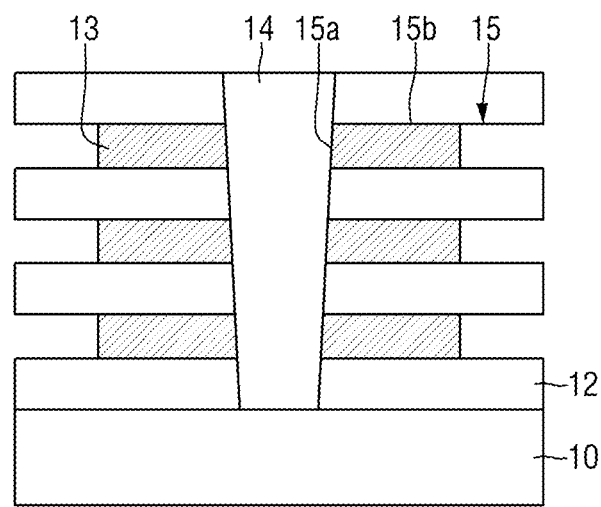
Figure 1D:
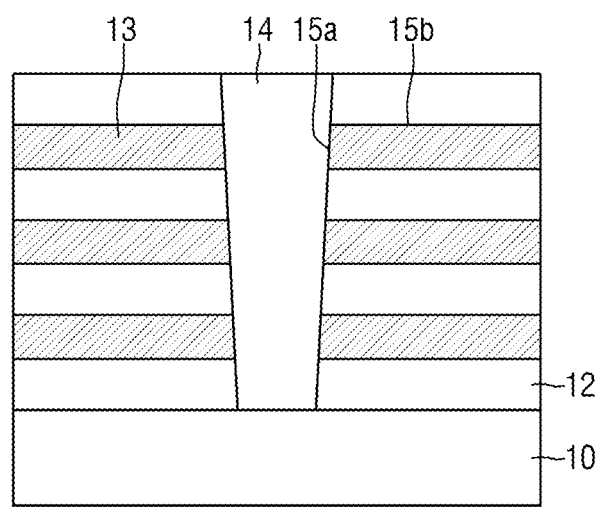
Figure 1D:
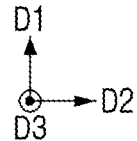

Referring to FIGS. 1B to 1D, a first metal layer 13 may be formed inside the first trench 15.

The first metal layer 13 may be deposited using a wet deposition process. For example, the first metal layer 13 may be deposited using electroless plating or an electroplating deposition process. The first metal layer 13 may be formed in a bottom-up manner. The 'bottom-up' manner refers to a deposition from one side in one direction. That is, the first metal layer 13 may be formed in the bottom-up manner, using the electroless plating or an electroplating deposition process.

For example, in FIG. 1B, the first metal layer 13 may be deposited from the first side 15a of the first trench 15. The first metal layer 13 may be formed in the second direction D2 from the first side 15a of the first trench 15, e.g., the first metal layer 13 may grow and increases its thickness only in the second direction D2 from the first side 15a of the first trench 15. The first metal layer 13 is not formed along the second side 15b of the first trench 15 (e.g., during deposition, the first metal layer 13 may not be directly deposited on the second side 15b or grow from the second side 15b but only from the first side 15a).

In FIG. 1C, the first metal layer 13 may be continuously deposited in the second direction D2. Even in this case, the first metal layer 13 may not be formed, e.g., directly deposited, on the second side 15b of the first trench 15.

In FIG. 1D, the first metal layer 13 may be continuously deposited in the second direction D2. The first metal layer 13 may, e.g., completely, fill the first trench 15.

The first metal layer 13 may be formed from the first side 15a of the first trench 15 in the bottom-up manner, e.g., to have a substantially uniform thickness in the second direction D2. Therefore, a void or seam may not be formed inside the first metal layer 13.

The first metal layer 13 may be a single layer. A barrier film may not be formed before the first metal layer 13 is formed. The first metal layer 13 may include, e.g., at least one of copper (Cu), tungsten (W), nickel (Ni), molybdenum (Mo), cobalt (Co), and ruthenium (Ru). Preferably, the first metal layer 13 may include, e.g. nickel (Ni).

The first metal layer 13 may not include fluorine (F) or chlorine (Cl). The first metal layer 13 may be formed without using a precursor. Therefore, impurities may not be included inside the first metal layer 13.

FIGS. 2A to 2D are diagrams for explaining a metal layer deposition process according to some embodiments. For reference, FIGS. 2A to 2D may be diagrams for explaining the process by which the trench extends in the first direction D1, and a metal layer that fills the trench is formed.

Figure 2A:
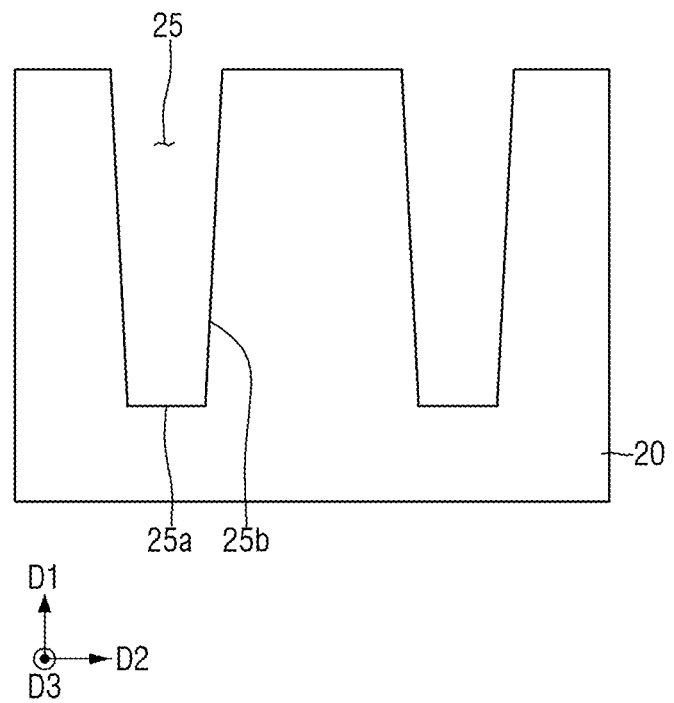
FIGS. 2A to 2D are diagrams for explaining a metal layer deposition process according to some embodiments.

Referring to FIG. 2A, a second trench 25 extending in the third direction D3 may be formed inside a second substrate 20. The second trench 25 may include a bottom side 25a and a side wall 25b. The bottom side 25a of the second trench 25 may extend in the second direction D2. The bottom side 25a of the second trench 25 may connect the side walls 25b of the second trench 25. A width of the second trench 25 may be 30 nm or less, e.g., the width of the second trench 25 may be 20 nm or less. The material included in the second substrate 20 may be the same as the material included in the first substrate 10.

Figure 2B:
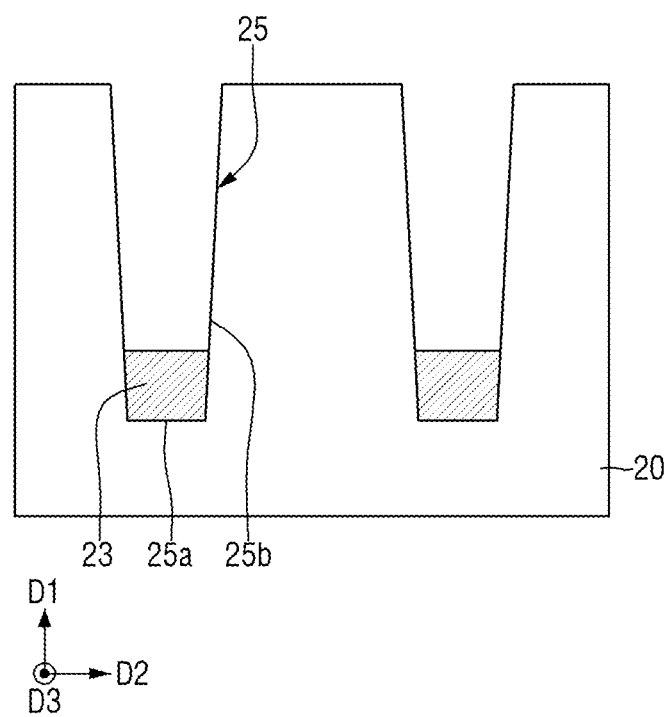
Figure 2C:
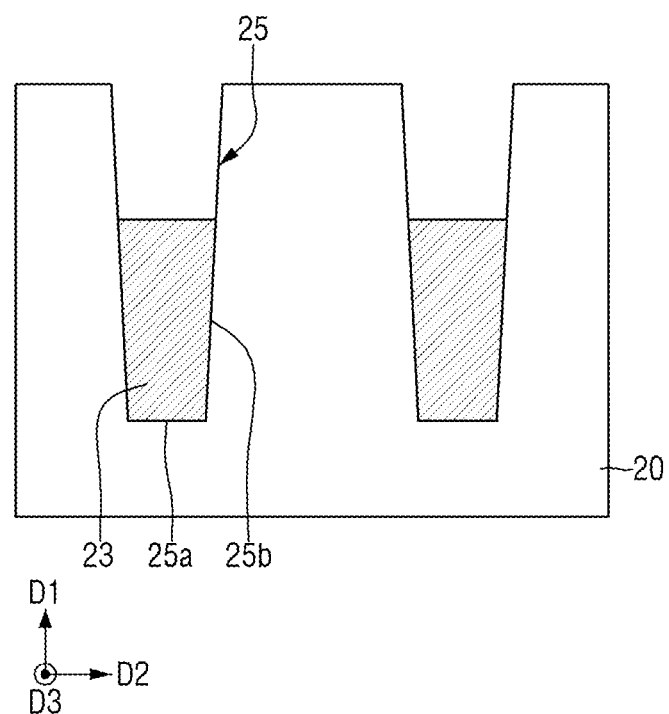
Figure 2D:
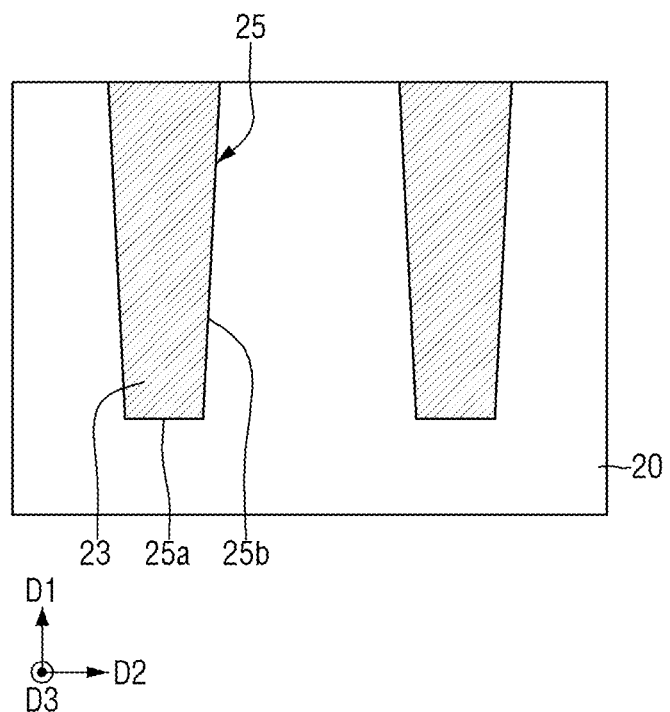

Referring to FIGS. 2B to 2D, the second metal layer 23 that fills the second trench 25 may be formed. The second metal layer 23 may be formed in a bottom-up manner. The second metal layer 23 may be formed by using a wet deposition process. The second metal layer 23 may be deposited using electroless plating or electroplating deposition process. The second metal layer 23 may be deposited in the first direction D1 from the bottom side 25a of the second trench 25.

In FIG. 2B, the second metal layer 23 may be deposited from the bottom side 25a of the second trench 25. The second metal layer 23 is not formed along the side walls 25b of the second trench 25. That is, the second metal layer 23 may be formed in the first direction D1 from the bottom side 25a of the second trench 25.

In FIG. 2C, the second metal layer 23 may be subsequently deposited in the first direction D1. Even in this case, the second metal layer 23 may not be formed on the side wall 25b of the second trench 25.

In FIG. 2D, the second metal layer 23 may fill the second trench 25. The second metal layer 23 may be a single layer. The barrier film may not be formed before the second metal layer 23 is formed. The material included in the second metal layer 23 may be the same as the material included in the first metal layer 13.

The semiconductor device according to some embodiments may be fabricated using the deposition process described referring to FIGS. 1A to 1D. For example, the semiconductor device may be a non-volatile memory device (NAND FLASH). Hereinafter, a method for fabricating a semiconductor device according to some embodiments will be described referring to FIGS. 4 to 18.

Figure 3:
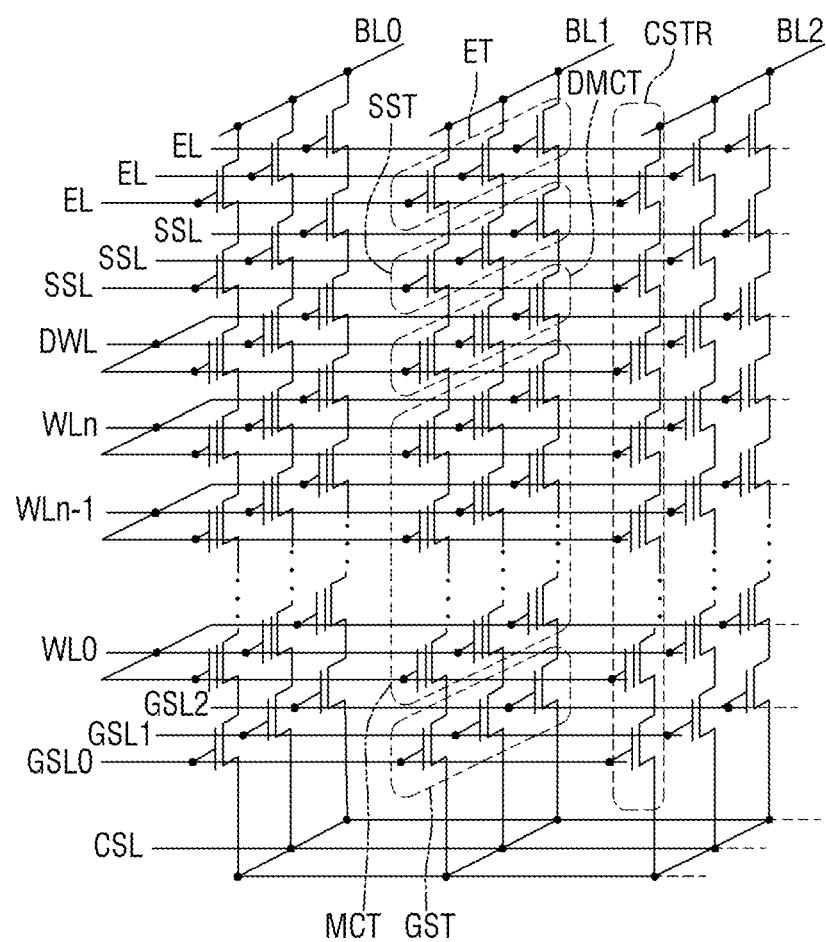
FIG. 3 is an exemplary circuit diagram for explaining a semiconductor device according to some embodiments.

FIG. 3 is an exemplary circuit diagram for explaining a semiconductor device according to some embodiments.

Referring to FIG. 3, the memory cell array of the semiconductor device according to some embodiments may include a common source line CSL, a plurality of bit lines BL0 to BL2, and a plurality of cell strings CSTR placed between the common source line CSL and the bit lines BL0 to BL2.

The plurality of cell strings CSTR may be connected in parallel to each of the bit lines BL0 to BL2. The plurality of cell strings CSTR may be commonly connected to the common source line CSL. That is, the plurality of cell strings CSTR may be placed between the plurality of bit lines BL0 to BL2 and the single common source line CSL. The plurality of common source line CSL may be arranged two-dimensionally. Here, the same voltage may be electrically applied to the common source line CSL, or each of the common source lines CSL may be electrically controlled.

For example, each cell string CSTR may be made up of an erasure control transistor ET, a string selection transistor SST, memory cells MCT connected in series, and a ground selection transistor GST. Further, each of the memory cells MCT includes a data storage element.

In an example, each cell string CSTR may include the erasure control transistor ET and the string selection transistor SST connected in series. The erasure control transistor ET may be connected to the bit lines BL0 to BL2. The ground selection transistor GST may be connected to the common source line CSL. The memory cells MCT may be connected in series between the string selection transistor SST and the ground selection transistor GST.

Furthermore, each cell string CSTR may further include a dummy cell DMCT connected between the string selection transistor SST and the memory cell MCT. Although not shown in the drawing, the dummy cell DMCT may also be connected between the ground selection transistor GST and the memory cell MCT. As another example, the ground selection transistor GST in each cell string CSTR may be made up of a plurality of MOS transistors connected in series. As still another example, each cell string CSTR may include a plurality of string selection transistors connected in series.

According to some embodiments, the erasure control transistor ET may be controlled by an erasure control line EL, and the string selection transistor SST may be controlled by a string selection line SSL. The memory cells MCT may be controlled by a plurality of word lines WL0 to WLn, and the dummy cells DMCT may be controlled by a dummy word line DWL. Further, the ground selection transistor GST may be controlled by a plurality of ground selection lines GSL0 to GSL2. The common source line CSL may be commonly connected to the sources of the ground selection transistor GST.

One cell string CSTR may be made up of the plurality of memory cells MCT having different distances from the common source line CSL. Further, the plurality of word lines WL0 to WLn and DWL may be placed between the common source lines CSL and the bit lines BL0 to BL2.

The gate electrodes of the memory cells MCT placed at substantially the same distance from the common source line CSL may be commonly connected to one of the word lines WL0 to WLn and DWL, and may be in an equipotential state. In contrast, even if the gate electrodes of the memory cells MCT are placed at substantially the same level from the common source line CSL, the gate electrodes placed in different rows or columns may be controlled independently.

The ground selection lines GSL0 to GSL2 and the string selection lines SSL may extend in the same direction as, e.g., the word lines WL0 to WLn and DWL. The ground selection lines GSL0 to GSL2 and the string selection line SSL placed at substantially the same level from the common source line SSL may be electrically separated from each other.

Further, the erasure control lines EL placed at substantially the same level from the common source lines CSL may be electrically separated from each other. In contrast, although not shown, the erasure control transistors ET of different cell strings CTSR may be controlled by the common erasure control line EL. The erasure control transistors ET generate a gate induced drain leak (GIDL) at the time of the erasure operation of the memory cell array. That is, the erasure control transistors ET may be GIDL transistors.

FIGS. 4 to 18 are stages in a method for fabricating a semiconductor device according to some embodiments.

Figure 4:
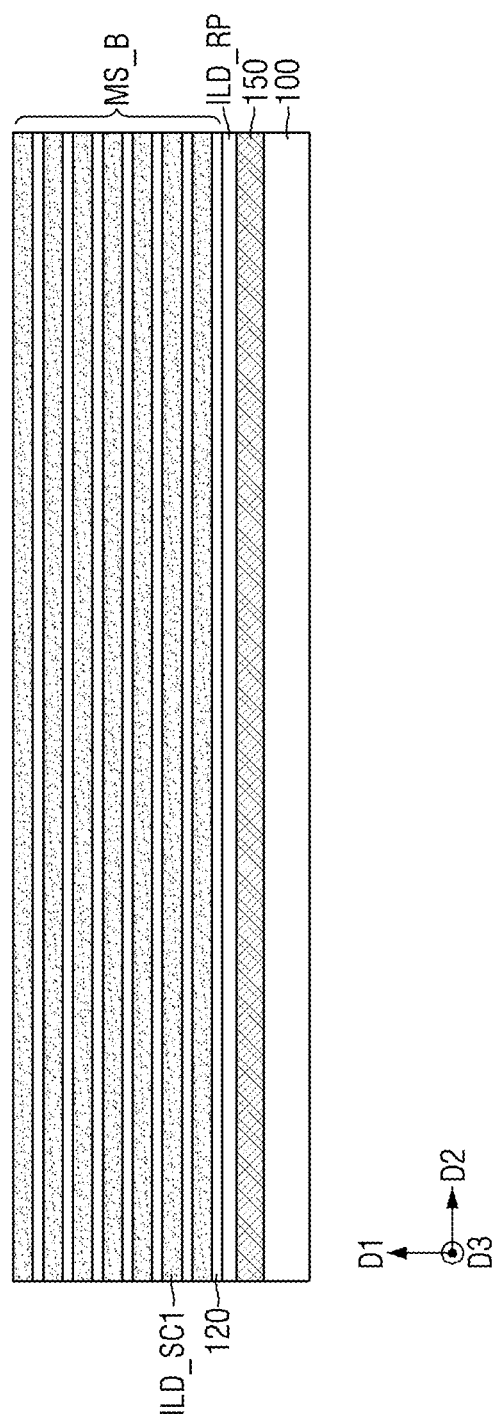
FIGS. 4 to 18 are views of stages in a method for fabricating a semiconductor device according to some embodiments.

Referring to FIG. 4, a horizontal conductive substrate 150 and a replacement insulating film ILD_RP may be sequentially formed on the third substrate 100. The third substrate 100, the horizontal conductive substrate 150, and the replacement insulating film ILD_RP may be sequentially stacked in the first direction D1.

For example, the third substrate 100 may include one of, e.g., a silicon substrate, a silicon germanium substrate, a germanium substrate, an SGOI (silicon germanium on insulator), an SOI (silicon-on-insulator), and a GOI (Germanium-On-Insulator). In another example, the third substrate 100 may include semiconductor materials, e.g., indium antimonide, lead tellurium compounds, indium arsenic, indium phosphide, gallium arsenide or gallium antimonide.

The horizontal conductive substrate 150 may be a common source plate. That is, the horizontal conductive substrate 150 may serve as the common source line CSL of FIG. 3.

The horizontal conductive substrate 150 may include at least one of, e.g., a conductive semiconductor film, a metal silicide film, and a metal film. When the horizontal conductive substrate 150 includes a conductive semiconductor film, the horizontal conductive substrate 150 may include, e.g., at least one of silicon (Si), germanium (Ge), silicon germanium (SiGe), gallium arsenide (GaAs), indium gallium arsenide (InGaAs), aluminum gallium arsenide (AlGaAs) or a combination thereof. The horizontal conductive substrate 150 may have a crystal structure including at least one of single crystal, amorphous and polycrystal. The horizontal conductive substrate 150 may include at least one of p-type impurities, n-type impurities and carbon included in the semiconductor film.

The replacement insulating film ILD_RP may include, e.g., silicon oxide. A lower mold structure MS_B may be formed on the replacement insulating film ILD_RP. The lower mold structure MS_B may include a plurality of inter-electrode insulating films 120, and a plurality of lower sacrificial films ILD_SC1. That is, the plurality of inter-electrode insulating films 120 and the plurality of lower sacrificial films ILD_SC1 may be alternately stacked on the third substrate 100 in the first direction D1. The inter-electrode insulating film 120 included in the lower mold structure MS_B may be a lower inter-electrode insulating film.

The inter-electrode insulating film 120 and the lower sacrificial film ILD_SC1 may have an etching selectivity with respect to each other. For example, the inter-electrode insulating film 120 may include silicon oxide. The lower sacrificial film ILD_SC1 may include silicon nitride.

Figure 5:
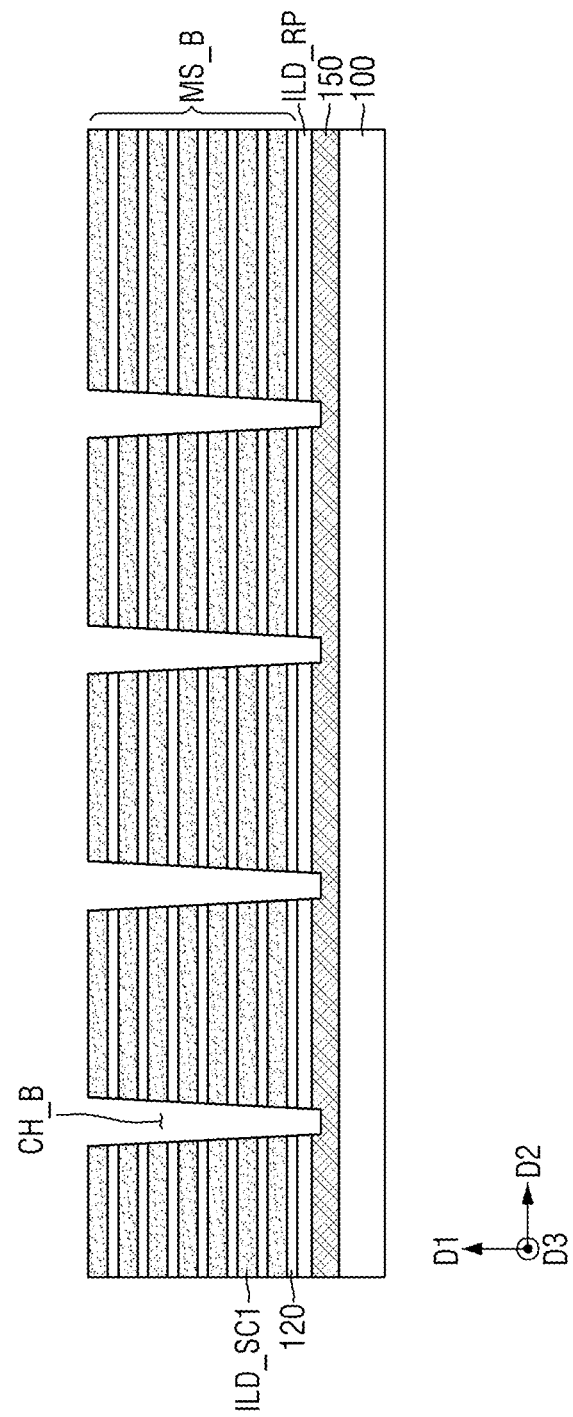

Referring to FIG. 5, a lower channel hole CH_B may be formed inside the lower mold structure MS_B. The lower channel hole CH_B may penetrate the lower mold structure MS_B in the first direction D1. The lower channel hole CH_B may penetrate the replacement insulating film ILD_RP and may be formed inside the horizontal conductive substrate 150.

Although the lower channel holes CH_B may be spaced apart from each other in the second direction D2, the embodiment is not limited thereto. The lower channel holes CH_B may be spaced apart from each other in the third direction D3. Further, the lower channel holes CH_B may be spaced part from each other in a direction different from the second direction D2 and the third direction D3, in the plane including the second direction D2 and the third direction D3. The first direction D1, the second direction D2, and the third direction D3 may be perpendicular to each other.

Figure 6:
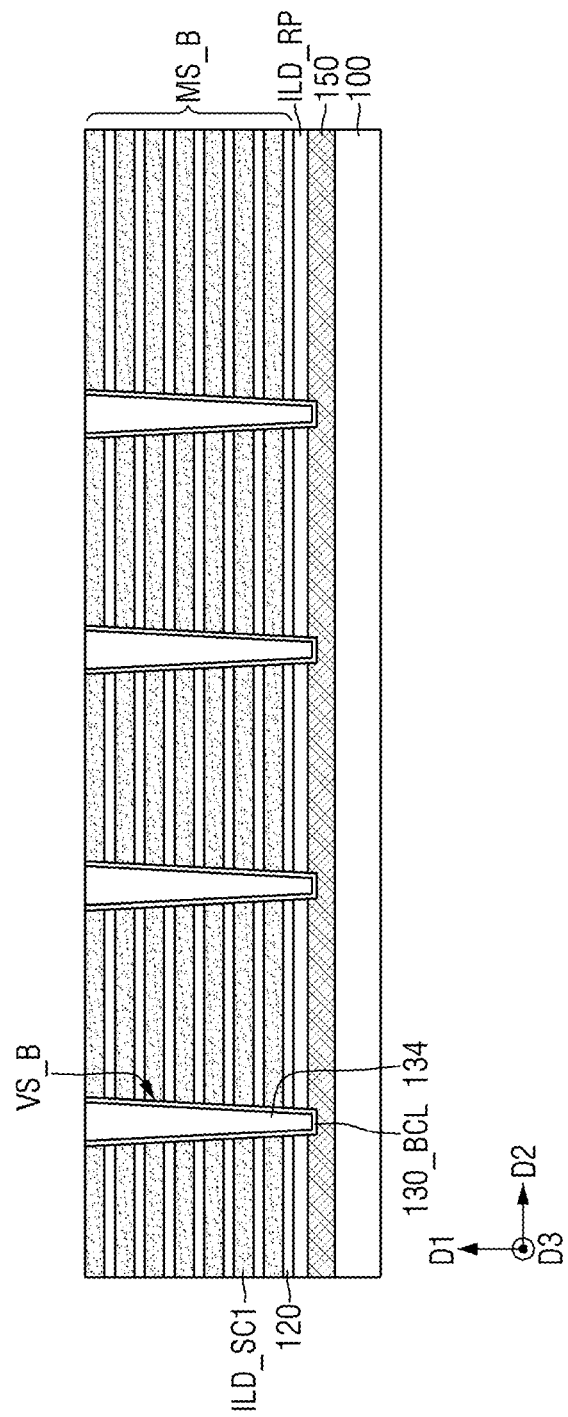

Referring to FIG. 6, a lower vertical channel structure VS_B may be formed on the third substrate 100. The lower vertical channel structure VS B may be formed inside the lower channel hole CH_B.

The lower vertical channel structure VS B may include a lower vertical channel film 130_BCL and a vertical insulating pattern 134. Although not shown, a lower channel insulating film (e.g., 132BGI of FIG. 15) may be formed between the lower vertical channel film 130_BCL and the lower mold structure MS_B. The lower vertical channel film 130_BCL may include, e.g., a polycrystalline silicon film. The vertical insulating pattern 134 may include, e.g., at least one of silicon oxide, silicon oxynitride, and low dielectric constant material. Accordingly, the lower vertical channel structure VS_B may be formed inside the lower mold structure MS_B.

Figure 7:
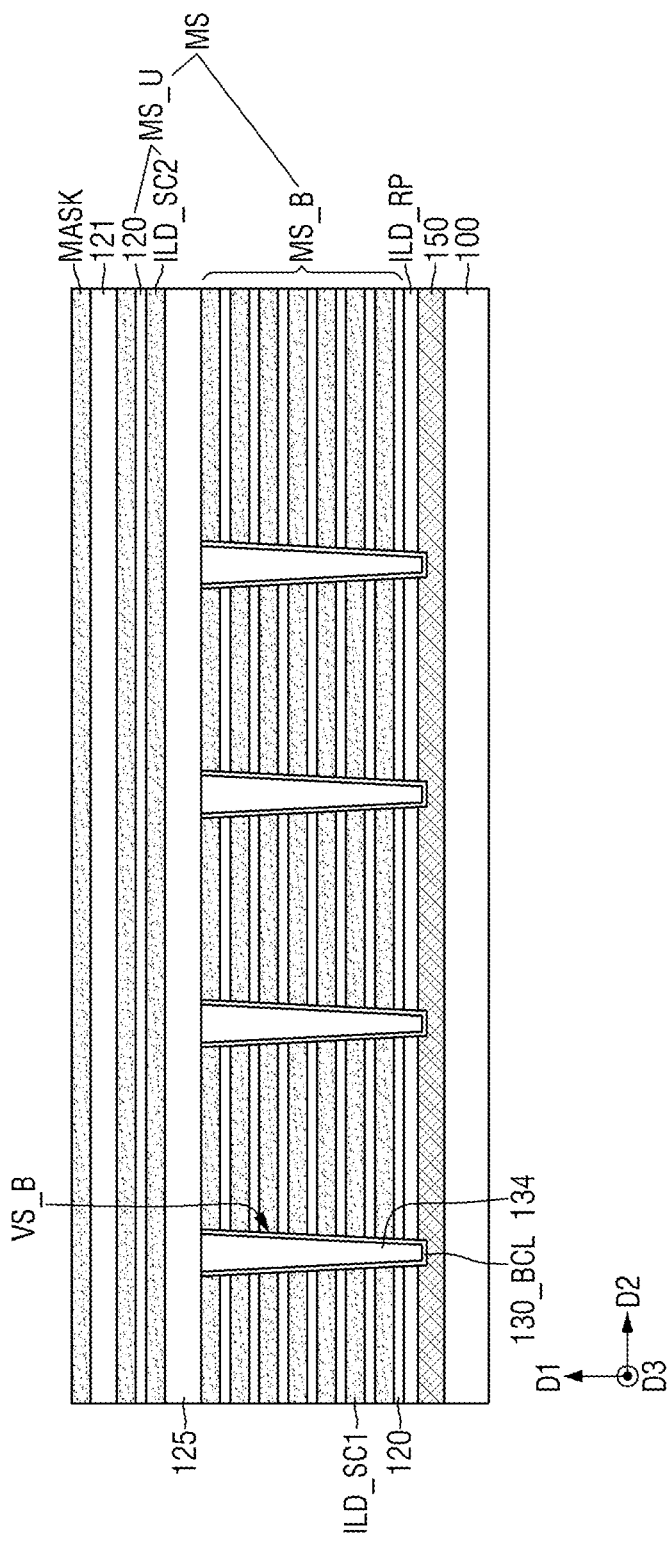

Referring to FIG. 7, an inter-structure insulating film 125, an upper mold structure MS_U, a first interlayer insulating film 121, and a mask film MASK may be sequentially formed on the lower mold structure MS_B.

The inter-structure insulating film 125 may be formed on the lower mold structure MS_B and the lower vertical channel structure VS_B. The upper mold structure MS_U may be formed on the inter-structure insulating film 125. The first interlayer insulating film 121 may be formed on the upper mold structure MS_U. The mask film MASK1 may be formed on the first interlayer insulating film 121.

The upper mold structure MS_U may include an inter-electrode insulating film 120 and an upper sacrificial film ILD_SC2. The upper mold structure MS_U may include two upper sacrificial films ILD_SC2, and an inter-electrode insulating film 120 between the upper sacrificial films ILD_SC2. The inter-electrode insulating film 120 included in the upper mold structure MS_U may be an upper inter-electrode insulating film. The upper mold structure MS_U and the lower mold structure MS_B may form a mold structure MS.

The inter-structure insulating film 125 may include, e.g., silicon oxide. The upper sacrificial film ILD_SC2 and the inter-electrode insulating film 120 may have etching selectivity with each other. The material included in the upper sacrificial film ILD_SC2 may be the same as the material included in the lower sacrificial film ILD_SC1. The first interlayer insulating film 121 may include, e.g., at least one of a silicon oxide, a silicon oxynitride, and a low dielectric constant material.

Figure 8:
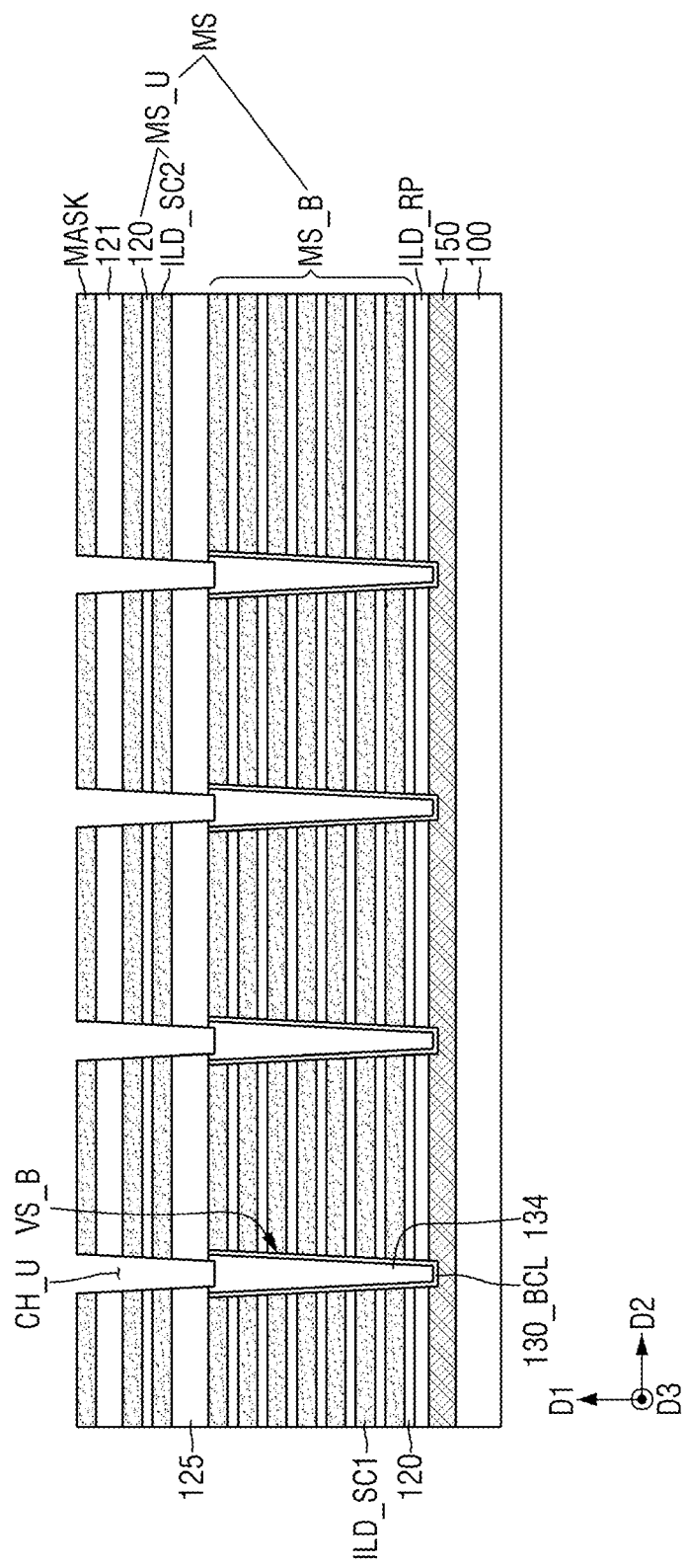

Referring to FIG. 8, an upper channel hole CH_U may be formed inside the upper mold structure MS_U. The upper channel hole CH_U may penetrate the upper mold structure MS_U and the inter-structure insulating film 125 in the first direction D1. The upper channel hole CH_U may vertically overlap the lower vertical channel structure VS_B. That is, the upper channel hole CH_U may be aligned with the lower vertical channel structure VS_B in the first direction D1.

Figure 9:
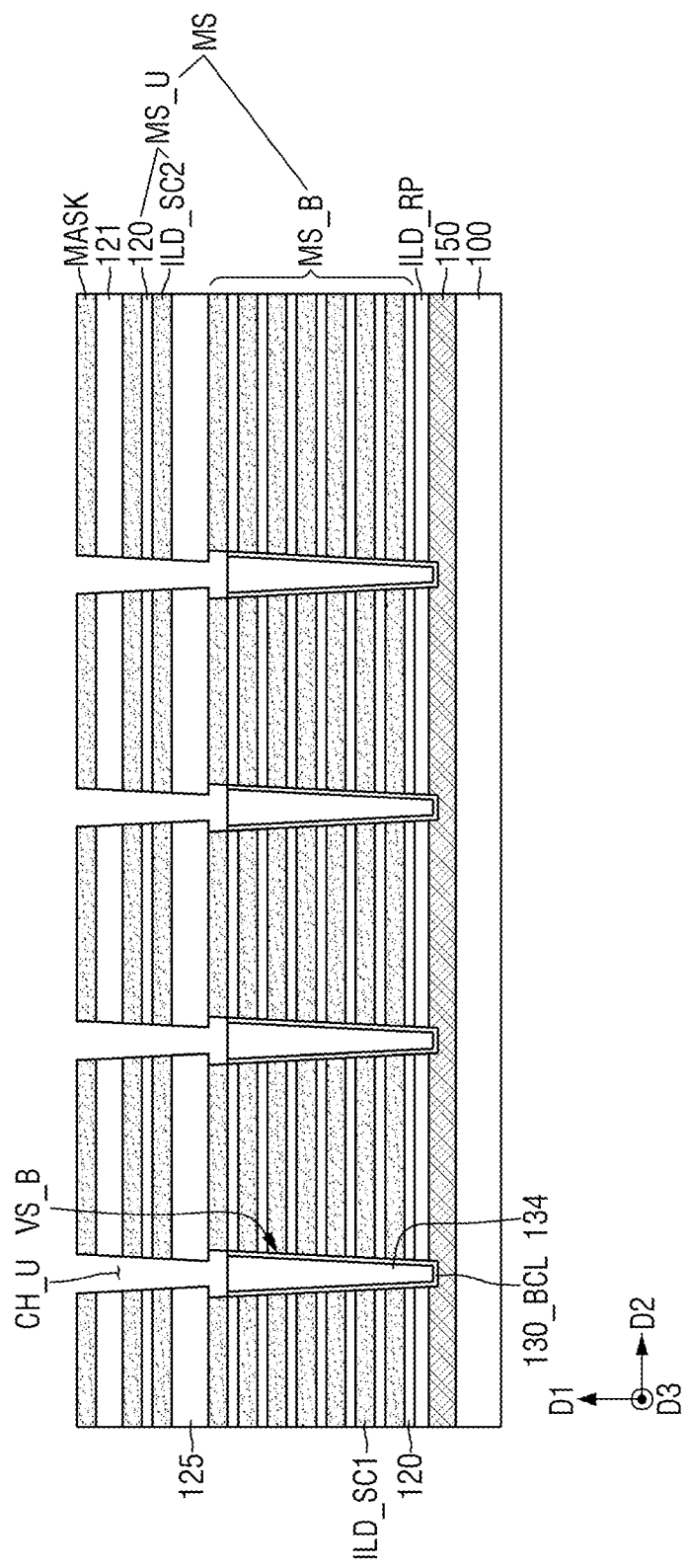

Referring to FIG. 9, a part of the vertical insulating pattern 134 inside the lower vertical channel structure VS_B may be removed to form a space inside the lower vertical channel structure VS_B. For example, as illustrated in FIG. 9, a top part of the lower vertical channel structure VS_B may be removed to form an empty space between the lower vertical channel structure VS_B and a bottom of the upper channel hole CH_U.

In detail, although not shown, the upper channel insulating film and the sacrificial polysilicon film may be sequentially formed along the side walls of the upper channel hole CH_U. The upper channel insulating film and the sacrificial polysilicon film may expose the vertical insulating pattern 134. A part of the vertical insulating pattern 134 may then be removed to form a space inside the lower vertical channel structure VS_B. A part of the vertical insulating pattern 134 may be removed to expose a part of the lower vertical channel film 130_BCL.

The sacrificial polysilicon film and the exposed lower vertical channel film 130_BCL may then be removed. The upper channel insulating film may not be removed while the sacrificial polysilicon film is being removed. That is, the upper channel insulating film may remain on the side walls of the upper channel hole CH_U.

Figure 10:
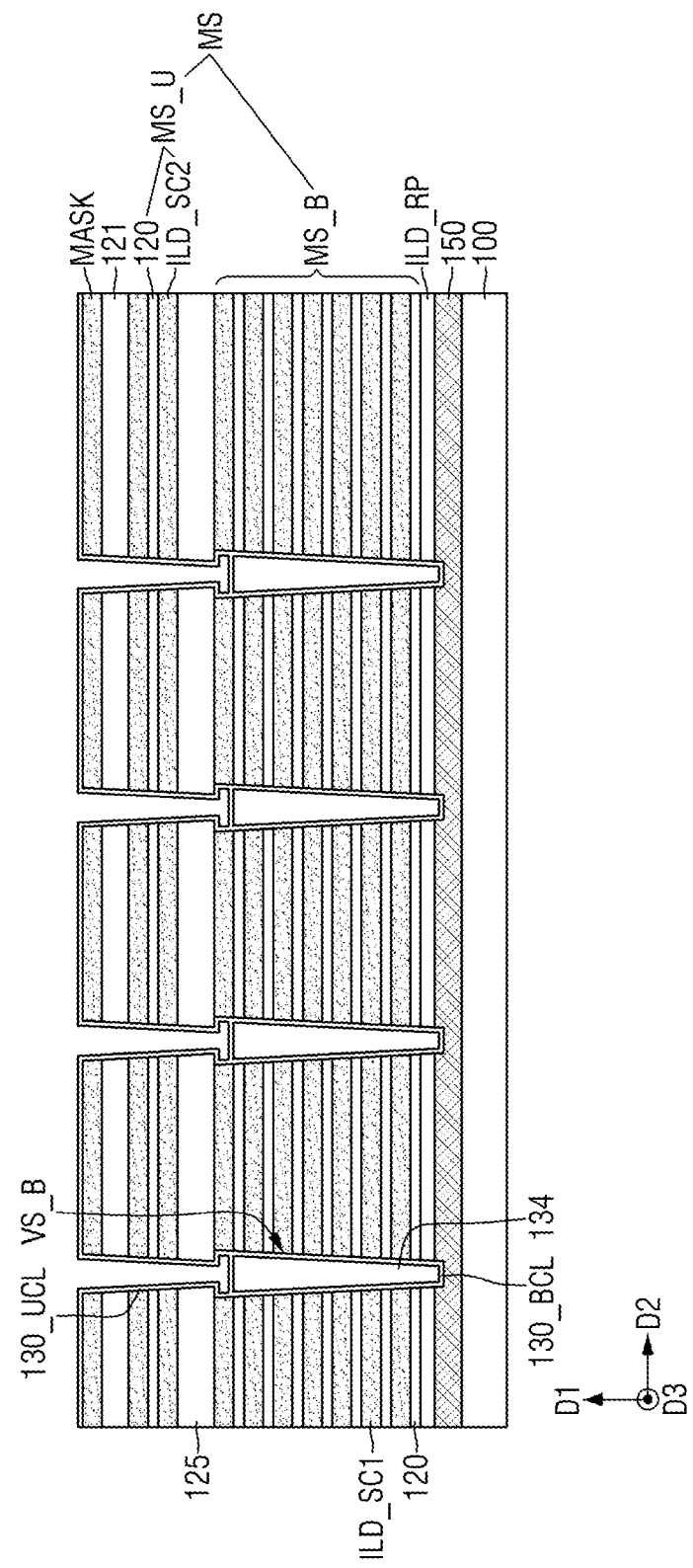

Referring to FIG. 10, an upper vertical channel film 130_UCL may be formed on the upper channel insulating film. The upper vertical channel film 130_UCL may extend along the side walls of the upper channel hole CH_U. The upper vertical channel film 130_UCL may be connected to the lower vertical channel film 130_BCL inside the lower vertical channel structure VS_B, e.g., a portion of the upper vertical channel film 130_UCL may extend on a topmost surface of the lower vertical channel film 130_BCL (i.e., on a bottom of the empty space formed in FIG. 9) to separate between the lower vertical channel structure VS_B and the upper channel hole CH_U. The upper vertical channel film 130_UCL may extend along the upper side of the mask film MASK.

Figure 11:
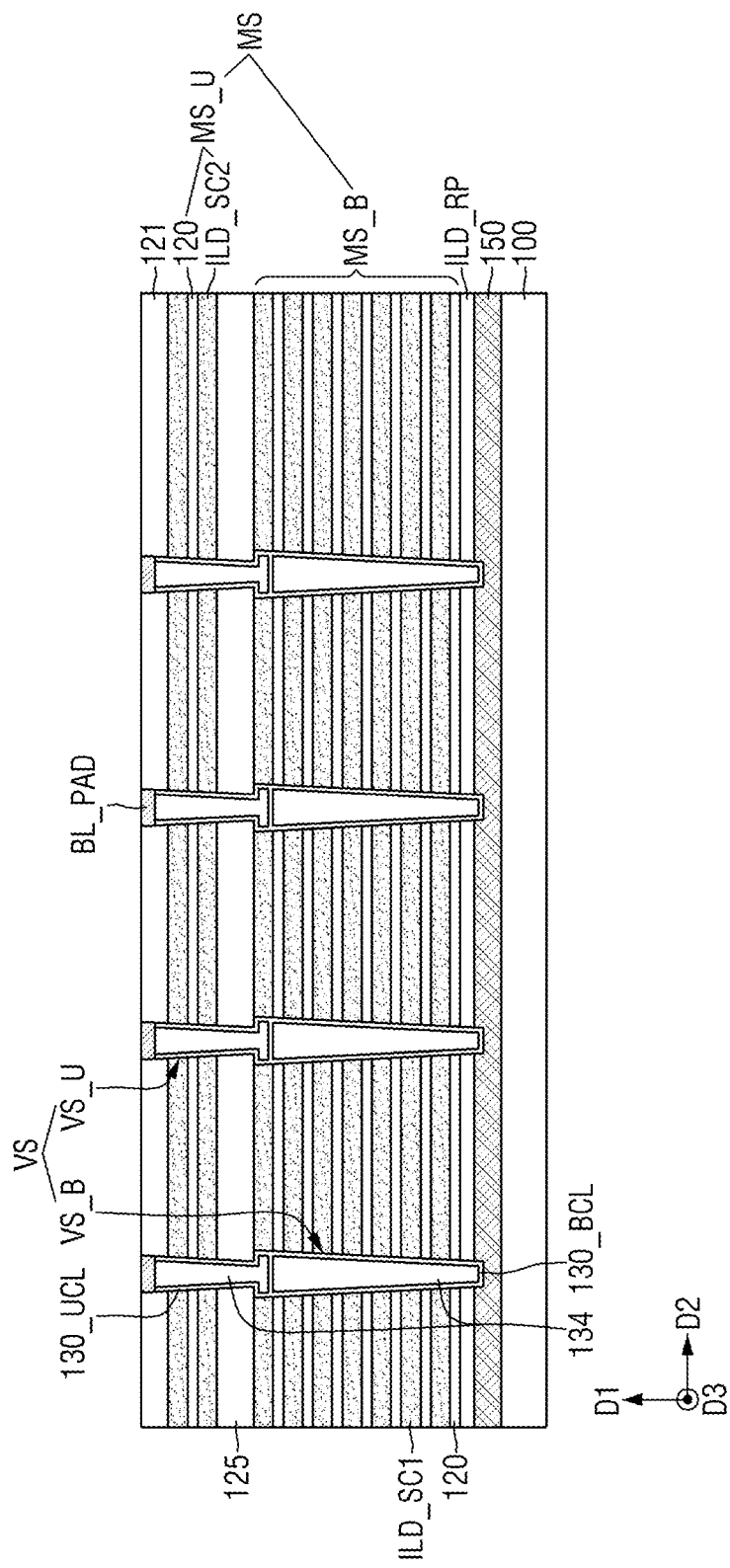

Referring to FIG. 11, an upper vertical channel structure VS_U may be formed. The vertical insulating pattern 134 that fills a part of the upper channel hole CH_U may be formed on the upper vertical channel film 130_UCL. The upper vertical channel structure VS_U may be formed on the lower vertical channel structure VS_B. The upper vertical channel structure VS_U may be aligned with the lower vertical channel structure VS_B in the first direction D1.

The lower vertical channel structure VS_B and the upper vertical channel structure VS_U may form the vertical channel structure VS. Subsequently, a bit line pad BL_PAD that comes into contact with the upper vertical channel film 130_UCL may be formed on the vertical insulating pattern 134 and the upper vertical channel film 130_UCL. Subsequently, the mask film MASK and the first interlayer insulating film 121 may be partially removed.

Figure 12:
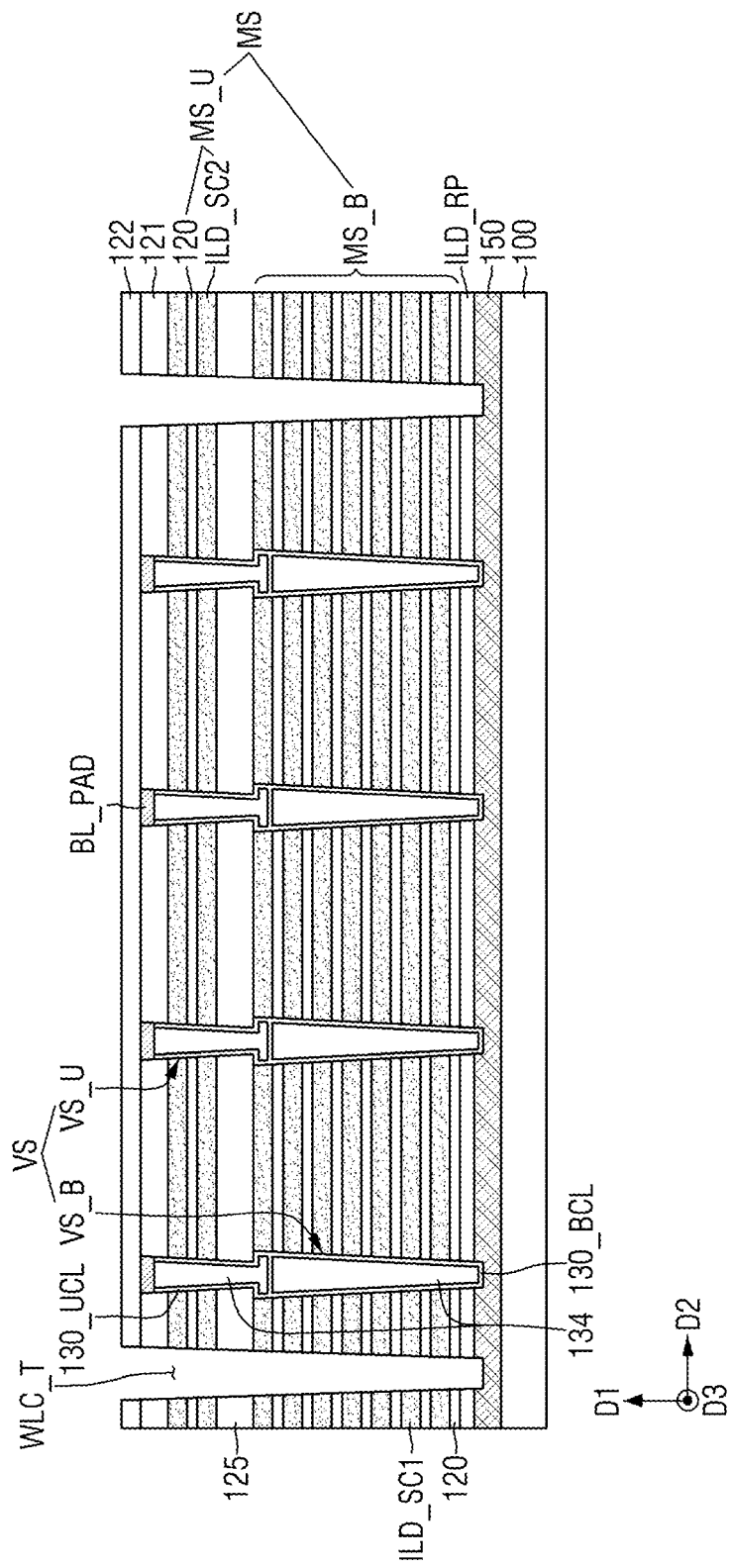

Referring to FIG. 12, the second interlayer insulating film 122 that covers the bit line pad BL_PAD may be formed on the first interlayer insulating film 121. The second interlayer insulating film 122 may include, e.g., silicon oxide.

Subsequently, a cutting line trench WLC_T which cuts the first and second interlayer insulating films 121 and 122, the upper mold structure MS_U, and the lower mold structure MS_B may be formed.

Figure 13:
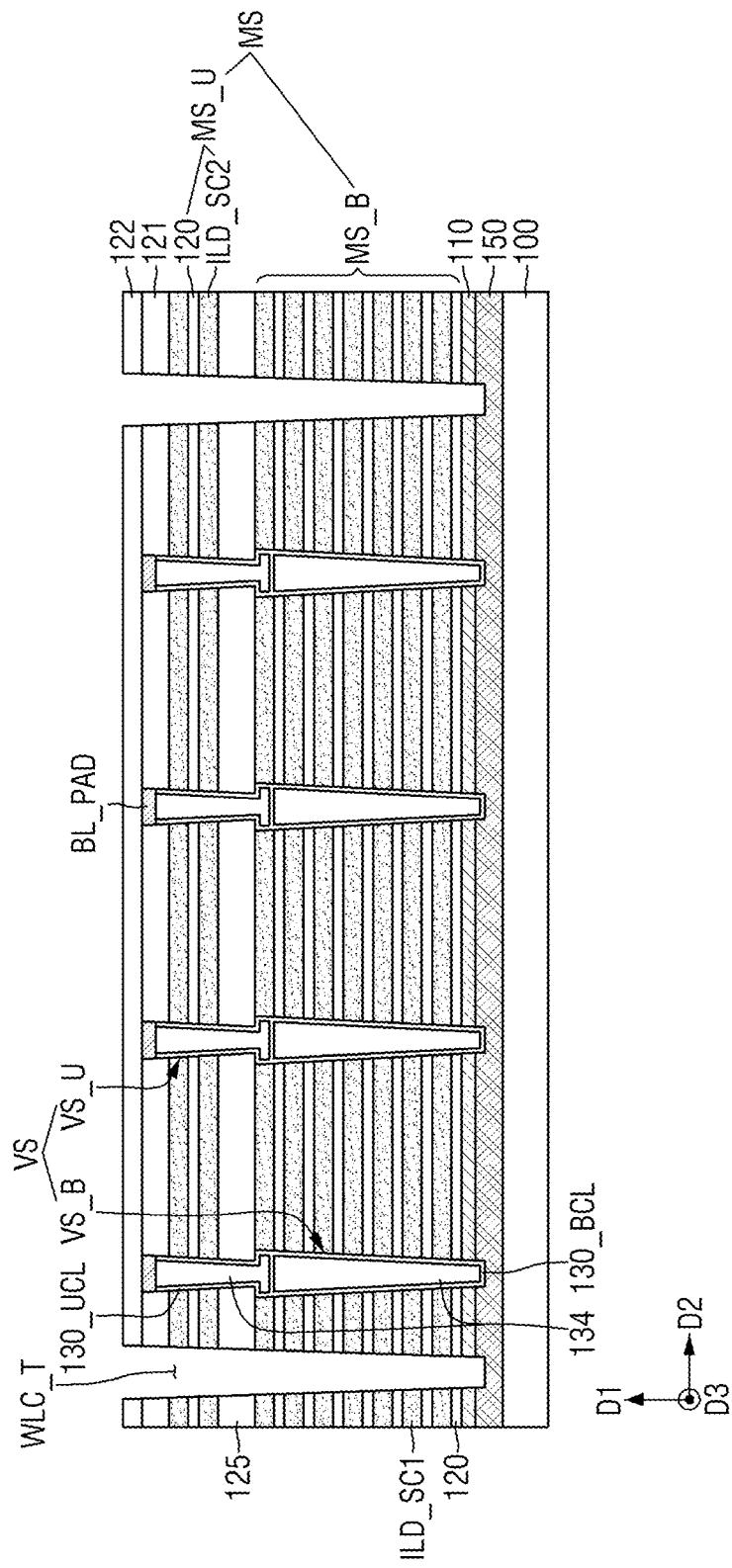

Referring to FIG. 13, a vertical structure support film 110 may be formed. The vertical structure support film 110 may be formed in the space from which the replacement insulating film ILD_RP is removed.

For example, after forming the cutting line trench WLC_T, the replacement insulating film ILD_RP may be removed. The vertical structure support film 110 may be formed in the space from which the replacement insulating film ILD_RP is removed.

Figure 14:
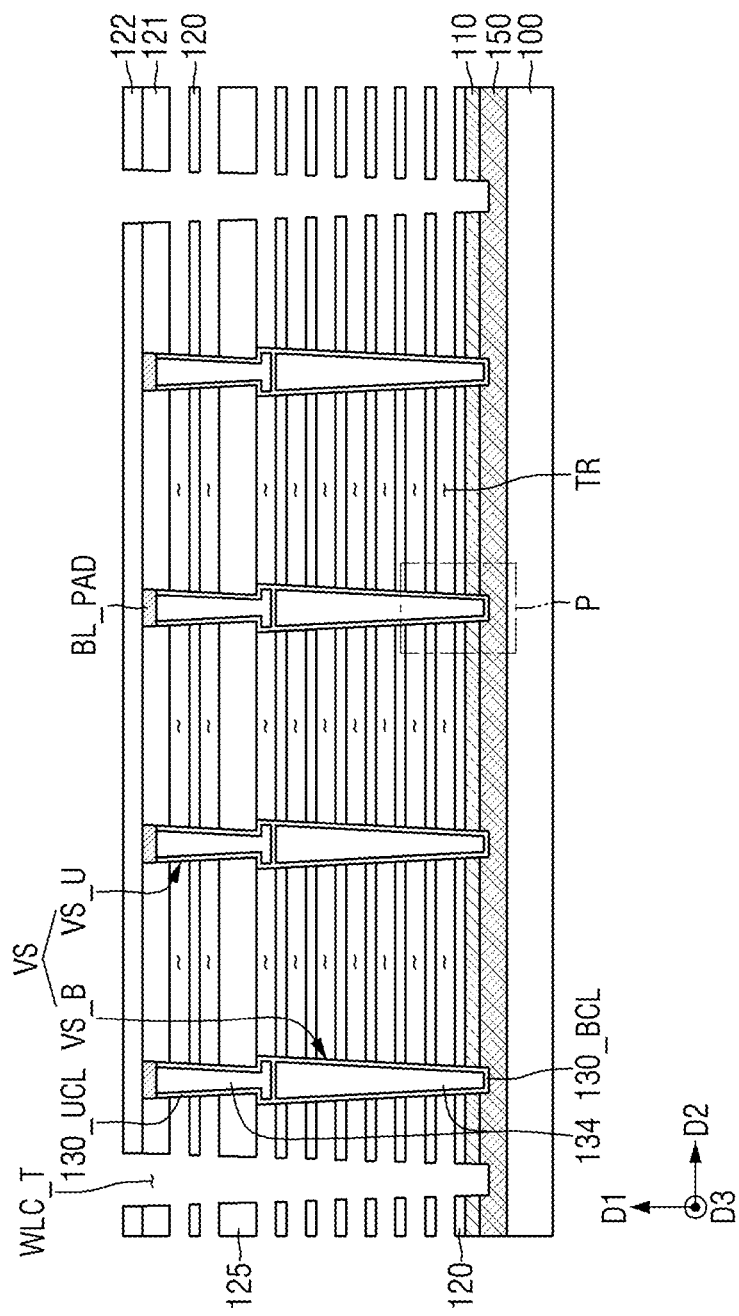
Figure 15:
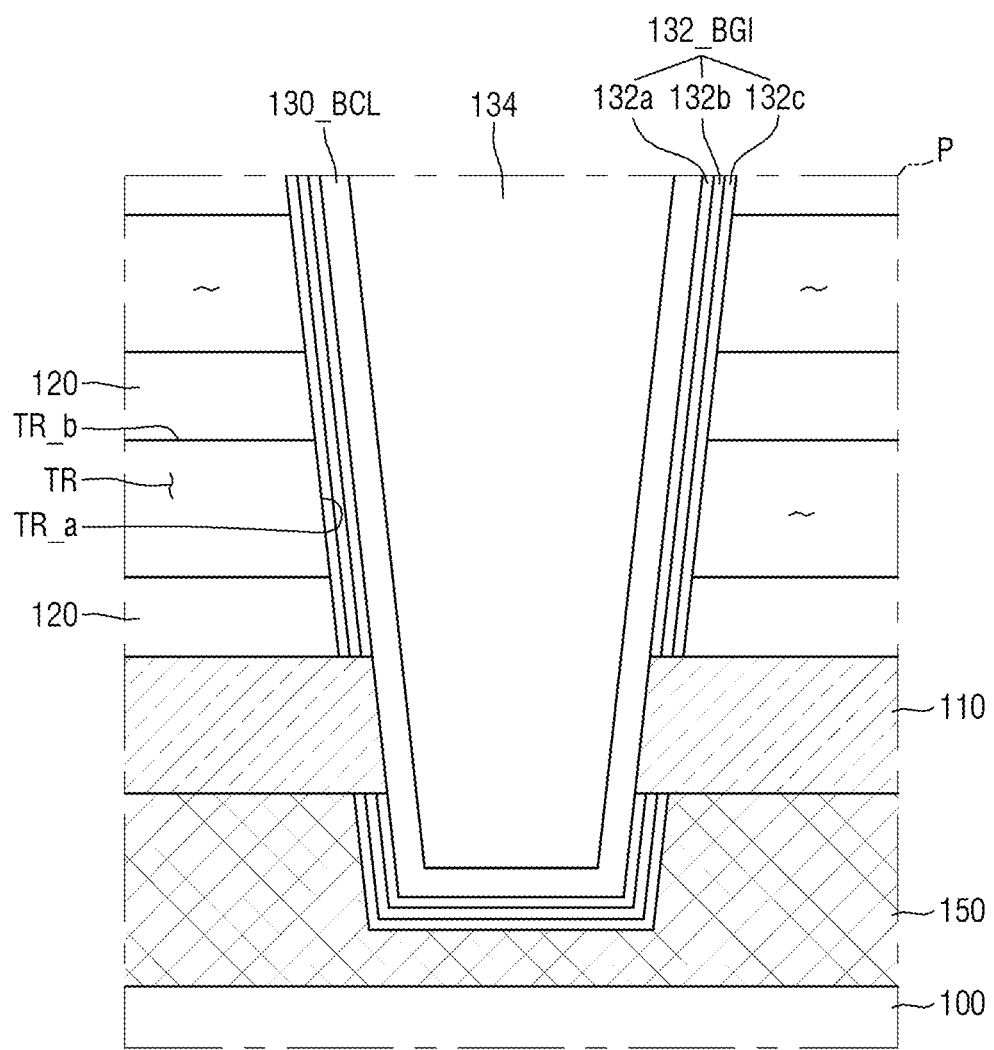

Referring to FIGS. 14 and 15, the lower sacrificial film ILD_SC1 and the upper sacrificial film ILD_SC2 may be removed to form a plurality of third trenches TR. FIG. 15 is an enlarged view of region P of FIG. 14.

The third trench TR may expose the vertical channel structure VS. The third trench TR may expose the lower vertical channel structure VS_B and the upper vertical channel structure VS_U.

A width of the third trench TR in the first direction D1 may be 30 nm or less. The width between fourth sides TR b of the third trench TR may be 30 nm or less, e.g., the width of the third trench TR in the first direction D1 may be 20 nm or less.

In FIG. 15, the third trench TR may expose the lower vertical channel insulating film 132_BGI. The third trench TR may expose the inter-electrode insulating film 120. The third trench TR may extend in the second direction D2.

The third trench TR may include a third side TR_a that exposes the vertical channel structure VS, and a fourth side TR b that exposes the inter-electrode insulating film 120. The fourth side TR b of the third trench TR may extend in the second direction D2. The third side TR_a of the third trench TR may extend along the side walls of the vertical channel structure VS.

The lower vertical channel structure VS_B may include, e.g., a lower vertical channel film 130_BCL, a lower vertical channel insulating film 132_BGI, and a vertical insulating pattern 134.

The lower vertical channel insulating film 132_BGI may include, e.g., a tunnel insulating film 132a, a charge storage film 132b, and a blocking insulating film 132c which are sequentially placed on the lower vertical channel film 130_BCL. The tunnel insulating film 132a, the charge storage film 132b, and the blocking insulating film 132c are merely exemplary, and embodiments are not limited thereto.

The tunnel insulating film 132a may include, e.g., a silicon oxide or a high dielectric constant material (e.g., aluminum oxide ($Al_2O_3$) and hafnium oxide ($HfO_2$)). The charge storage film 132b may include, e.g., silicon nitride. The blocking insulating film 132c may include, e.g., a silicon oxide or a high dielectric constant material (e.g., aluminum oxide ($Al_2O_3$) and hafnium oxide ($HfO_2$)). In the semiconductor device according to some embodiments, the tunnel insulating film 132a and the blocking insulating film 132c may include silicon oxide.

The tunnel insulating film 132a, the charge storage film 132b, and the blocking insulating film 132c may be separated in the lower part of the lower vertical channel film 130_BCL. The separated tunnel insulating film 132a, charge storage film 132b, and blocking insulating film 132c may expose a part of the lower vertical channel film 130_BCL. The vertical structure support film 110 may be placed between the separated tunnel insulating film 132a, charge storage film 132b, and blocking insulating film 132c. The vertical structure support film 110 may electrically connect the horizontal conductive substrate 150 and the lower vertical channel film 130_BCL. The vertical structure support film 110 may include, e.g., a semiconductor material such as silicon (Si), germanium (Ge) or a mixture thereof.

Figure 16:
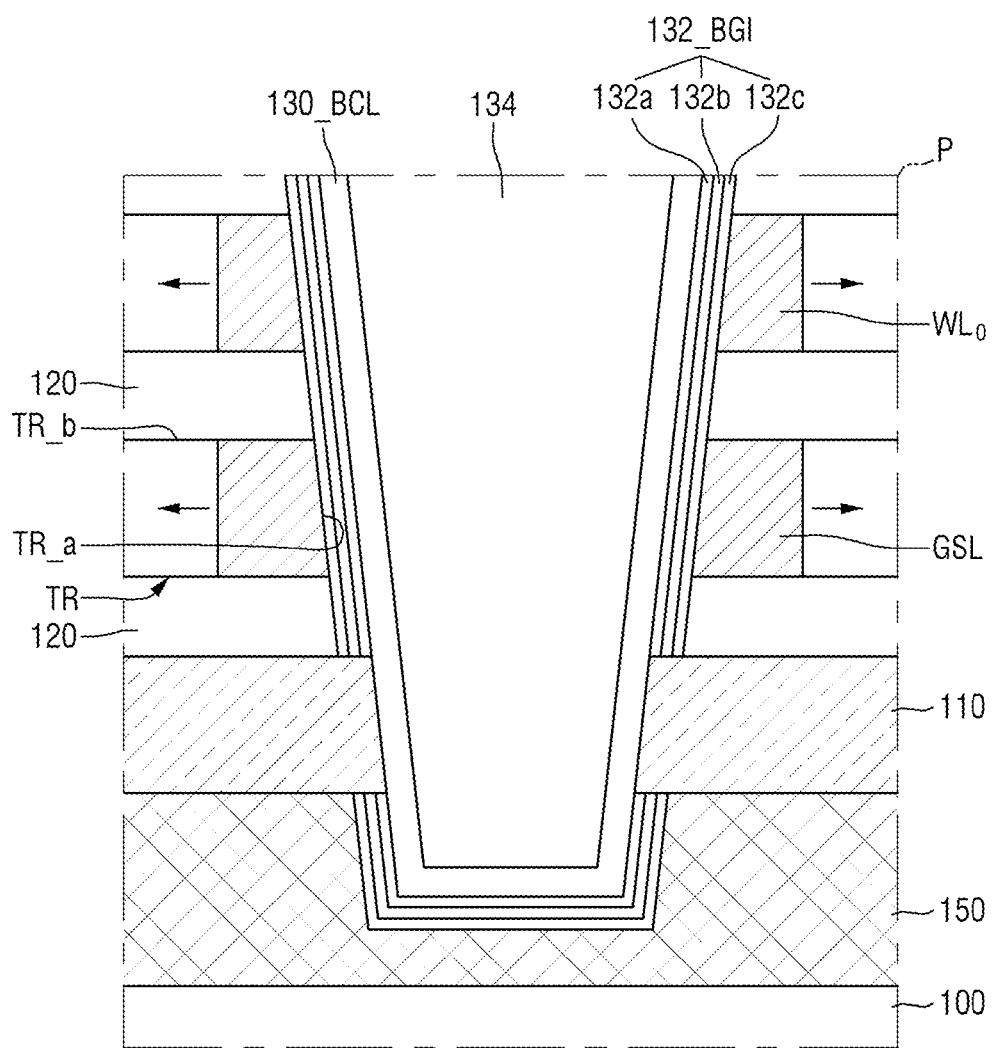

Referring to FIG. 16, a plurality of metallic lines GSL and $WL_0$ that fill the third trench TR may be formed. The metallic line closest to the horizontal conductive substrate 150 among the metallic lines may correspond to any one of the ground selection lines GSL0 to GSL2 of FIG. 3. The metallic line closest to the ground selection line GSL may be a word wire $WL_0$. The metallic lines GSL and $WL_0$ of FIG. 16 may be formed using the deposition process described using FIGS. 1A to 1D.

For example, the metallic lines GSL and $WL_0$ may be formed in a bottom-up manner. The metallic lines GSL and $WL_0$ may be formed in the second direction D2 on the third side TR_a of the third trench TR. The metallic lines GSL and $WL_0$ may not be formed along the fourth side TR b of the third trench TR. The metallic lines GSL and $WL_0$ may be formed using a wet deposition process. For example, the metallic lines GSL and $WL_0$ may be formed using electroless plating or electroplating deposition process.

Figure 17:
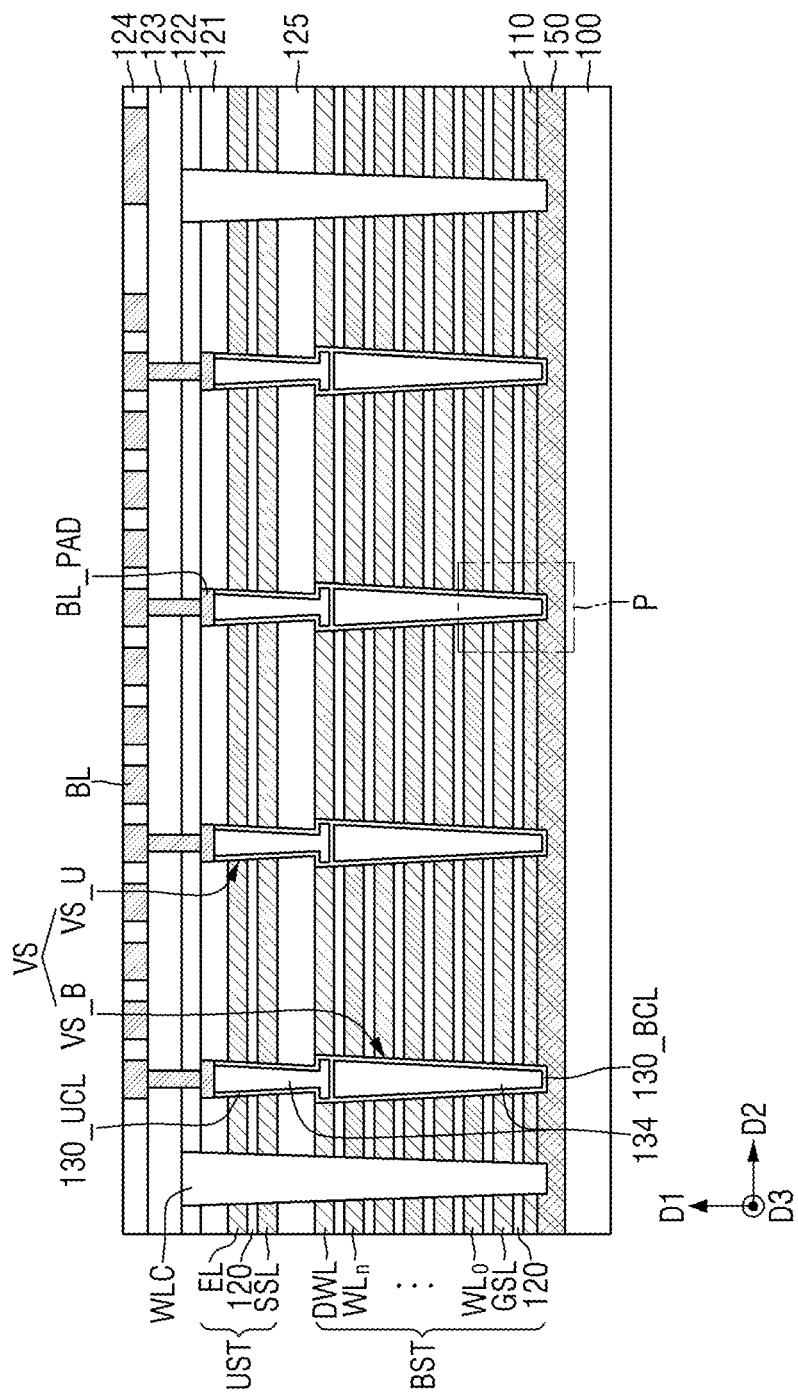
Figure 18:
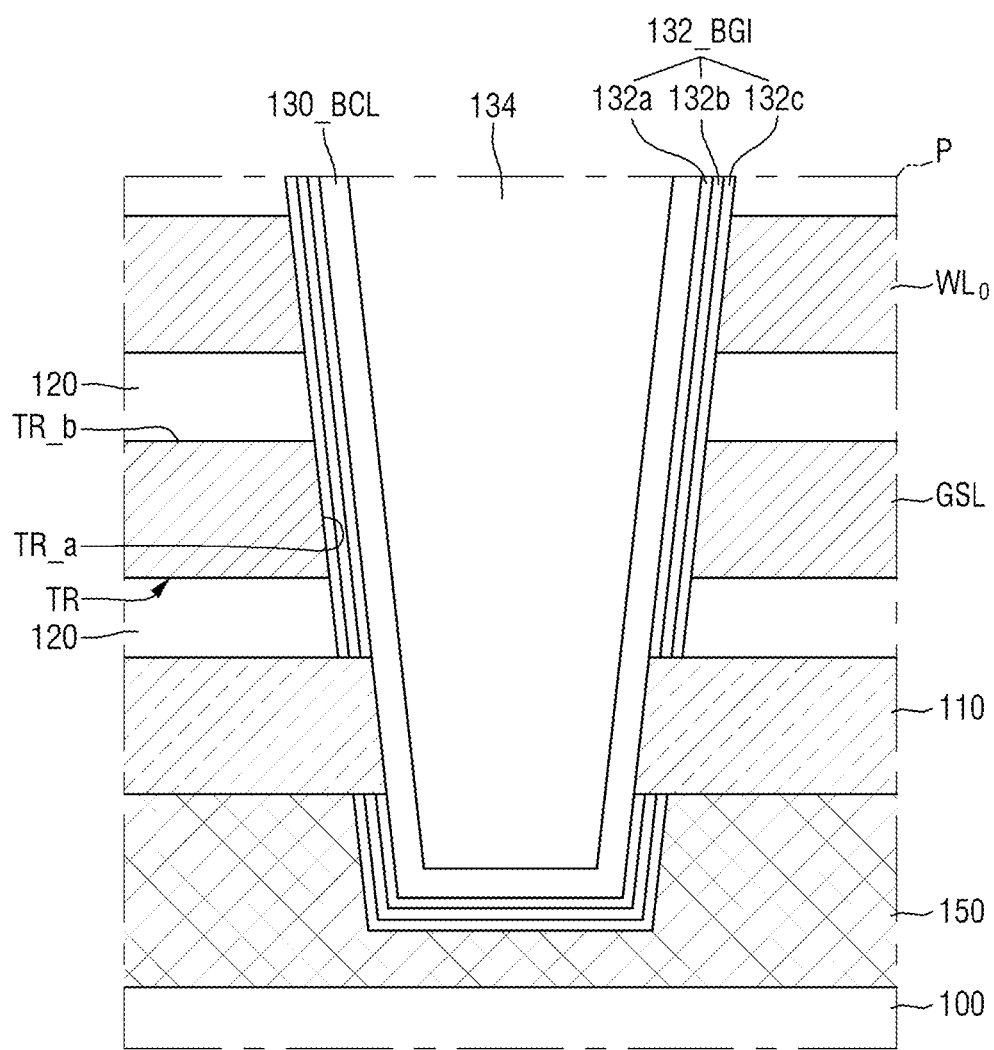

Referring to FIGS. 17 and 18, a plurality of metallic lines GSL, $WL_0$ to $WL_n$, DWL, SSL and EL may be formed inside the third trench TR. For reference, FIG. 18 is an enlarged view of region P of FIG. 17.

As mentioned above, the plurality of metallic lines GSL, $WL_0$ to $WL_n$, DWL, SSL and EL may be formed using a wet deposition process. For example, the plurality of metallic lines GSL, $WL_0$ to $WL_n$, DWL, SSL and EL may be formed in a bottom-up manner, using the electroless plating or electroplating deposition process.

The plurality of metallic lines GSL, $WL_0$ to $WL_n$, DWL, SSL and EL may each be a single layer. For example, the plurality of metallic lines GSL, $WL_0$ to $WL_n$, DWL, SSL and EL may, e.g., each independently, include at least one of copper (Cu), tungsten (W), nickel (Ni), molybdenum (Mo), cobalt (Co), and ruthenium (Ru), e.g., may include nickel (Ni). The plurality of metallic lines GSL, $WL_0$ to $WL_n$, DWL, SSL and EL may not include fluorine (F) or chlorine (Cl).

Alternatively, the upper sacrificial film ILD_SC2 and the lower sacrificial film ILD_SC1 may be replaced with the plurality of metallic lines GSL, $WL_0$ to $WL_n$, DWL, SSL and EL through the replacement metal gate process.

As illustrated in FIG. 17, a lower stacked structure BST and an upper stacked structure UST may be formed. The lower stacked structure BST may be formed on the horizontal conductive substrate 150. The lower stacked structure BST may include a plurality of lower metallic lines GSL, $WL_0$ to $WL_n$ and DWL and a plurality of inter-electrode insulating films 120 stacked in the first direction D1.

The upper stacked structure UST may be formed on the lower stacked structure BST. The upper stacked structure UST may include a first upper metallic line SSL and a second upper metallic line EL stacked in the first direction D1. The first upper metallic line SSL may be closer to the third substrate 100 than the second upper metallic line EL is, e.g., a distance between the first upper metallic line SSL and the third substrate 100 is smaller than a distance between the second upper metallic line EL and the third substrate 100. The upper stacked structure UST may include an inter-electrode insulating film 120 between the first upper metallic line SSL and the second upper metallic line EL.

The first upper metallic line SSL may serve as the string selection line of FIG. 3, and the second upper metallic line EL may serve as the erasure control line of FIG. 3. The first upper metallic line SSL may be included in the string selection transistor SST of FIG. 3, and the second upper metallic line EL may be included in the erasure control transistor ET of FIG. 3.

After that, a cutting line WLC that fills the cutting line trench WLC_T may be formed. The cutting line WLC may cut the plurality of metallic lines GSL, WL$_0$ to WL$_n$, DWL, SSL, and EL.

The cutting line WLC may include, e.g., at least one of silicon oxide, silicon nitride, silicon oxnitride and a low dielectric constant material. The low dielectric constant material may include, e.g., Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethylcyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

Unlike that shown, the cutting line WLC may include a plurality of films.

Subsequently, a third interlayer insulating film 123 may be formed on the second interlayer insulating film 122. A bit line plug BLPG may be formed to penetrate the third interlayer insulating film 123. The bit line plug BLPG may be connected to the bit line pad BL_PAD. The bit line plug BLPG may be aligned with the bit line pad BL_PAD in the first direction D1.

A fourth interlayer insulating film 124 may be formed on the third interlayer insulating film 123. The bit line BL may be formed inside the fourth interlayer insulating film 124. The bit line BL may extend in the third direction D3. The bit line BL may be connected to the bit line plug BLPG.

The third interlayer insulating film 123 and the fourth interlayer insulating film 124 may include, e.g., silicon oxide. The bit line BL and the bit line plug BLPG may each include a conductive material.

FIGS. 19 to 22 are stages in a method for fabricating a semiconductor device according to some embodiments. For convenience of explanation, only differences relative to those described with respect to FIGS. 4 to 18 will be mainly described.

Figure 19:
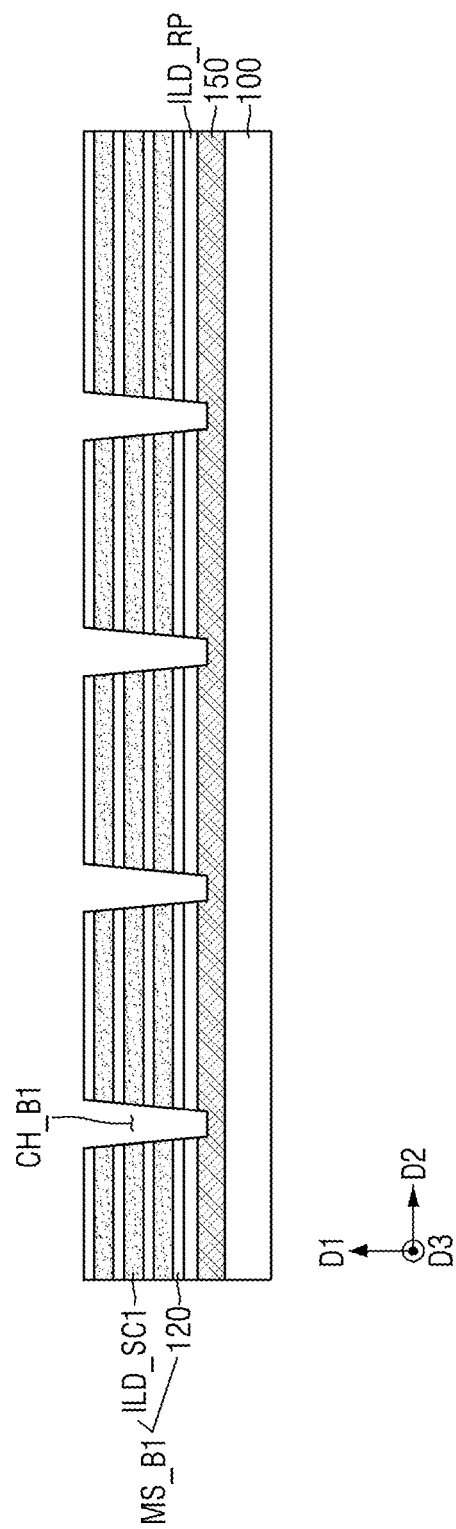
FIGS. 19 to 22 are views of stages in a method for fabricating a semiconductor device according to some embodiments.

Referring to FIG. 19, the horizontal conductive substrate 150, the replacement insulating film ILD_RP, and the first lower mold structure MS_B1 may be sequentially stacked on the third substrate 100.

The first lower mold structure MS_B1 may include an inter-electrode insulating film 120 and a lower sacrificial film ILD_SC1. The inter-electrode insulating film 120 and the lower sacrificial film ILD_SC1 may be alternately stacked in the first direction D1.

Subsequently, a first lower channel hole CH_B1 may be formed. The first lower channel hole CH_B1 may be formed to penetrate the first lower mold structure MS_B1 in the first direction D1.

Figure 20:
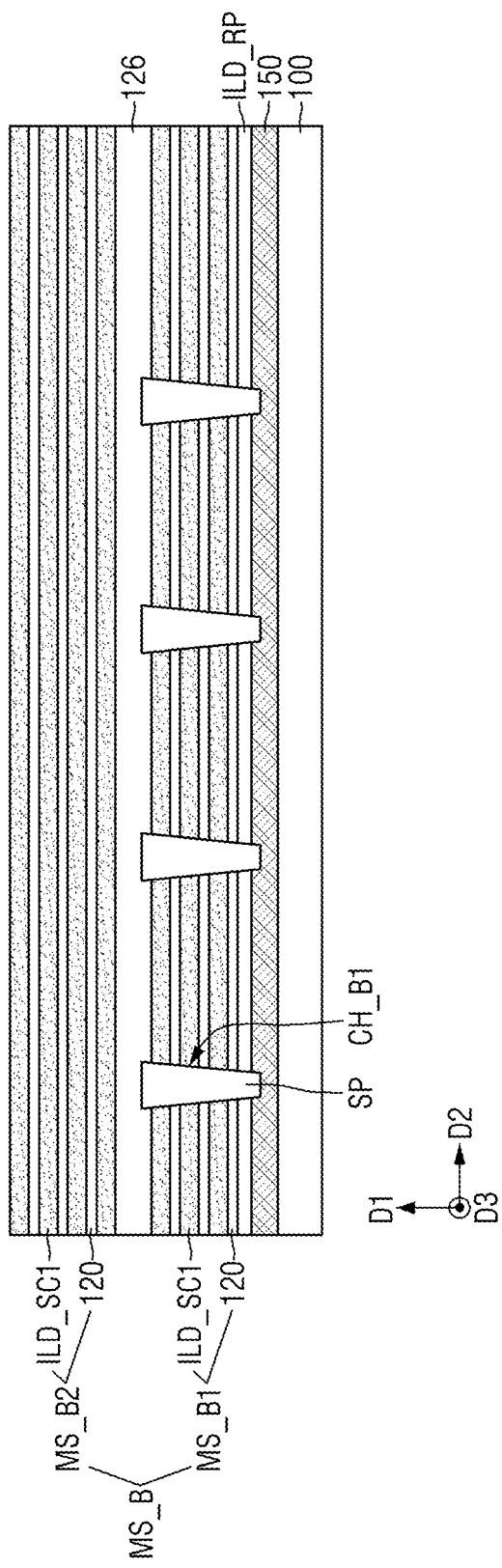

Referring to FIG. 20, the second lower mold structure MS_B2 may be formed on the first lower mold structure MS_B1.

First, the sacrificial pattern SP may be formed. The sacrificial pattern SP may fill the first lower channel hole CH_B1.

Subsequently, the inter-electrode insulating film 126 may be formed on the first lower mold structure MS_B1. The inter-electrode insulating film 126 may cover the first lower mold structure MS_B1.

Subsequently, the second lower mold structure MS_B2 may be formed on the inter-electrode insulating film 126.

The inter-electrode insulating film 126 may be interposed between the first lower mold structure MS_B1 and the second lower mold structure MS_B2. The inter-electrode insulating film 126 placed between the first lower mold structure MS_B1 and the second lower mold structure MS_B2 may be thicker than the inter-electrode insulating film 120 placed between the lower sacrificial films ILD_SC1, e.g., along the first direction D1.

The second lower mold structure MS_B2 may include an inter-electrode insulating film 120 and a lower sacrificial film ILD_SC1. The inter-electrode insulating film 120 and the lower sacrificial film ILD_SC1 may be alternately stacked on the first lower mold structure MS_B1 in the first direction D1. The first lower mold structure MS_B1 and the second lower mold structure MS_B2 may form the lower mold structure MS_B.

Figure 21:
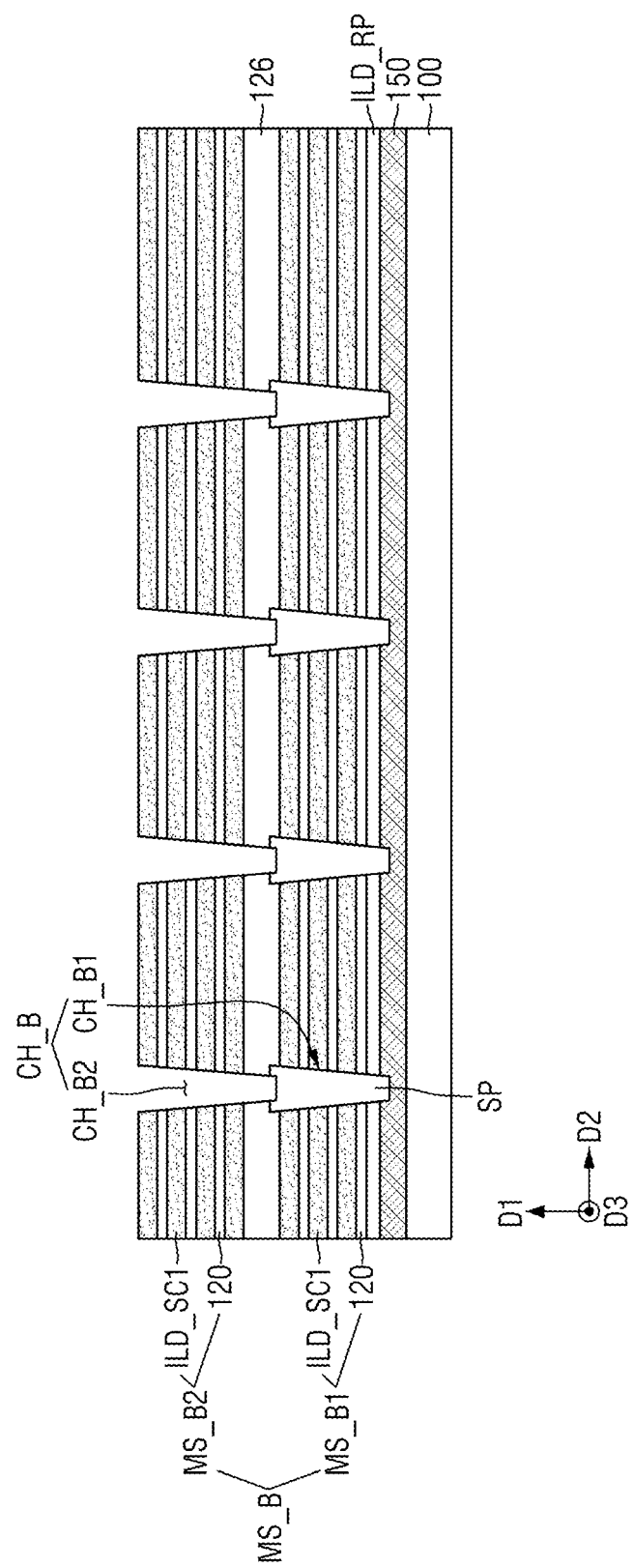

Referring to FIG. 21, a second lower channel hole CH_B2 that penetrates the second lower mold structure MS_B2 in the first direction D1 may be formed.

The second lower channel hole CH_B2 may penetrate the second lower mold structure MS_B2 in the first direction D1 to expose the sacrificial pattern SP. The second lower channel hole CH_B2 may be aligned with the first lower channel hole CH_B1 in the first direction D1. The second lower channel hole CH_B2 may overlap the first lower channel hole CH_B1 in the first direction D1. The second lower channel hole CH_B2 may overlap the sacrificial pattern SP in the first direction D1. The second lower channel hole CH_B2 and the first lower channel hole CH_B1 may form the lower channel hole CH_B.

Figure 22:
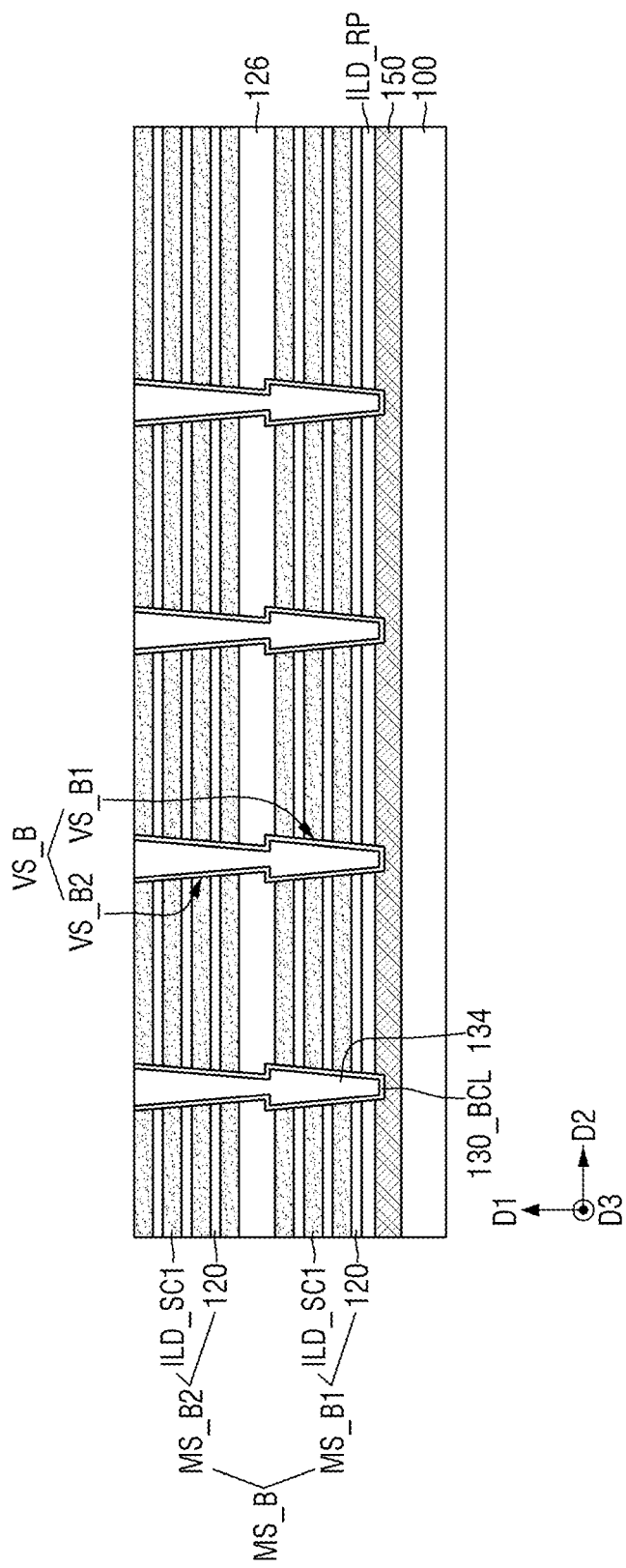

Referring to FIG. 22, the lower vertical channel structure VS_B may be formed.

The lower vertical channel structure VS_B may include a first lower vertical channel structure VS_B1 and a second lower vertical channel structure VS_B2. The second lower vertical channel structure VS_B2 may be formed on the first lower vertical channel structure VS_B1.

First, after removing the sacrificial pattern inside the first lower channel hole, the lower vertical channel film 130_BCL and the vertical insulating pattern 134 may be formed inside the first lower channel hole and the second lower channel hole. A lower channel insulating film is formed between the lower vertical channel film 130_BCL and the lower mold structure MS_B.

Accordingly, the lower vertical channel structure VS_B may be formed inside the lower mold structure MS_B. The first lower vertical channel structure VS_B1 may be formed inside the first lower mold structure MS_B1. The second lower vertical channel structure VS_B2 may be formed inside the second lower mold structure MS_B2. Subsequently, the semiconductor device according to some embodiments may be fabricated through the processes described in FIGS. 7 to 18.

FIGS. 23 to 26 are stages in a method for fabricating a semiconductor device according to some embodiments. For convenience of explanation, only differences relative to those described with reference to FIGS. 4 to 18 will be mainly described.

Figure 23:
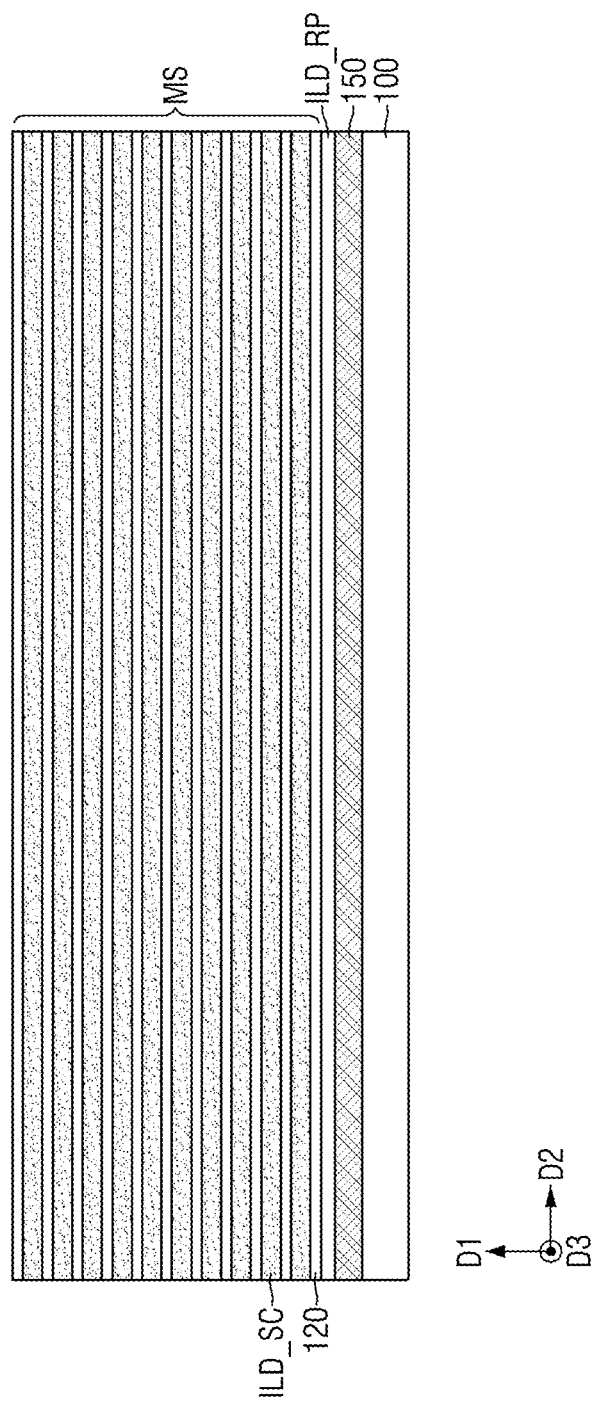
FIGS. 23 to 26 are views of stages in a method for fabricating a semiconductor device according to some embodiments.

Referring to FIG. 23, the horizontal conductive substrate 150 and the replacement insulating film ILD_RP may be formed on the third substrate 100.

The mold structure MS may be formed on the replacement insulating film ILD_RP. The mold structure MS may be formed by alternately stacking the inter-electrode insulating film 120 and the sacrificial films ILD_SC. The inter-electrode insulating film 120 and the sacrificial films ILD_SC may be stacked on the third substrate 100 in the first direction D1.

Figure 24:
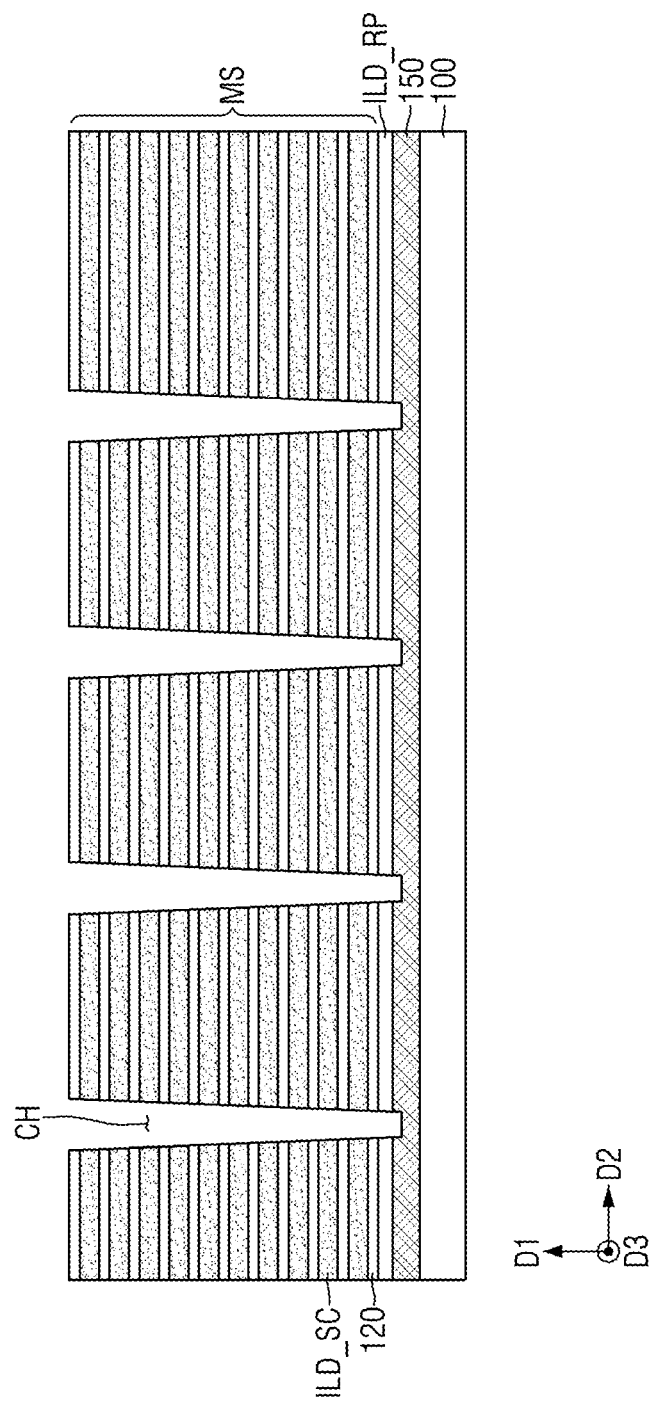

Referring to FIG. 24, a channel hole CH may be formed inside the mold structure MS. The channel hole CH may penetrate the mold structure MS in the first direction D1. A bottom side of the channel hole CH may come into contact with the horizontal conductive substrate 150.

Figure 25:
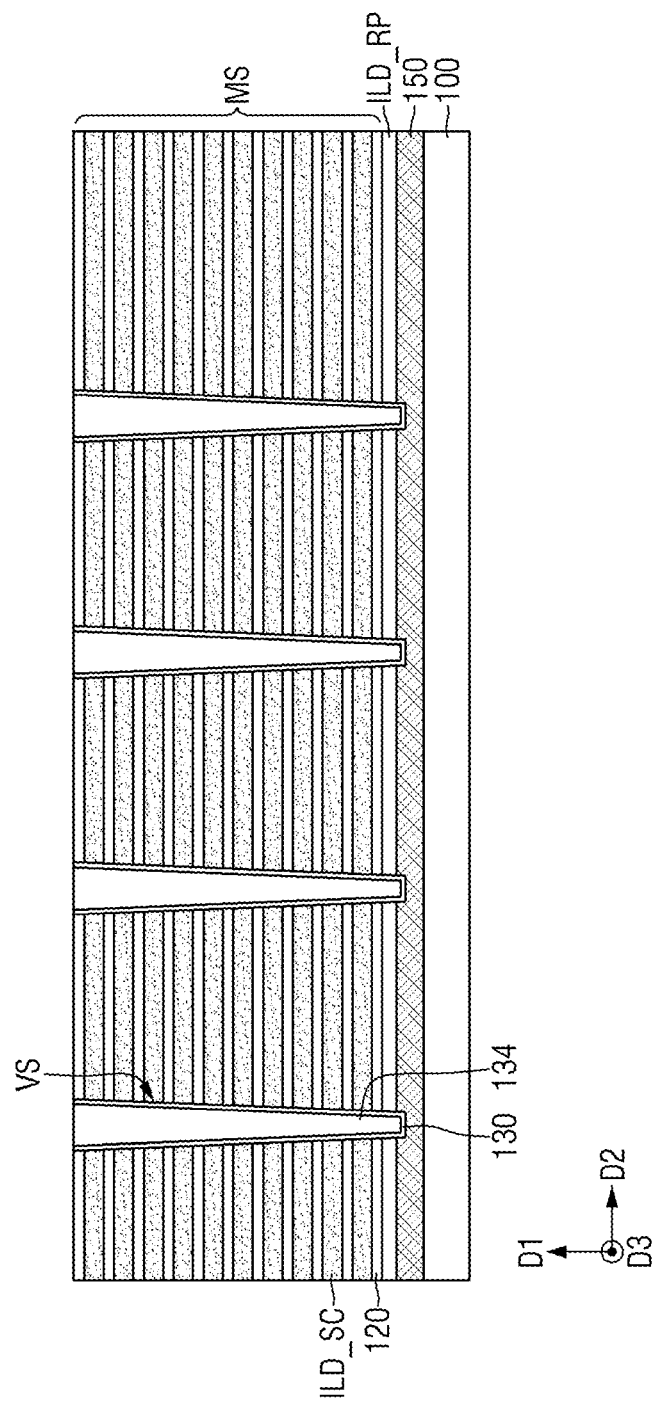

Referring to FIG. 25, the vertical channel structure VS may be formed inside the channel hole CH. The vertical channel structure VS may include a vertical channel film 130 and a vertical insulating pattern 134. Although not shown, a vertical channel insulating film may be formed between the sacrificial film ILD_SC, the inter-electrode insulating film, and the vertical channel film 130. The vertical channel film 130 may extend along the side walls and bottom side of the channel hole CH.

Figure 26:
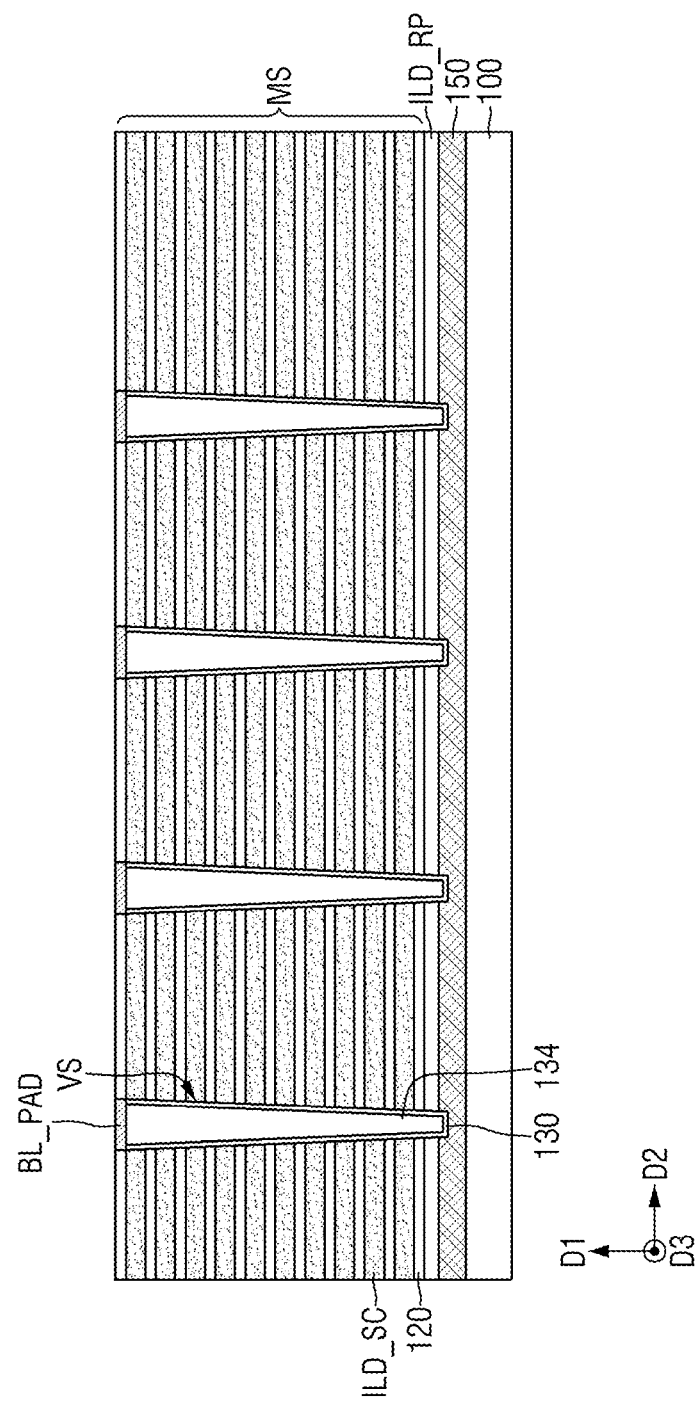

Referring to FIG. 26, a part of the vertical insulating pattern 134 is removed, and the bit line pad BL_PAD may be formed in the region from which the vertical insulating pattern 134 is removed. Subsequently, the semiconductor device according to some embodiments may be fabricated through the processes described using FIGS. 12 to 18.

Figure 27:
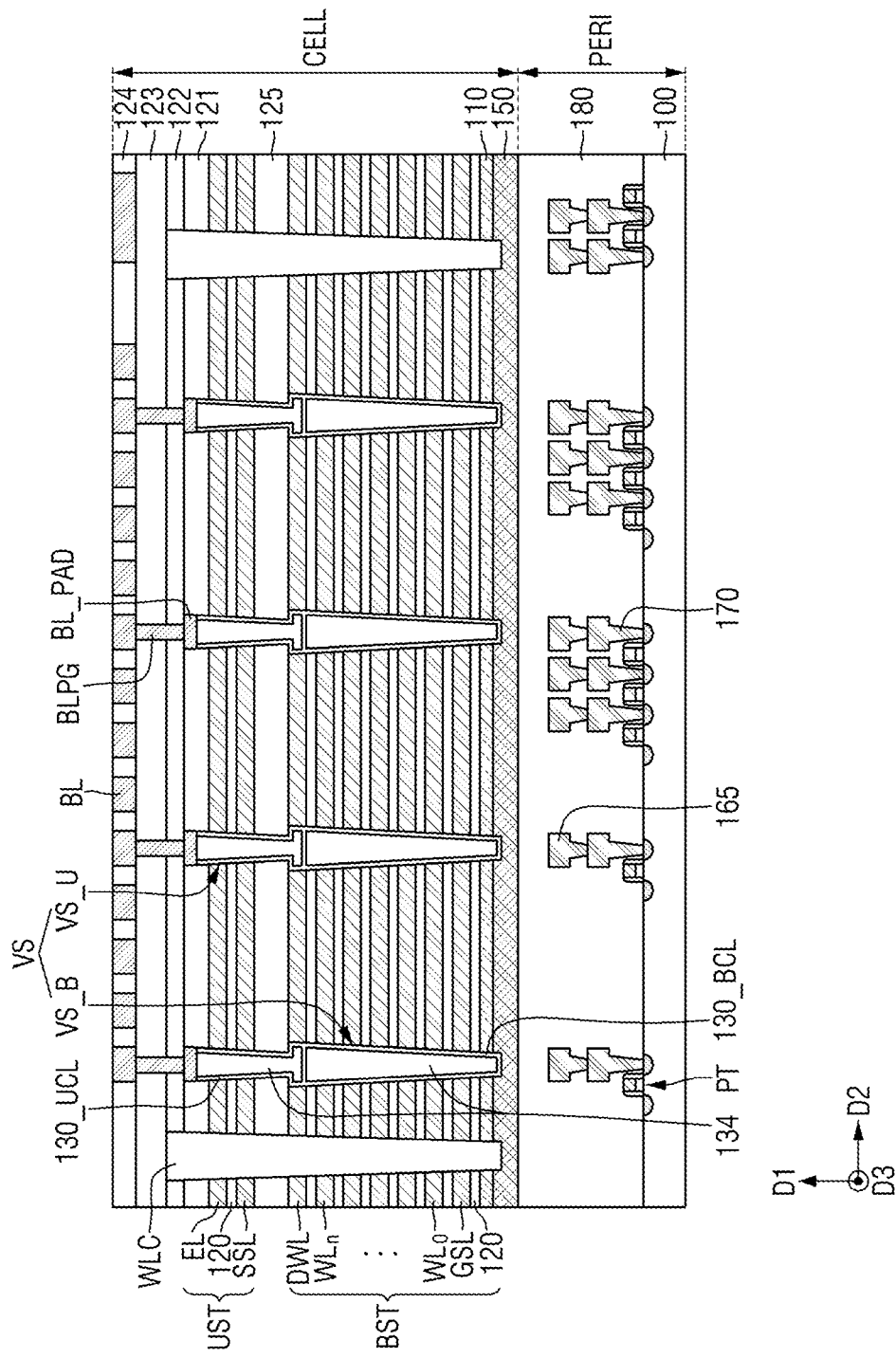
FIG. 27 is a diagram of a semiconductor device according to some embodiments.

FIG. 27 is a diagram of a semiconductor device according to some embodiments. For convenience of explanation, only differences relative to those described with reference to FIGS. 3 to 18 will be mainly described.

Referring to FIG. 27, the semiconductor device according to some embodiments may include a cell structure CELL and a peri structure PERI. The cell structure CELL may be above the peri structure PERI along the first direction D1.

The peri structure PER may include a peripheral circuit PT, a first metal layer 170, a second metal layer 165, and a peri insulating film 180.

The peri insulating film 180 may be formed on the third substrate 100. The peri insulating film 180 may be interposed between the horizontal conductive substrate 150 and the third substrate 100. The peri insulating film 180 may include, e.g., at least one of silicon oxide, silicon nitride, silicon oxynitride, and a low dielectric constant material.

The peripheral circuit PT may be formed on the third substrate 100. The peripheral circuit PT may be formed inside the peri insulating film 180. The peripheral circuit PT may include circuits that operate the cell structure CELL.

The first metal layer 170 may be connected to the peripheral circuit PT. The first metal layer 170 may be formed of tungsten (W) having a relatively high resistance. The second metal layer 165 may be connected to the first metal layer 170. The second metal layer 165 may be formed of copper (Cu) having a relatively low resistance.

The cell structure CELL may be placed on the peri structure PER. The cell structure CELL may be the semiconductor device described in FIG. 17. The cell structure CELL may include the lower stacked structure BST, the upper stacked structure UST, the plurality of vertical channel structures VS, the cutting line WLC, and the plurality of bit lines BL.

Figure 28:
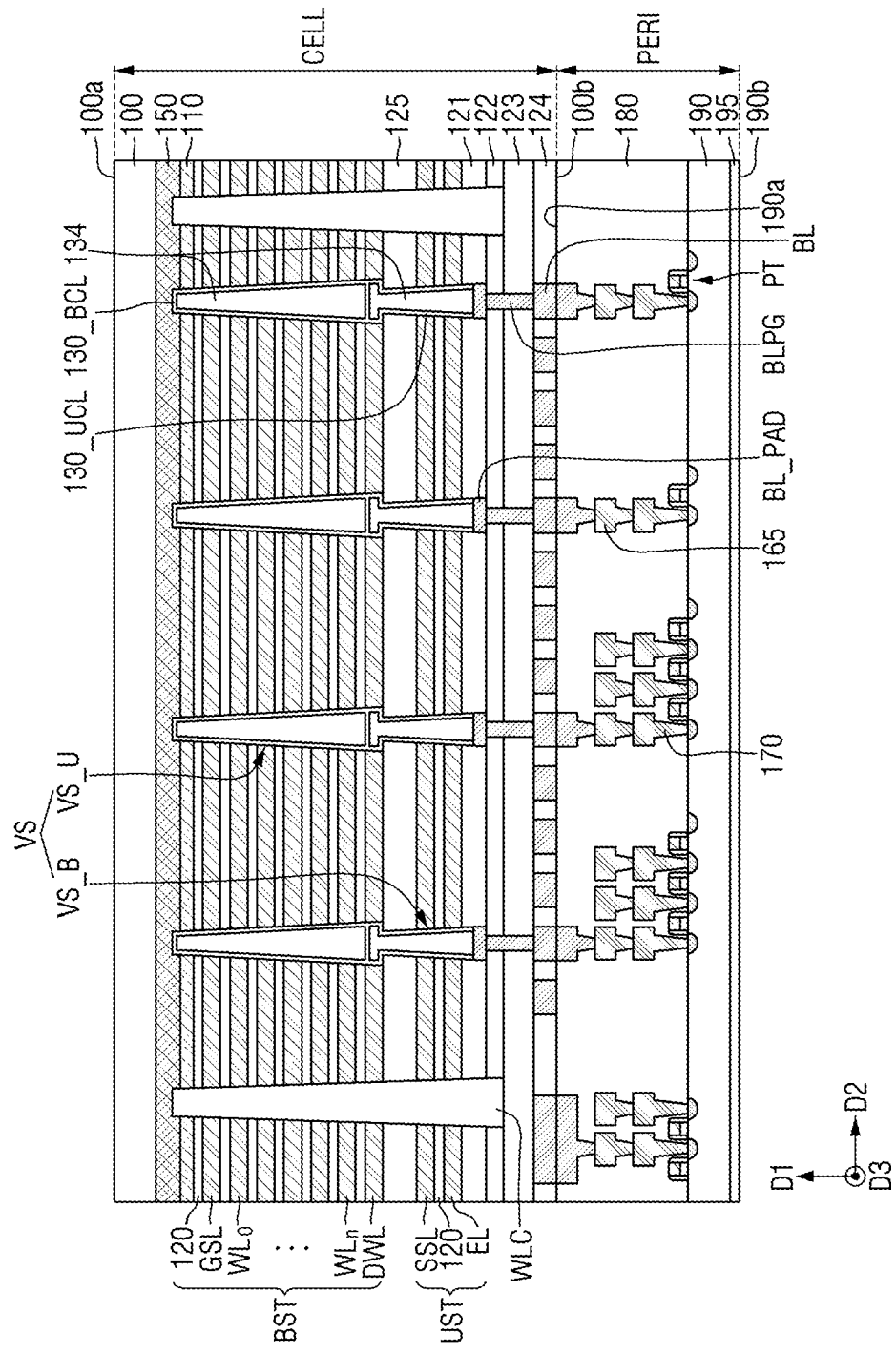
FIG. 28 is a diagram of a semiconductor device according to some embodiments.

FIG. 28 is a diagram of a semiconductor device according to some embodiments. For convenience of explanation, only differences relative to those described with reference to FIG. 27 will be mainly described.

Referring to FIG. 28, the peri structure PERI may be directly bounded to the cell structure CELL.

The cell structure CELL may include a third side 100a, and a fourth side 100b opposite to the third side 100a. The third side 100a of the cell structure CELL may be one side of the third substrate 100. The fourth side 100b of the cell structure CELL may be one side of the fourth interlayer insulating film 124. The fourth side 100b of the cell structure CELL may expose the bit line BL.

The peri structure PER may include a fourth substrate 190, a lower insulating film 195, the peri insulating film 180, the peripheral circuit PT, the first metal layer 170, the second metal layer 165, and a third metal layer 160.

The lower insulating film 195 may be placed below the fourth substrate 190. The peri insulating film 180 may be placed on the fourth substrate 190. The fourth substrate 190 may be interposed between the lower insulating film 195 and the peri insulating film 180.

The peripheral circuit PT, the first metal layer 170, the second metal layer 165, and the third metal layer 160 may be placed inside the peri insulating film 180. The third metal layer 160 may be placed on the second metal layer 165. The third metal layer 160 may be bonded to the bit line BL.

The peri structure PER may include a fifth side 190a, and a sixth side 190b opposite to the fifth side 190a. The fifth side 190a of the peri structure PER may be the upper side of the peri insulating film 180. The sixth side 190b of the peri structure PER may be the lower side of the lower insulating film 195. The fifth side 190a of the peri structure PERI may expose the third metal layer 160. The fourth side 100b of the cell structure CELL and the fifth side 190a of the peri structure PERI may be bonded to each other.

Figure 29:
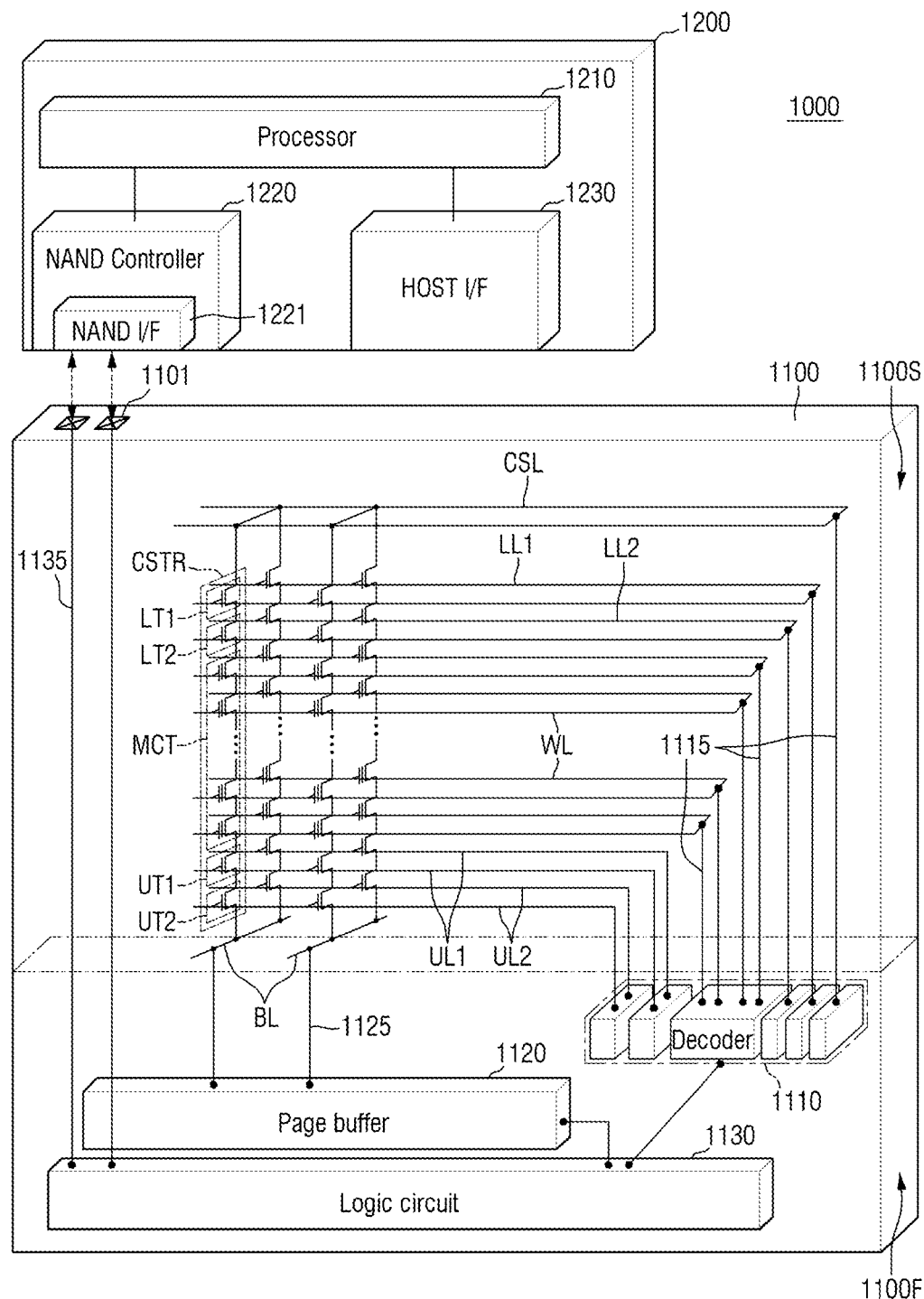
FIG. 29 is a schematic block diagram of an electronic system including a semiconductor device according to some embodiments.
Figure 30:
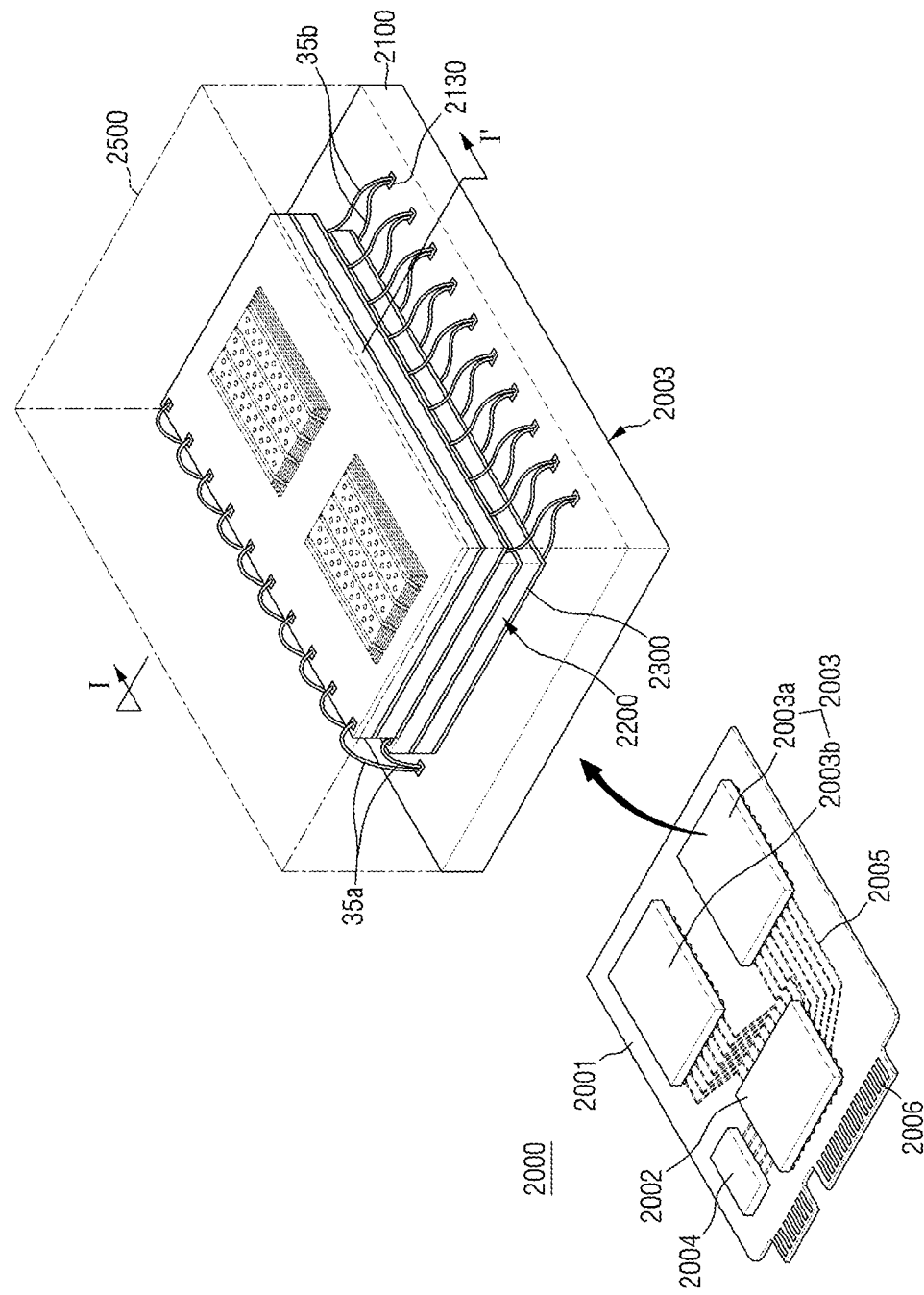
FIG. 30 is a schematic perspective view of an electronic system according to some embodiments.
Figure 31:
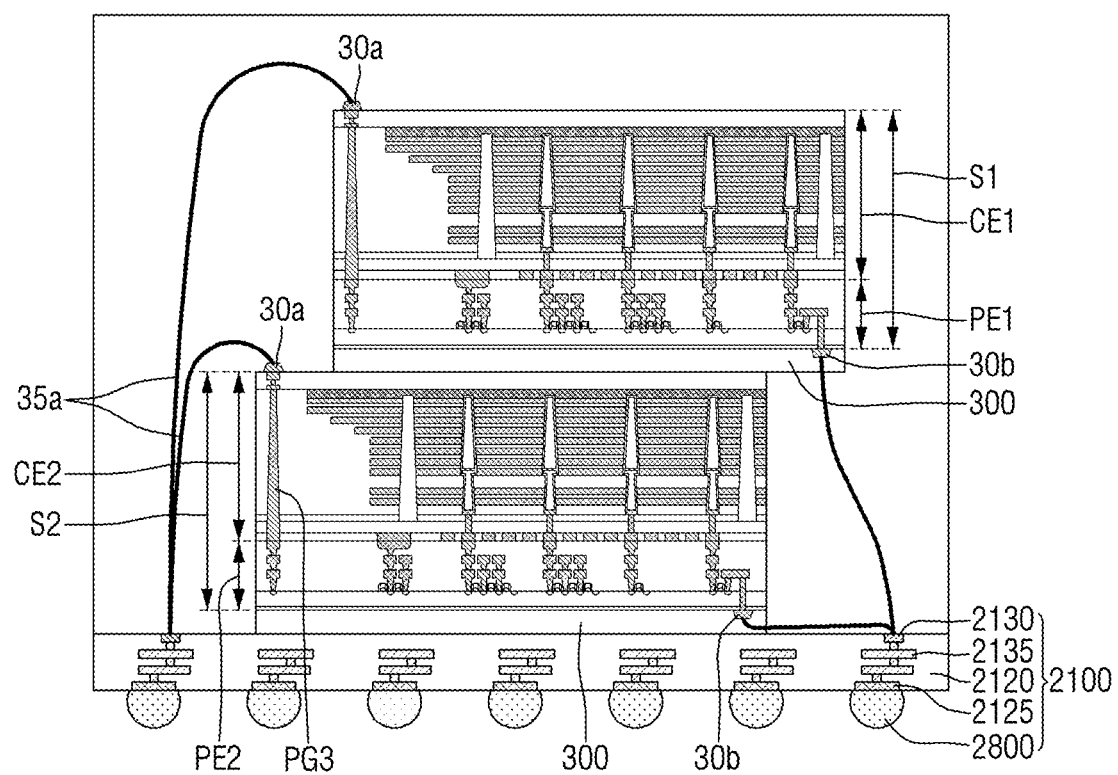
FIGS. 31 to 33 are various schematic cross-sectional views along I-I' of FIG. 30.
Figure 32:
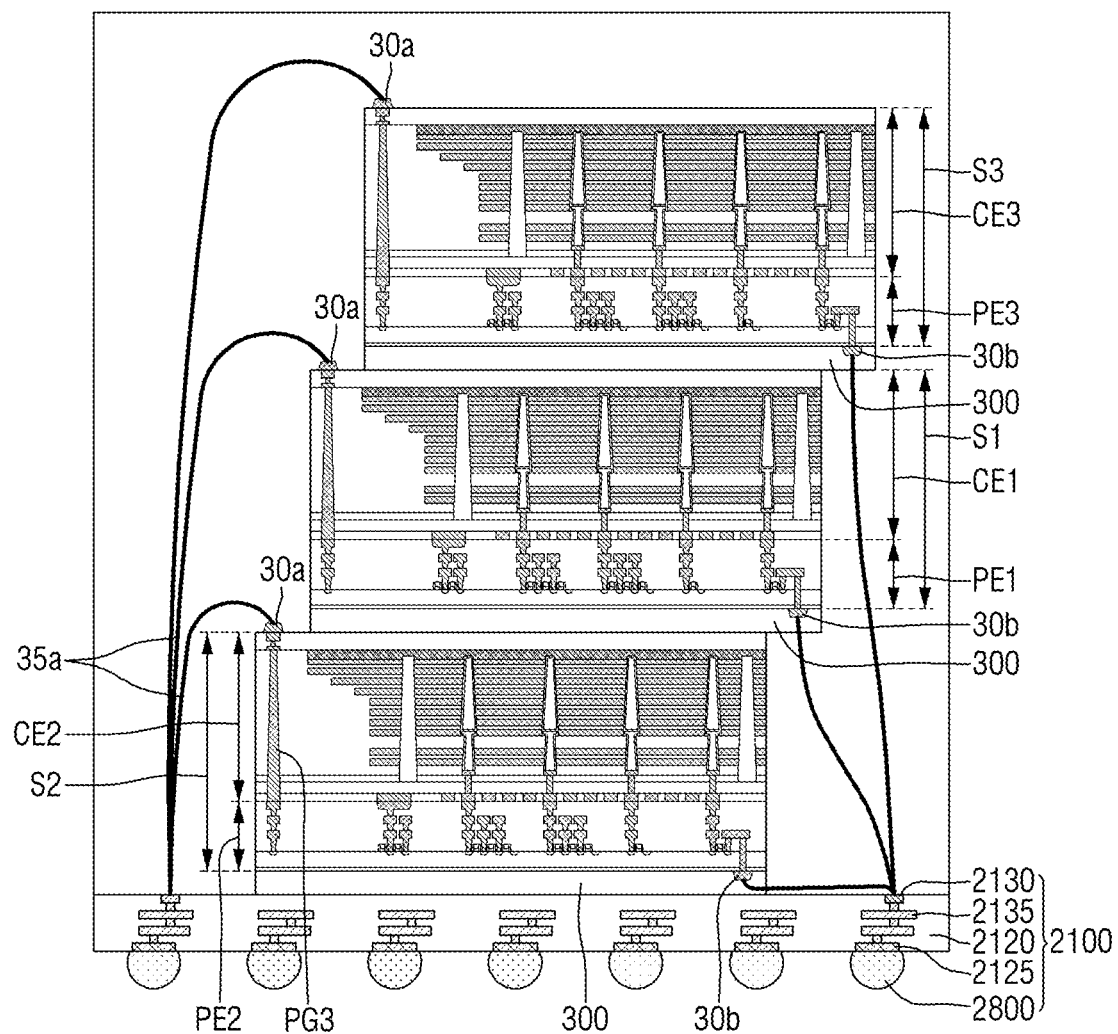
Figure 33:
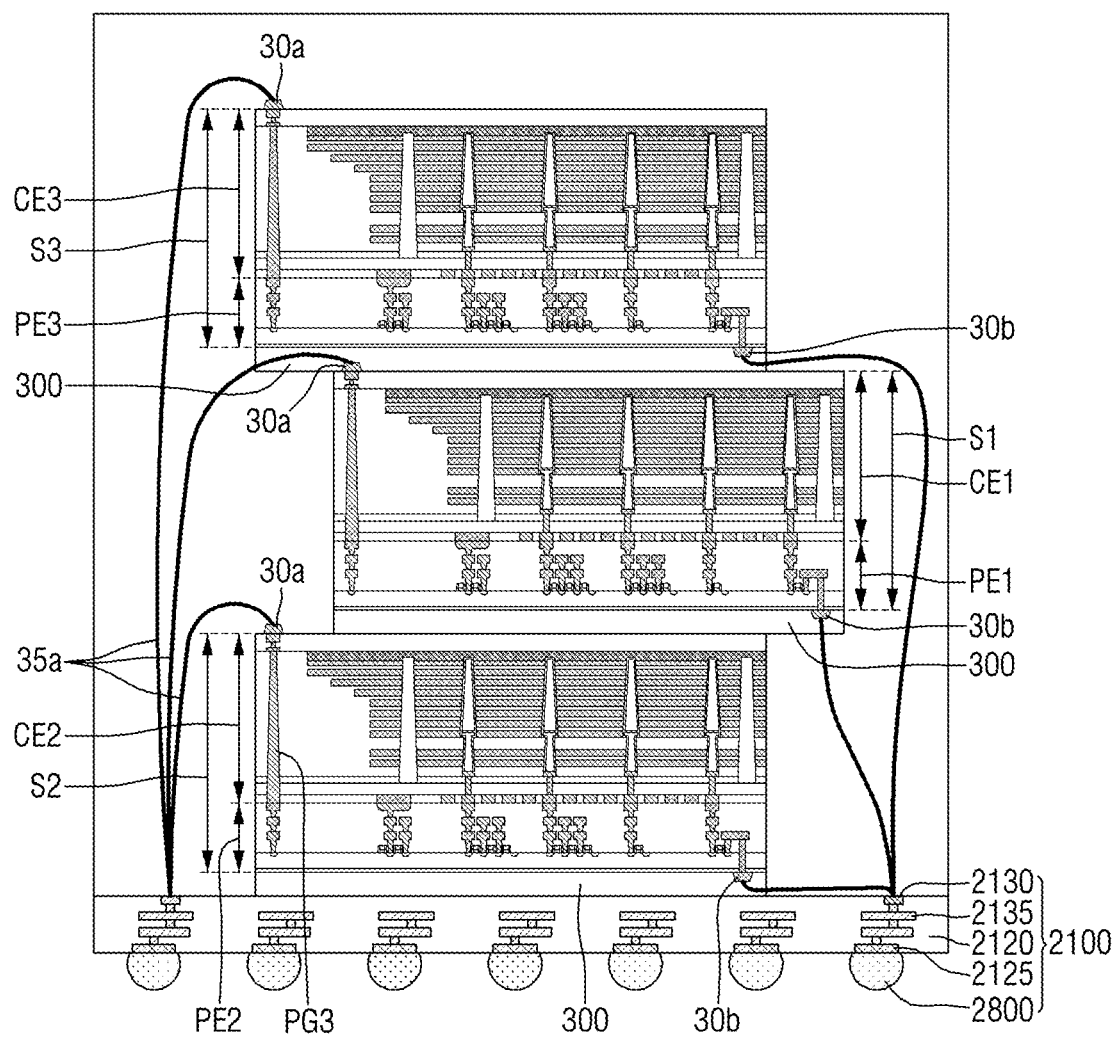

FIG. 29 is a schematic block of an electronic system including a semiconductor device according to some embodiments. FIG. 30 is a schematic perspective view of an electronic system according to some embodiments. FIGS. 31 to 33 are various schematic cross-sectional views taken along I-I' of FIG. 30. For convenience of explanation, only differences relative to those described with reference to FIGS. 3 to 28 will be mainly described.

Referring to FIG. 29, an electronic system 1000 according to some embodiments may include a semiconductor device 1100, and a controller 1200 that is electrically connected to the semiconductor device 1100. The electronic system 1000 may be a storage device that includes one or multiple semiconductor devices 1100, or an electronic device that includes the storage device. For example, the electronic system 1000 may be an SSD device (solid state drive device) including one or multiple semiconductor devices 1100, a USB (Universal Serial Bus), a computing system, a medical device or a communication device.

The semiconductor device 1100 may be a non-volatile memory device, and may be a NAND flash device explained above using FIGS. 3 to 28. The semiconductor device 1100 may include a first structure 1100F, and a second structure 1100S on the first structure 1100F.

In some embodiments, the first structure 1100F may also be placed next to the second structure 1100S. The first structure 1100F may be a peripheral circuit structure that includes a decoder circuit 1110, a page buffer 1120, and a logic circuit 1130. The second structure 1100S may be a memory cell structure that includes a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each memory cell string CSTR may include lower transistors LT1 and LT2 adjacent to the common source line CSL, upper transistors UT1 and UT2 adjacent to the bit line BL, and a plurality of memory cell transistors MCT placed between the lower transistors LT1 and LT2 and the upper transistors UT1 and UT2. The number of lower transistors LT1 and LT2 and the number of upper transistors UT1 and UT2 may be variously changed depending on the embodiments.

In some embodiments, the upper transistors UT1 and UT2 may include a string selection transistor, and the lower transistors LT1 and LT2 may include a ground selection transistor. The gate lower lines LL1 and LL2 may be the gate electrodes of the lower transistors LT1 and LT2, respectively. The word lines WL may be gate electrodes of the memory cell transistor MCT, and the gate upper lines UL1 and UL2 may be gate electrodes of the upper transistors UT1 and UT2, respectively.

In some embodiments, the lower transistors LT1 and LT2 may include a lower erasure control transistor LT1 and a ground selection transistor LT2 that are connected in series. The upper transistors UT1 and UT2 may include a string selection transistor UT1 and an upper erasure control transistor UT2 that are connected in series. At least one of the lower erasure control transistor LT1 and the upper erasure control transistor UT1 may be used for an erasure operation for removing the data stored in the memory cell transistors MCT, using a gate induce drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection wirings 1115 that extend from the inside of the first structures 1100F to the second structure 1100S. The bit lines BL may be electrically connected to the page buffer 1120 through second connection wirings 1125 that extend from the inside of the first structure 1100F to the second structure 1100S.

In the first structure 1100F, the decoder circuit 1110 and the page buffer 1120 may execute the control operation on at least one selection memory cell transistor among the plurality of memory cell transistors MCT. The decoder circuit 1110 and the page buffer 1120 may be controlled by the logic circuits 1130. The semiconductor device 1100 may communicate with the controller 1200 through an input and output pad 1101 that is electrically connected to the logic circuit 1130. The input and output pad 1101 may be electrically connected to the logic circuit 1130 through an input and output connection wiring 1135 extending from the inside of the first structure 1100F to the second structure 1100S.

The controller 1200 may include a processor 1210, a NAND controller 1220, and a host interface 1230. According to the embodiments, the electronic system 1000 may include a plurality of semiconductor devices 1100, and in this case, the controller 1200 may control the plurality of semiconductor devices 1100.

The processor 1210 may control the overall operations of the electronic system 1000 including the controller 1200. The processor 1210 may operate according to a predetermined firmware, and may control the NAND controller 1220 to access the semiconductor device 1100. The NAND controller 1220 may include a NAND interface 1221 that processes communication with the semiconductor device 1100. Control command for controlling the semiconductor device 1100, data to be recorded in the memory cell transistors MCT of the semiconductor device 1100, data to be read from the memory cell transistors MCT of the semiconductor device 1100, and the like may be transmitted through the NAND interface 1221. The host interface 1230 may provide a communication function between the electronic system 1000 and an external host. When receiving the control command from the external host through the host interface 1230, the processor 1210 may control the semiconductor device 1100 in response to the control command.

Referring to FIG. 30, an electronic system 2000 according to some embodiments may include a main board 2001, a main controller 2002 mounted on the main board 2001, one or more semiconductor packages 2003, and a dynamic random-access memory (DRAM) 2004. The semiconductor package 2003 and the DRAM 2004 may be connected to the main controller 2002 by wiring patterns 2005 formed on the main board 2001.

The main board 2001 may include a connector 2006 including a plurality of pins coupled to an external host. In the connector 2006, the number and arrangement of the plurality of pins may vary depending on the communication interface between the electronic system 2000 and the external host. In some embodiments, the electronic system 2000 may communicate with the external host according to any one of interfaces, e.g., M-Phy for USB (Universal Serial Bus), PCI-Express (Peripheral Component Interconnect Express), SATA (Serial Advanced Technology Attachment), and UFS (Universal Flash Storage). In some embodiments, the electronic system 2000 may be operated by power supplied from the external host through the connector 2006. The electronic system 2000 may further include a PMIC (Power Management Integrated Circuit) that distributes the power supplied from the external host to the main controller 2002 and the semiconductor package 2003.

The main controller 2002 may record data in the semiconductor package 2003 or read data from the semiconductor package 2003, and may improve the operating speed of the electronic system 2000.

The DRAM 2004 may be a buffer memory for alleviating a speed difference between the semiconductor package 2003, which is a data storage space, and the external host. The DRAM 2004 included in the electronic system 2000 may also operate as a kind of cache memory, and may also provide a space for temporarily storing data in the control operation of the semiconductor package 2003. When the DRAM 2004 is included in the electronic system 2000, the main controller 2002 may further include a DRAM controller for controlling the DRAM 2004, in addition to a NAND controller for controlling the semiconductor package 2003.

The semiconductor package 2003 may include a first semiconductor package 2003a and a second semiconductor package 2003b that are spaced apart from each other. The first semiconductor package 2003a and the second semiconductor package 2003b may each be a semiconductor package that includes a plurality of semiconductor chips 2200. The first semiconductor package 2003a and the second semiconductor package 2003b may each include a package substrate 2100, semiconductor chips 2200 on the package substrate 2100, connection structures 35a and 35b for electrically connecting the semiconductor chips 2200 and the package substrate 2100, and a molding layer 2500 that covers the semiconductor chips 2200 and the connection structures 35a and 35b on the package substrate 2100.

The package substrate 2100 may be a printed circuit board that includes upper pads 2130. Each semiconductor chip 2200 may be a semiconductor device described above using FIGS. 3 to 28.

In some embodiments, the connection structures 35a and 35b may be bonding wires that electrically connect the semiconductor chips 2200 and the package upper pads 2130. Therefore, in each of the first semiconductor package 2003a and the second semiconductor package 2003b, the semiconductor chips 2200 may be electrically connected to each other in a bonding wire manner, and may be electrically connected to the package upper pads 2130 of the package substrate 2100.

In some embodiments, the main controller 2002 and the semiconductor chips 2200 may also be included in a single package. In some embodiments, the main controller 2002 and the semiconductor chips 2200 are mounted on a separate interposer board different from the main board 2001, and the main controller 2002 and the semiconductor chips 2200 may also be connected to each other by the wiring formed on the interposer board.

Referring to FIGS. 30 and 31, in the semiconductor package 2003, the package substrate 2100 may be a printed circuit board. The package substrate 2100 may include a package substrate body portion 2120, upper pads 2130 placed on an upper side of the package substrate body portion 2120, lower pads 2125 placed on a lower side of the package substrate body portion 2120 or exposed through the lower side, and inner wirings 2135 that electrically connect the package upper pads 2130 and the lower pads 2125 inside the package substrate body portion 2120. The upper pads 2130 may be electrically connected to the connection structures 35a and 35b. The lower pads 2125 may be connected to the wiring patterns 2005 of the main board 2001 of the electronic system 2000 through conductive connections 2800.

Each of the first and second semiconductor chips S1 and S2 may include the first and second cell structures CE1 and CE2 and the first and second peri structures PE1 and PE2. The first and second cell structures CE1 and CE2 may include, e.g., the cell structure described above referring to FIG. 17.

In some embodiments, the first and second semiconductor chips S1 and S2 may each have first and second cell structure CE1 and CE2 and first and second peri structures PE1 and PE2 bonded in a wafer bonding manner. For example, the first and second cell structures CE1 and CE2 and the first and second peri structures PE1 and PE2 may be connected by a copper-copper bonding process.

In some embodiments, a chip attachment film 300 may attach the semiconductor chips S1 and S2 onto the package substrate 2100. As an example, the chip attachment film 300 may attach the second semiconductor chip S2 onto the package substrate 2100.

In some embodiments, the first semiconductor chip S1 may form an overhang region on the second semiconductor chip S2 and be stacked on the second semiconductor chip S2. For example, the stacked first semiconductor chip S1 and the second semiconductor chip S2 may have a stepped shape. That is, the first semiconductor chip S1 may expose a part of the second semiconductor chip S2.

The semiconductor chips S1 and S2 may be electrically connected to each other by the connection structures 35a and 35b, and may be electrically connected to the package upper pads 2130 of the package substrate 2100. For example, the first and second semiconductor chips S1 and S2 may be electrically connected to each other through the connection structures 35a (i.e., upper bonding wires 35a) or the connection structures 35b (i.e., lower bonding wires 35b), respectively. The first and second semiconductor chips S1 and S2 may be electrically connected to the first pad 30a and the package upper pads 2130 of the package substrate 2100, using the upper bonding wires 35a, respectively. The first and second semiconductor chips S1 and S2 may be electrically connected to the second pad 30b and the package upper pads 2130 of the package substrate 2100, using the lower bonding wires 35b, respectively.

Referring to FIGS. 30, 32 and 33, in the electronic system 2000 according to some embodiments, the first to third semiconductor chips S1, S2 and S3 may be stacked by forming an overhang region, respectively.

The third semiconductor chip S3 may be placed on the first semiconductor chip S1. The third semiconductor chip S3 may include a third cell structure CE3 and a third peri structure PE3.

As an example, as shown in FIG. 32, the first to third semiconductor chips S1, S2, and S3 may be stacked in a stepped manner. As another example, as shown in FIG. 33, the first to third semiconductor chips S1, S2, and S3 may be stacked in a zigzag form.

The semiconductor device according to some embodiments may be fabricated, using the deposition process described referring to FIGS. 2A to 2D. For example, the semiconductor device may be a DRAM. Hereinafter, a method for fabricating a semiconductor device according to some embodiments will be described referring to FIGS. 34 to 39.

Figure 34:
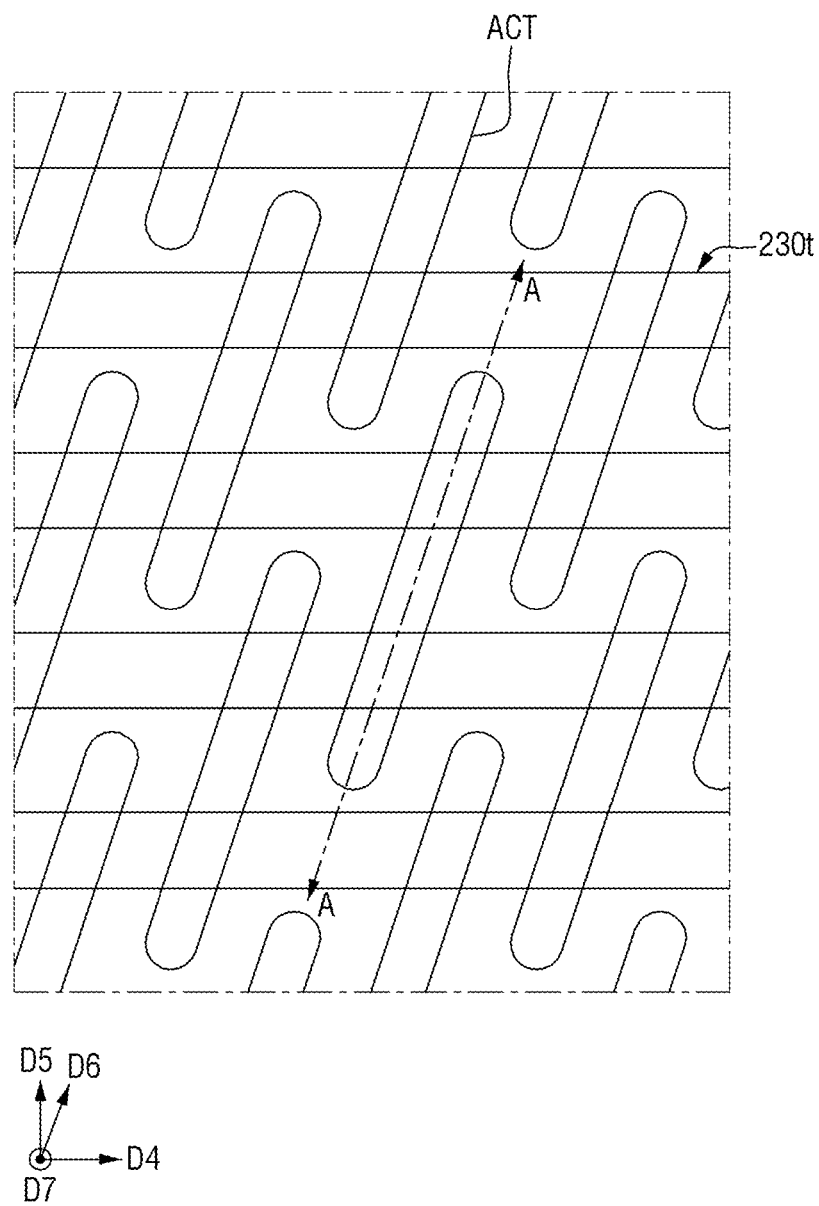
FIGS. 34 to 37 are view of stages in a method for fabricating a semiconductor device according to some embodiments.
Figure 35:
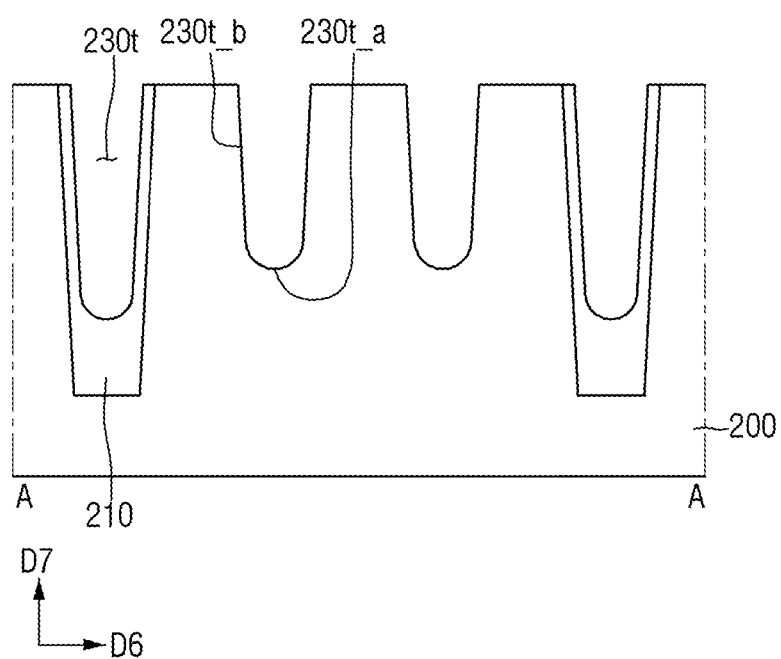
Figure 36:
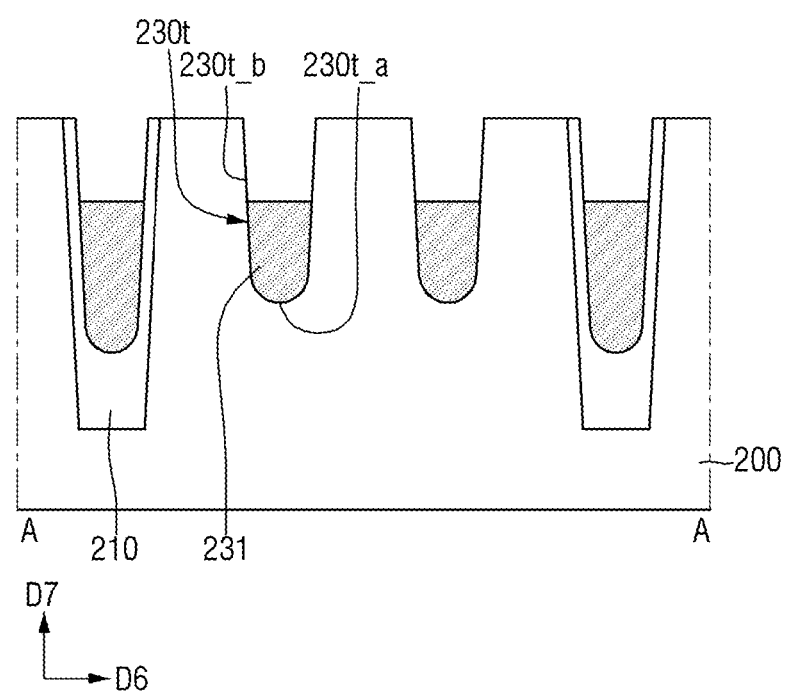
Figure 37:
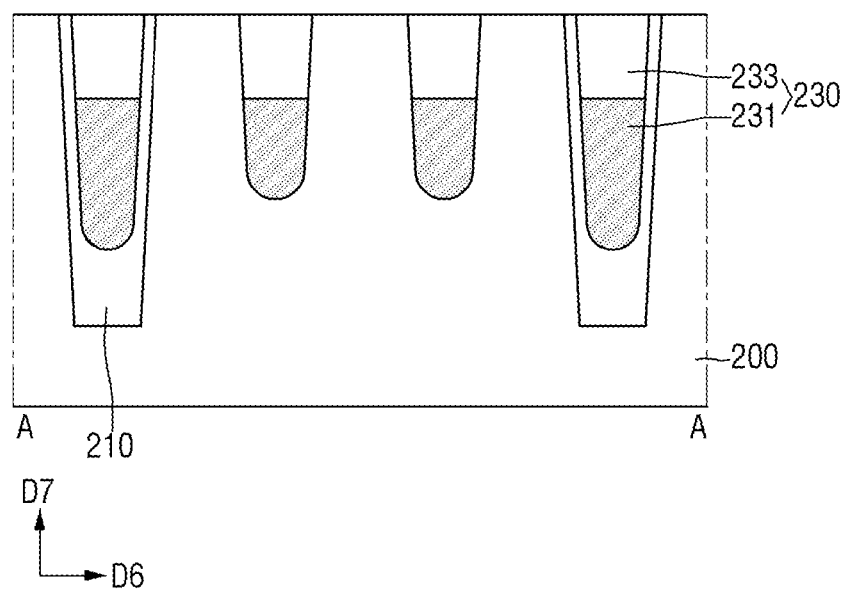

FIGS. 34 to 37 are stages in a method for fabricating a semiconductor device according to some embodiments. In detail, FIG. 34 is a partial top layout of a semiconductor device according to some embodiments, and FIGS. 35 to 37 are cross-sectional views taken along line A-A of FIG. 34.

Referring to FIGS. 34 and 35, a fifth substrate 200 including an active region ACT may be formed.

For example, the fifth substrate 200 may be bulk silicon or silicon on insulator (SOI). In another example, the fifth substrate 200 may be a silicon substrate, or may include other materials, e.g., silicon germanium, SGOI (silicon germanium on insulator), indium antimonide, lead tellurium compounds, indium arsenide, indium phosphate, gallium arsenide or gallium antimonide. In the following description, the fifth substrate 200 will be described as a silicon substrate.

As the design rules of the semiconductor devices decrease, the active region ACT may be formed in a diagonal bar shape. For example, the active region ACT may be formed in the form of a bar that extends in a sixth direction D6 (but not a fourth direction D4 and a fifth direction D5), in a plane in which the fourth direction D4 and the fifth direction D5 extend. The sixth direction D6 may intersect the fourth direction D4. The sixth direction D6 may intersect the fifth direction D5. For example, the sixth direction D6 may form an acute angle with the fourth direction D4, e.g., the acute angle may be 60°.

Further, the active region ACT may be in the form of a plurality of bars extending in a direction parallel to each other. Further, the center of one active region ACT among the plurality of active regions ACT may be placed to be adjacent to the distal end portion of the other active region ACT. The active region ACT may be in the form of a plurality of bars extending in the sixth direction D6. Each active region ACT may be spaced apart from each other in the fourth direction D4 or in the fifth direction D5. The active region ACT may form a source region and drain region by including impurities.

An element isolation film 210 may be formed inside the fifth substrate 200. The element isolation film 210 may have an STI (shallow trench isolation) structure having excellent element isolation characteristics. The element isolation film 210 may define the active region ACT. The active region ACT defined by the element isolation film 210 may have a long island formation including a minor axis and a major axis, as shown in FIG. 34. The element isolation film 210 may include, e.g., at least one of a silicon oxide film, a silicon nitride film, and a silicon oxynitride film.

Subsequently, a first gate trench 230t extending in the fourth direction D4 may be formed. The first gate trenches 230t extend in the fourth direction D4 and may be spaced apart from each other in the fifth direction D5. The width of the first gate trench 230t in the fifth direction D5 may be 30 nm or less, e.g., about 20 nm or less.

The first gate trench 230t may cross the active region ACT. For example, a part of the first gate trench 230t may be formed inside the element isolation film 210, and a part of the first gate trench 230t may be formed inside the fifth substrate 200.

In FIG. 35, the first gate trench 230t may include a bottom side 230t_a and side walls 230t_b. The bottom side 230t_a of the first gate trench 230t may connect the side walls 230t_b of the first gate trench 230t.

Referring to FIG. 36, the first gate electrode 231 that fills a part of the first gate trench 230t may be formed. The first gate electrode 231 may be formed, using the deposition process described referring to FIGS. 2A to 2D.

That is, the first gate electrode 231 may be formed from the bottom side 230t_a of the first gate trench 230t in a bottom-up manner. The first gate electrode 231 may be formed, using electroless plating or electroplating deposition process. The first gate electrode 231 may be a single layer.

The first gate electrode 231 may extend in the fourth direction D4. The first gate electrodes 231 may be spaced apart from each other in the fifth direction D5. The first gate electrode 231 may be a word line of a semiconductor device according to some embodiments.

The first gate electrode 231 may include, e.g., at least one of copper (Cu), tungsten (W), nickel (Ni), molybdenum (Mo), cobalt (Co), and ruthenium (Ru). Preferably, the first gate electrode 231 may include, e.g., nickel (Ni). The first gate electrode 231 may not include fluorine (F) or chlorine (Cl).

Referring to FIG. 37, a gate capping pattern 233 that fills the first gate trench 230t which remains after filling the first gate electrode 231 may be formed on the first gate electrode 231. That is, the gate structure 230 including the first gate electrode 231 and the gate capping pattern 233 may be formed. The gate capping pattern 233 may include, e.g., at least one of silicon nitride (SiN), silicon oxynitride (SiON), silicon oxide (SiO$_2$), silicon carbonitride (SiCN), silicon oxycarbonitride (SiOCN), and combinations thereof.

An impurity doping region may be formed on at least one side of the gate structure 230. The impurity doping region may be a source/drain region of the transistor.

Figure 38:
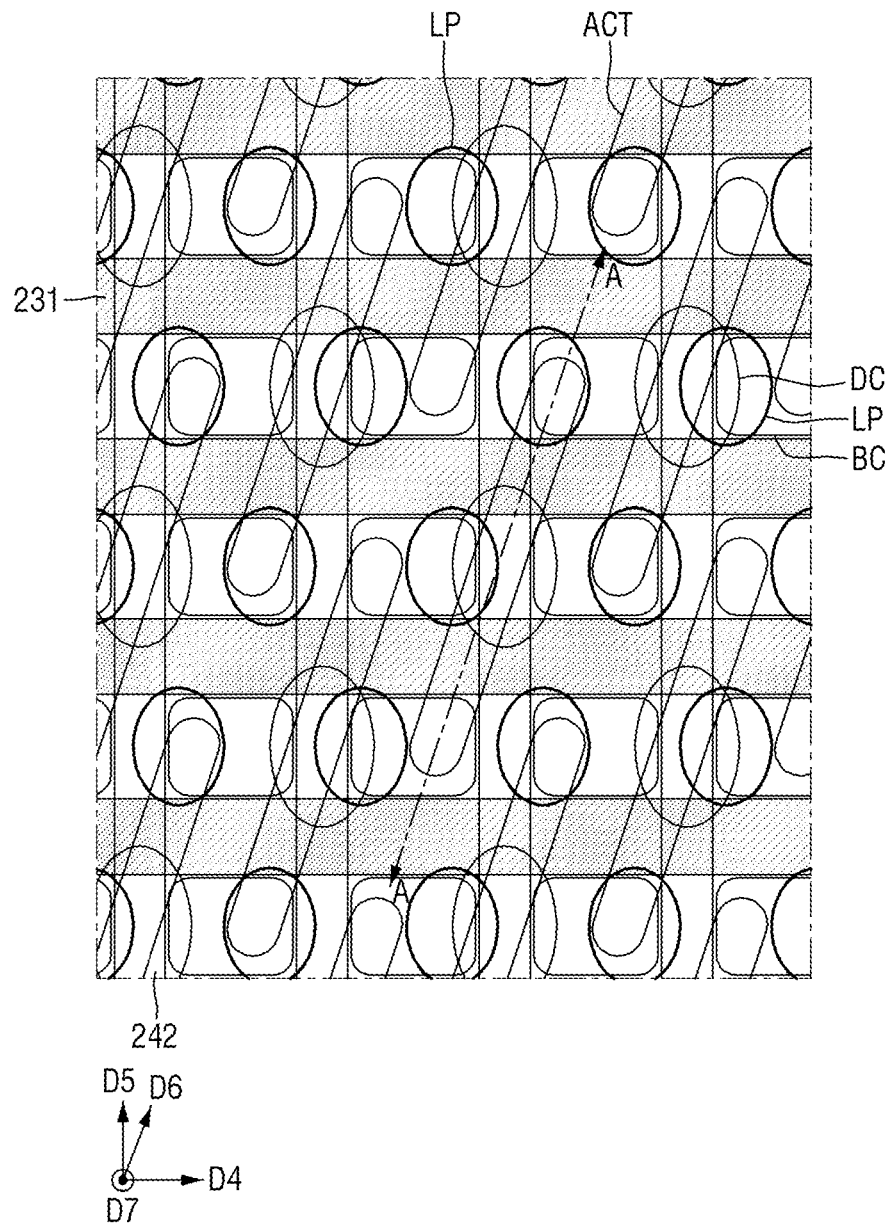
FIG. 38 is a layout diagram of a semiconductor device according to some embodiments.
Figure 39:
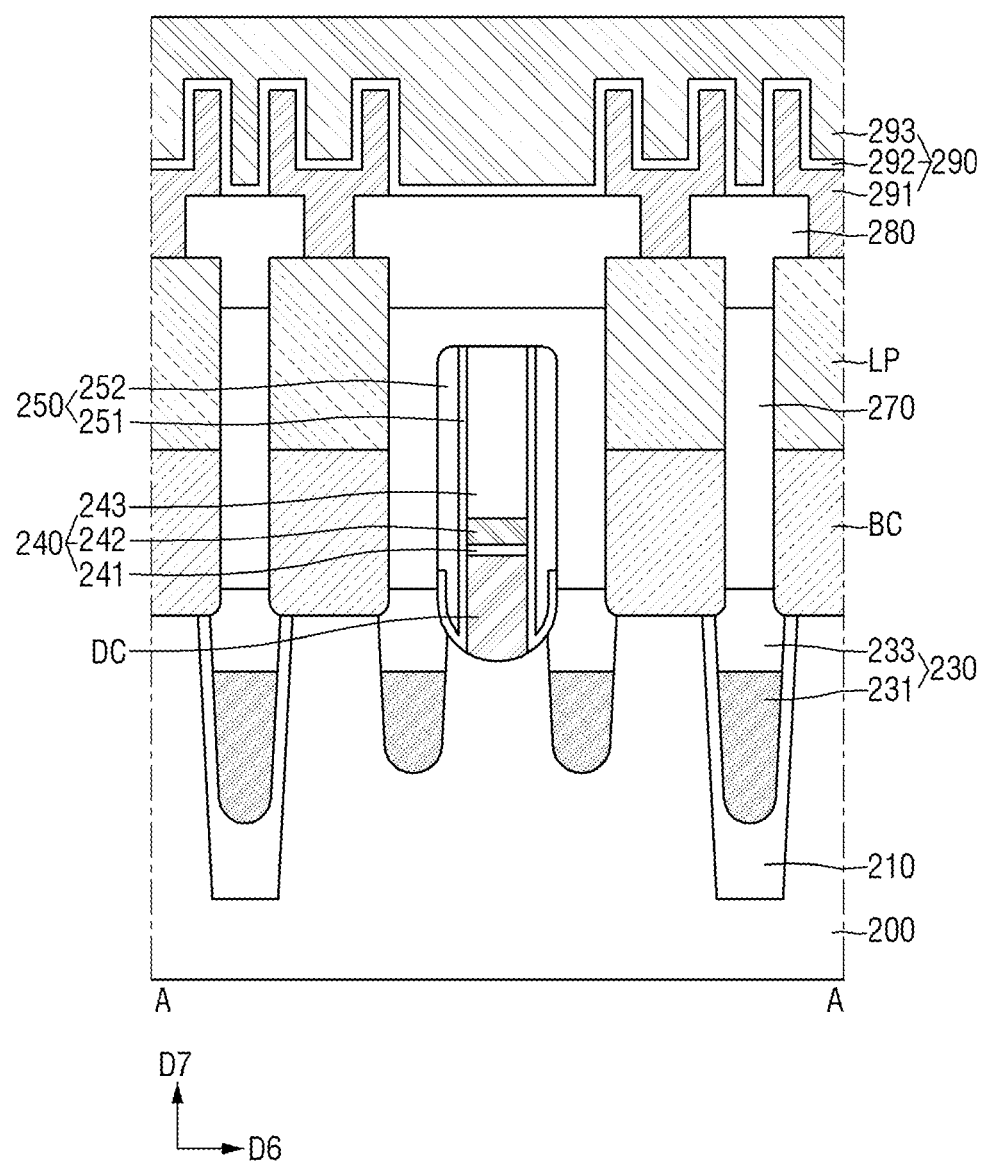
FIG. 39 is a cross-sectional view taken along line A-A of FIG. 38.

FIG. 38 is a layout diagram of a semiconductor device according to some embodiments. FIG. 39 is a cross-sectional view taken along the line A-A of FIG. 38.

Referring to FIGS. 38 and 39, a direct contact DC, a bit line structure 240, a buried contact BC, a landing pad LP, and a capacitor 290 may be formed.

The bit line structure 240 may be formed on the gate structure 230. The bit line structure 240 may be formed in a direction intersecting the first gate electrode 231. The bit line structure 240 may be formed, e.g., by extending in the fifth direction D5. The bit line structures 240 may be spaced apart from each other in the fourth direction D4.

The bit line structure 240 may include a first conductive line 241, a second conductive line 242, and a bit line capping pattern 243. The first conductive line 241, the second conductive line 242, and the bit line capping pattern 243 may be sequentially stacked in a seventh direction D7. The seventh direction D7 may be, e.g., a direction that is perpendicular to the fourth direction D4, the fifth direction D5, and the sixth direction D6. The first conductive line 241 and the second conductive line 242 may be bit lines of some semiconductor devices.

The first and second conductive lines 241 and 242 may each include, e.g., at least one of an impurity-doped semiconductor material, a conductive silicide compound, a conductive metal nitride metal, and a metal alloy. For example, although the first conductive line 241 may include at least one of a conductive silicide compound and a conductive metal nitride, and the second conductive line 242 may include at least one of a metal and a metal alloy, the embodiment is not limited thereto.

The bit line capping pattern 243 may include, e.g., at least one of a silicon nitride film, silicon oxynitride, silicon carbonitride, and silicon oxycarbonitride.

The direct contact DC may be formed between the second conductive line 242 and the fifth substrate 200. That is, the second conductive line 242 may be formed on the direct contact DC. For example, the direct contact DC may be formed at a point in which the second conductive line 242 intersects the central portion of the active region ACT having a long island shape.

The direct contact DC may electrically connect the second conductive line 242 and the fifth substrate 200. The direct contact DC may include, e.g., at least one of an impurity-doped semiconductor material, a conductive silicide compound, a conductive metal nitride and a metal.

The bit line spacer 250 may be formed on the side wall of the bit line structure 240. The bit line spacer 250 may be formed on the side walls of the direct contact DC. The bit line spacer 250 may extend in the fifth direction D5 on the side walls of the bit line structure 240 and the direct contact DC.

The bit line spacer 250 may be a single film, but the bit line spacer 250 may be a multiple film including the first bit line spacer 251 and the second bit line spacer 252. For example, each of the first and second bit line spacers 251 and 252 may include one of a silicon oxide film, a silicon nitride film, a silicon oxynitride film (SiON), a silicon oxycarbonitride film (SiOCN), air, and combination thereof.

The buried contact BC may be formed between the bit line structures 240 adjacent to each other in the fourth direction D4. The buried contact BC may be formed between the fences 270 adjacent to each other in the fifth direction D5.

The buried contact BC may include, e.g., at least one of an impurity-doped semiconductor material, a conductive silicide compound, a conductive metal nitride, and a metal. This allows the buried contact BC to be electrically connected to the active region ACT. The buried contact BC may include, e.g., polysilicon.

The fence 270 may be formed on the fifth substrate 200 and the element isolation film 210. The fence 270 may be formed to overlap the gate structure 230 formed inside the fifth substrate 200 and the element isolation film 210 in the seventh direction D7.

The fence 270 may include, e.g., at least one of silicon oxide, silicon nitride, silicon oxynitride, and combinations thereof. The fence 270 may separate the buried contact BC.

The landing pad LP may be formed on the buried contact BC. The landing pad LP may be electrically connected to the buried contact BC. Similarly to the buried contact BC, the landing pad LP may form the plurality of isolated regions that are spaced apart from each other.

The landing pad LP may include a conductive material. This allows the landing pad LP to be electrically connected to the buried contact BC. For example, the landing pad LP may include tungsten (W).

A fifth interlayer insulating film 280 may be formed on a part of the upper side of the landing pad LP. Further, the fifth interlayer insulating film 280 may define a region of the landing pad LP that forms a plurality of isolated regions. That is, the fifth interlayer insulating film 280 may separate the plurality of landing pads LP from each other. Further, the fifth interlayer insulating film 280 may be patterned to expose a part of the upper side of each landing pad LP.

The fifth interlayer insulating film 280 may electrically separate a plurality of landing pads LP from each other, by including an insulating material. For example, the fifth interlayer insulating film 280 may include a silicon oxide.

The capacitor 290 may be formed on the fifth interlayer insulating film 280 and the landing pad LP. The capacitor 290 may be formed to be in contact with a part of the upper side of the landing pad LP exposed by the fifth interlayer insulating film 280. As a result, the capacitor 290 may be electrically connected to the source and drain region connected to the buried contact BC. Accordingly, the capacitor 290 may store electric charges in the semiconductor memory element or the like.

For example, the capacitor 290 may include a lower electrode 291, a capacitance dielectric film 292, and an upper electrode 293. The capacitor 290 may store electric charges in the capacitance dielectric film 292 by the potential difference generated between the lower electrode 291 and the upper electrode 293.

The lower electrode 291 may include, e.g., a doped semiconductor material, a conductive metal nitride (e.g., titanium nitride, tantalum nitride or tantalum nitride, etc.), a metal (e.g., ruthenium, iridium, titanium or tantalum, etc.), and a conductive metal oxide (e.g., iridium oxide, etc.). The capacitance dielectric film 292 may include, e.g., one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. The upper electrode 293 may include, e.g., at least one of a doped semiconductor material, a metal, a conductive metal nitride, and a metal silicide.

Figure 45:
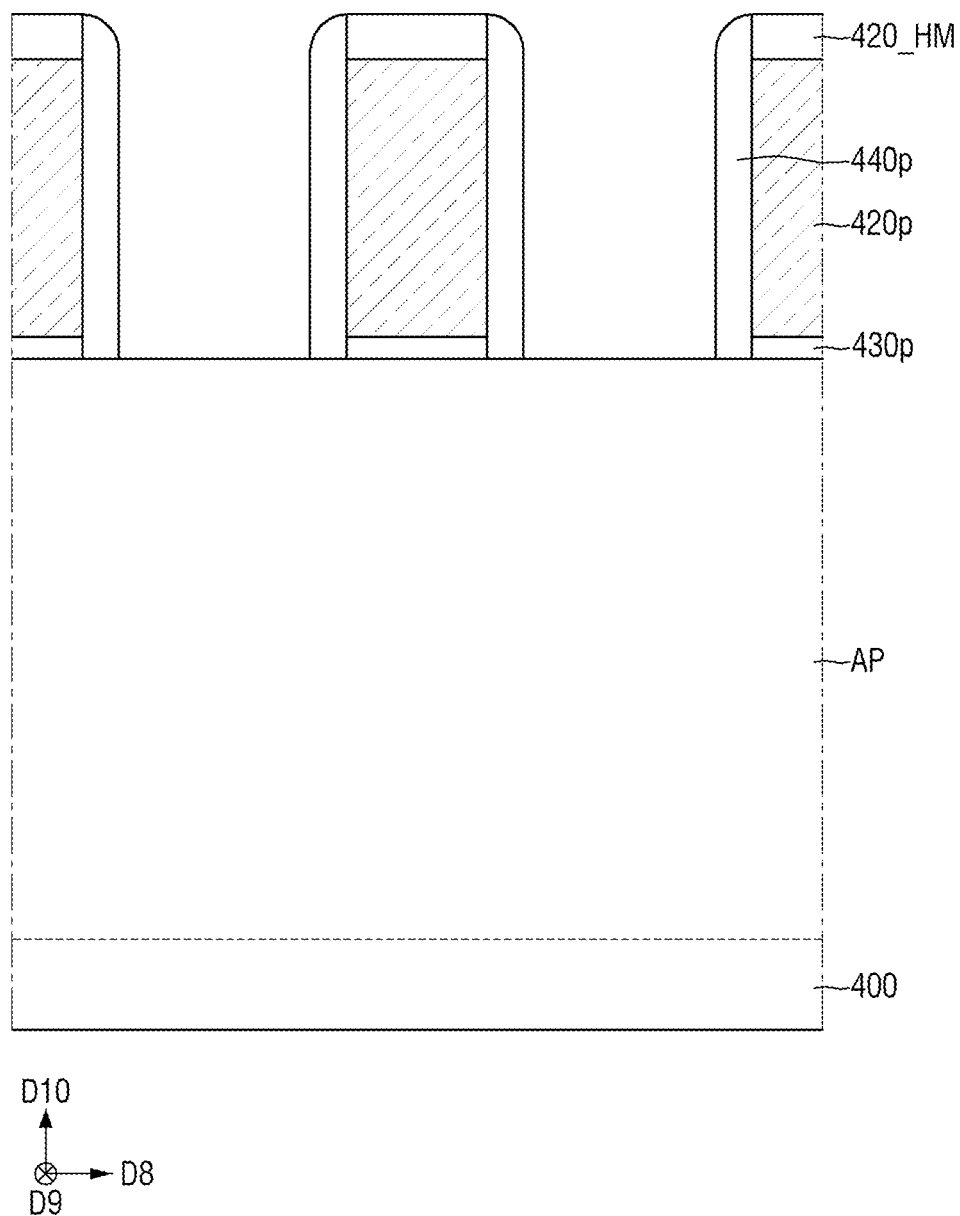
FIGS. 45 to 47 are views of stages in a method for fabricating a semiconductor device according to some embodiments.
Figure 46:
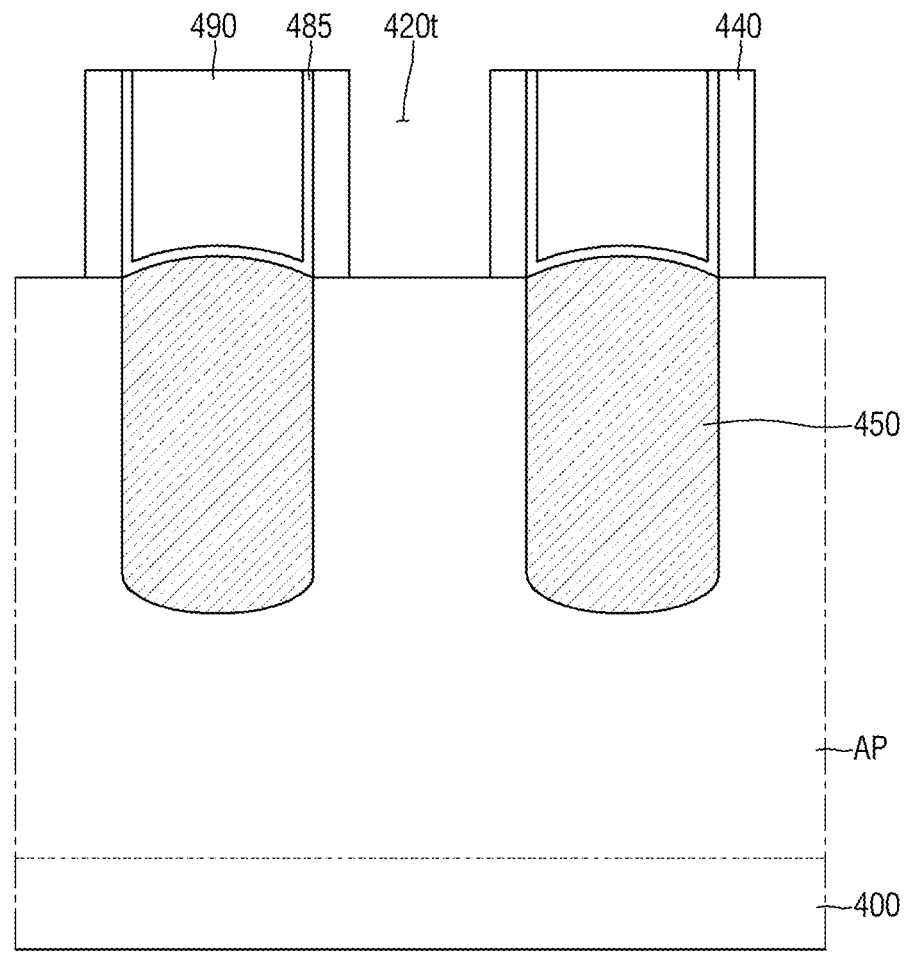
Figure 47:
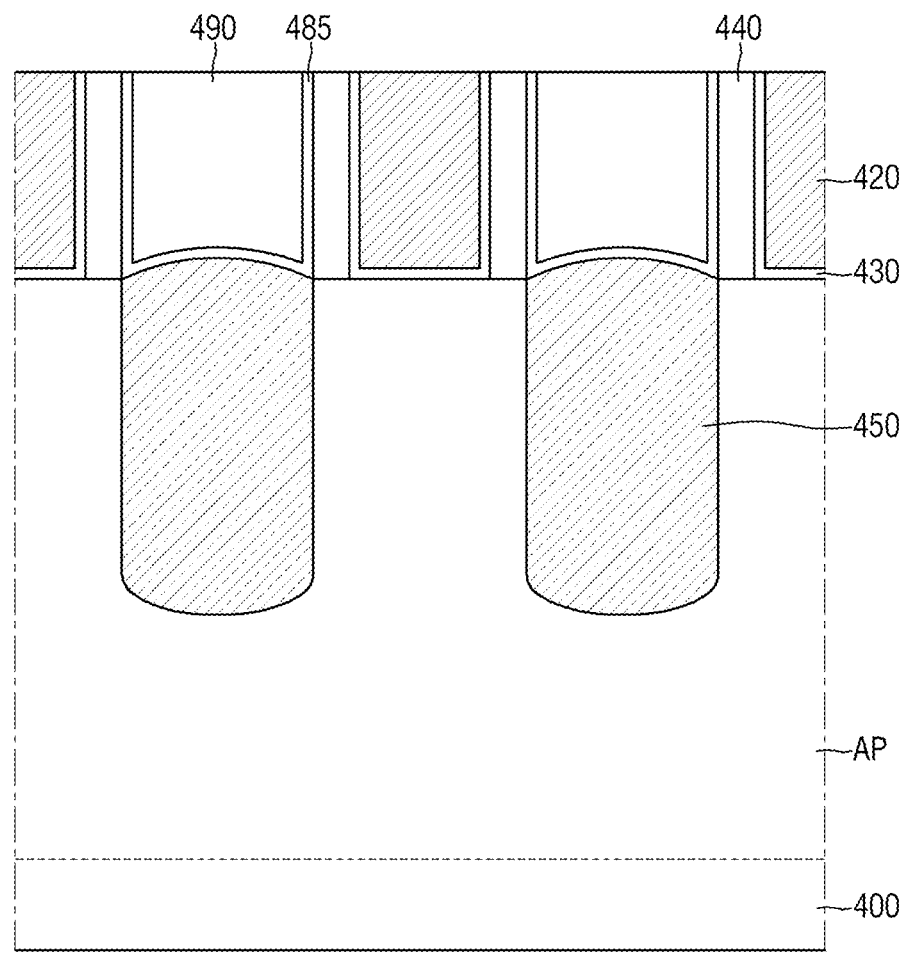

FIGS. 40 to 44 are stages in a method for fabricating a semiconductor device according to some embodiments. FIGS. 45 to 47 are stages in method for fabricating the semiconductor device according to some embodiments.

FIGS. 40 to 47 show, e.g., a fin-type transistor (FinFET) including a channel region of a fin-type pattern shape, a transistor including nanowires or nanosheets, and an MBCFET™ (Multi-Bridge Channel Effect Transistor). However, a semiconductor device according to some embodiments may include or implemented as a tunneling transistor (tunneling FET), a three-dimensional (3D) transistor, a planar transistor, a transistor based on two-dimensional material (2D material-based FETs), and/or a heterogeneous structure thereof.

Hereinafter, a method for fabricating a semiconductor device according to some embodiments will be described referring to FIGS. 40 to 44. For reference, the semiconductor device of FIGS. 40 to 44 may be an MBCFET.

Figure 40:
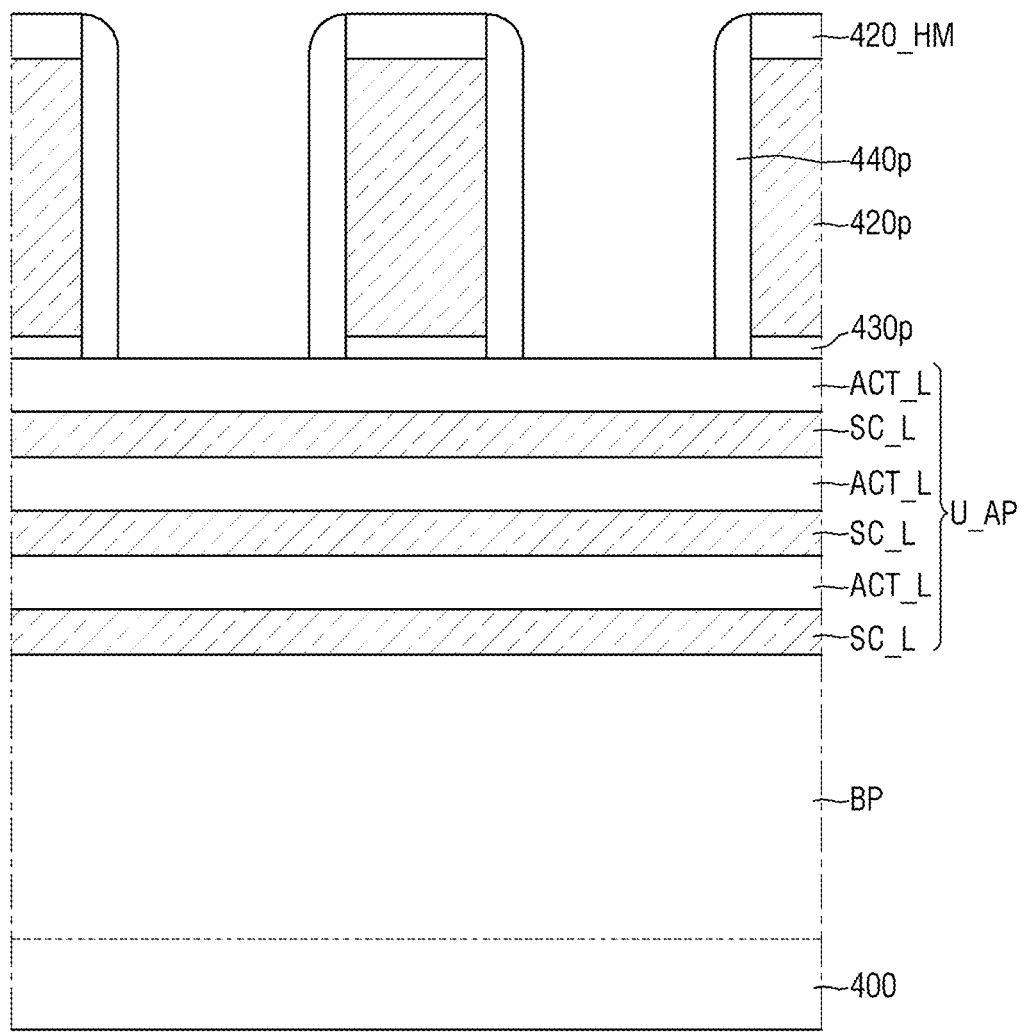
FIGS. 40 to 44 are views of stages in a method for fabricating a semiconductor device according to some embodiments.

Referring to FIG. 40, a lower pattern BP and an upper pattern structure U_AP may be formed on a sixth substrate 400. The lower pattern BP may extend in an eighth direction D8. The upper pattern structure U_AP may extend in the eighth direction D8.

The upper pattern structure U_AP may be formed on the lower pattern BP. The upper pattern structure U_AP may include a sacrificial pattern SC_L and an active pattern ACT_L that are alternately stacked on the lower pattern BP.

For example, the sacrificial pattern SC_L may include a silicon-germanium film. The active pattern ACT_L may include a silicon film.

Subsequently, a dummy gate insulating film 430*p*, a dummy gate electrode 420*p*, and a dummy gate capping film 420_HM may be formed on the upper pattern structure U_AP. The dummy gate electrode 420*p* may extend in the ninth direction D9. The ninth direction D9 may be a direction different from the eighth direction D8. For example, the ninth direction D9 may be perpendicular to the eighth direction D8. The tenth direction D10 may be perpendicular to the ninth direction D9 and the eighth direction D8.

The dummy gate insulating film 430*p* may include, e.g., silicon oxide. The dummy gate electrode 420*p* may include, e.g., polysilicon. The dummy gate capping film 420_HM may include, e.g., silicon nitride.

A pre gate spacer 440*p* may be formed on the side walls of the dummy gate electrode 420*p*.

Figure 41:
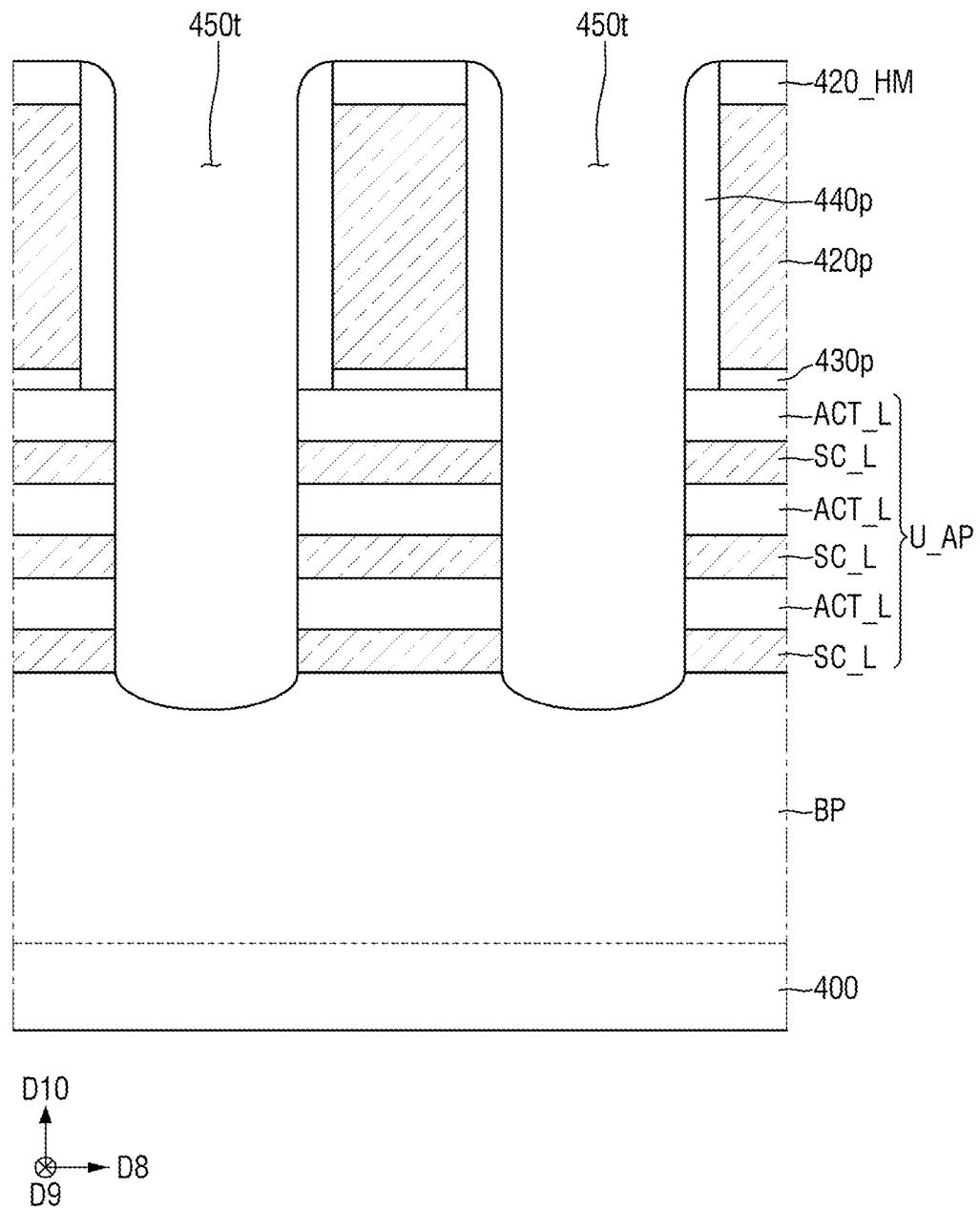

Referring to FIG. 41, a source/drain trench 450*t* may be formed inside the upper pattern structure U_AP, using the dummy gate electrode 420*p* as a mask. A part of the source/drain trench 450*t* may be formed inside the lower pattern BP. A bottom side of the source/drain trench 450*t* may be defined by the lower pattern BP.

Figure 42:
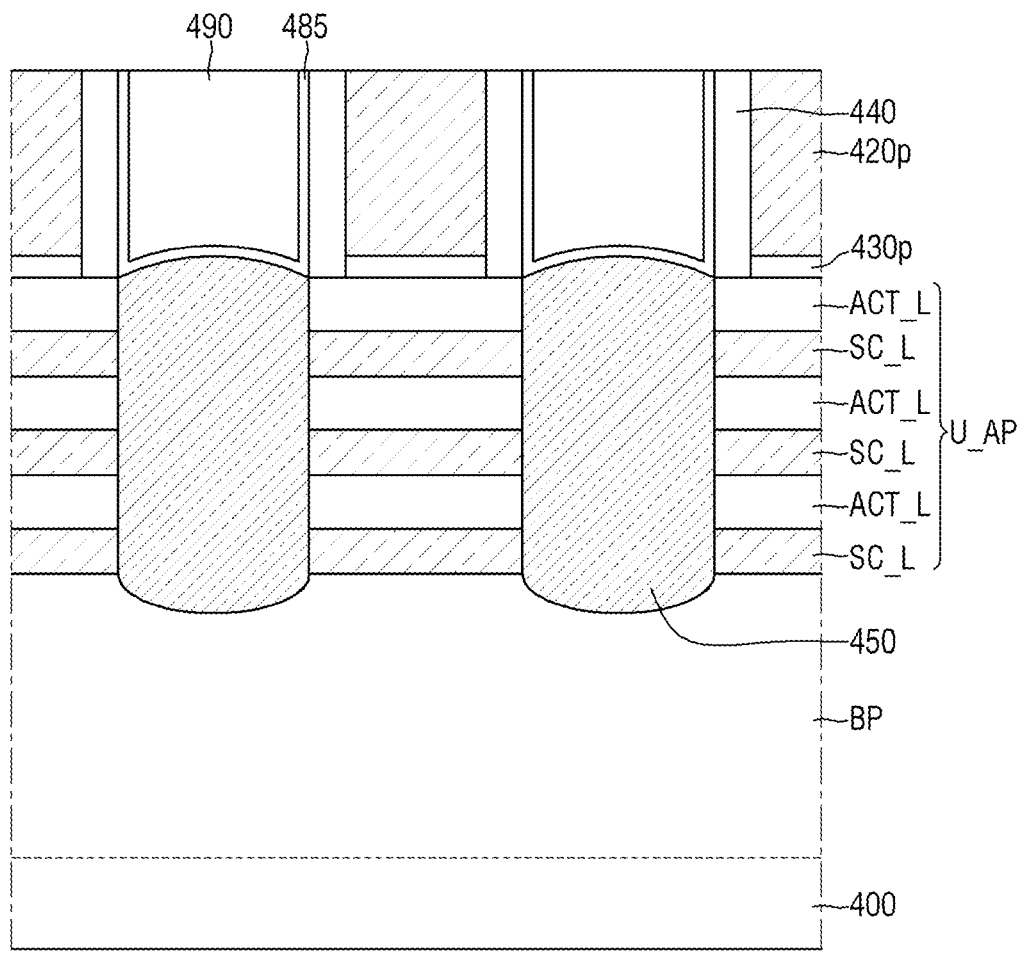

Referring to FIG. 42, a source/drain pattern 450 that fills a part of the source/drain trench 450*t* may be formed.

An etching stop film 485 and a sixth interlayer insulating film 490 may be sequentially formed on the source/drain pattern 450. Subsequently, a part of the sixth interlayer insulating film 490, a part of the etching stop film 485, and the dummy gate capping film 420_HM are removed to expose the upper side of the dummy gate electrode 420*p*. A gate spacer 440 may be formed, while the upper side of the dummy gate electrode 420*p* is exposed.

Figure 43:
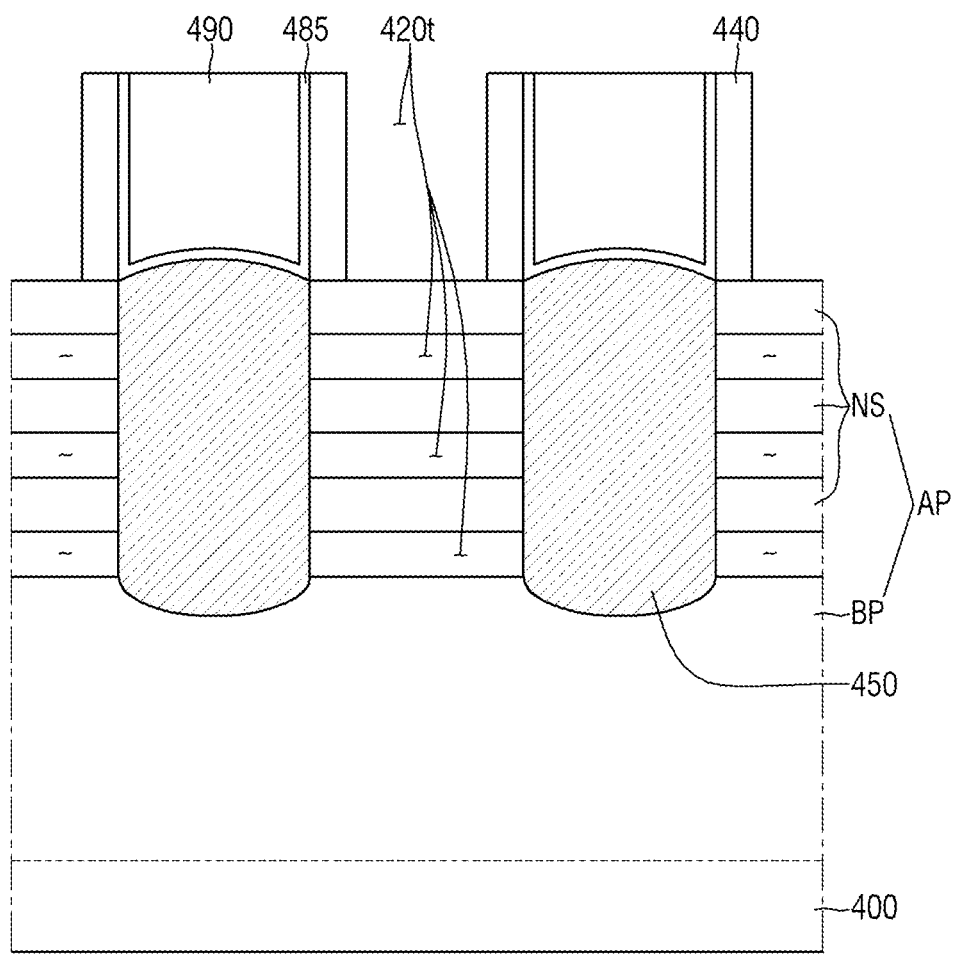

Referring to FIG. 43, the dummy gate insulating film 430*p* and the dummy gate electrode 420*p* may be removed to expose the upper pattern structure U_AP between the gate spacers 440.

After that, the sacrificial pattern SC_L may be removed to form a sheet pattern NS. The sheet pattern NS and the lower pattern BP may form an active pattern AP. Accordingly, a second gate trench 420*t* is formed between the gate spacers 140 and between the source/drain patterns 450.

Figure 44:
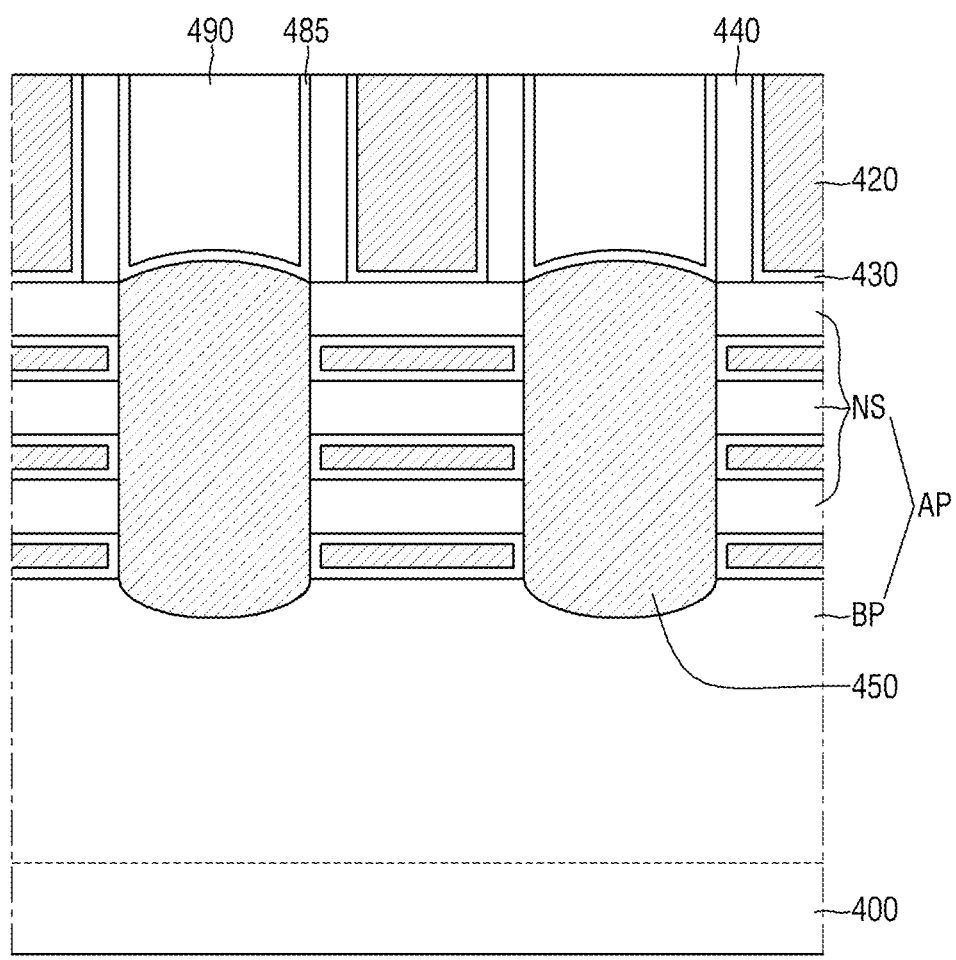

Referring to FIG. 44, the gate insulating film 430 and the second gate electrode 420 may be formed inside the second gate trench 420*t*.

The second gate electrode 420 may be formed on the gate insulating film 430. The second gate electrode 420 may be formed, using a wet deposition process. The second gate electrode 420 may be deposited, e.g., using electroless plating or electroplating deposition process. The second gate electrode 420 may be formed of a single layer. For example, the second gate electrode 420 may be a single layer including at least one of copper (Cu), tungsten (W), nickel (Ni), molybdenum (Mo), cobalt (Co), and ruthenium (Ru). Preferably, the second gate electrode 420 may include nickel (Ni). The second gate electrode 420 may not include fluorine (F) or chlorine (Cl).

Hereinafter, a method for fabricating a semiconductor device according to some embodiments will be described referring to FIGS. 45 to 47. For reference, the semiconductor device of FIGS. 45 to 47 may be a FinFET. For convenience of explanation, differences relative to those described with reference to FIGS. 40 to 44 will be mainly described.

Referring to FIG. 45, the active pattern AP may be formed on the sixth substrate 400. The active pattern AP may extend in the eighth direction D8.

A dummy gate insulating film 430p, a dummy gate electrode 420p, and a dummy gate capping film 420_HM may be formed on the active pattern AP. The dummy gate insulating film 430p, the dummy gate electrode 420p, and the dummy gate capping film 420_HM may extend in a ninth direction D9. The dummy gate insulating film 430p, the dummy gate electrode 420p, and the dummy gate capping film 420_HM may intersect the active pattern AP. A pre gate spacer 440p may be formed on the side walls of the dummy gate electrode 420p.

Referring to FIG. 46, a source/drain trench may be formed inside the active pattern AP, using the dummy gate electrode 420p as a mask.

Next, the source/drain pattern 450 that fills the source/drain trench may be formed. An etching stop film 485 and a sixth interlayer insulating film 490 may be formed on the source/drain pattern 450.

Subsequently, a part of the sixth interlayer insulating film 490, a part of the etching stop film 485, and the dummy gate capping film 420_HM may be removed to expose the upper side of the dummy gate electrode 420p. The gate spacer 440 may be formed, while the upper side of the dummy gate electrode 420p is exposed. Subsequently, the dummy gate insulating film 430p and the dummy gate electrode 420p are removed to form a second gate trench 420t between the gate spacers 440.

Referring to FIG. 47, the gate insulating film 430 and the second gate electrode 420 that fill the second gate trench 420t may be formed.

The second gate electrode 420 may be formed, using a wet deposition process. The second gate electrode 420 may be deposited, e.g., using electroless plating or electroplating deposition process.

By way of summation and review, aspects of the present disclosure provide a method for fabricating a semiconductor device having improved element performance and degree of integration. That is, according to example embodiments, a method for fabricating a semiconductor device provides a deposition method using precipitation of a plating solution in a liquid, e.g., an electroless deposition and an electroplate method, which results in a barrierless integration (no diffusion or adhesion barrier is required) and no impurities induced by precursor (as no fluorine or chlorine are used), e.g., as compared to an atomic layer deposition (ALD).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a semiconductor device, the method comprising:
   forming a mold structure on a substrate, such that the mold structure includes inter-electrode insulating films and sacrificial films alternately and repeatedly stacked in a first direction;
   forming a channel hole which penetrates the mold structure in the first direction; forming a vertical channel structure inside the channel hole;
   forming a channel insulating film between the vertical channel structure and the mold structure;
   removing the sacrificial films to form trenches which expose the channel insulating film, the trenches extending in a second direction perpendicular to the first direction, each of the trenches being formed between a corresponding pair of adjacent ones of the inter-electrode insulating films; and
   forming metallic lines which fill the trenches, respectively, each of the metallic lines being formed as a single layer, using a wet deposition process, each metallic line directly contacting each of inter-electrode insulating films of the corresponding pair of inter-electrode insulating films.

2. The method for fabricating the semiconductor device as claimed in claim 1, wherein a width of each of the trenches in the first direction is 30 nm or less.

3. The method for fabricating the semiconductor device as claimed in claim 1, wherein the metallic lines are formed using at least one of an electroless plating deposition or an electroplating deposition.

4. The method for fabricating the semiconductor device as claimed in claim 1, wherein the metallic lines do not include either of fluorine (F) or chlorine (Cl).

5. The method for fabricating the semiconductor device as claimed in claim 1, wherein the metallic lines include at least one of copper, tungsten, nickel, molybdenum, cobalt, and ruthenium.

6. The method for fabricating the semiconductor device as claimed in claim 5, wherein the metallic lines are formed of nickel.

7. The method for fabricating the semiconductor device as claimed in claim 1, further comprising forming a cutting line which penetrates the mold structure in the first direction.

8. The method for fabricating the semiconductor device as claimed in claim 1,
   wherein each of the trenches is formed to include a second side which exposes the channel insulating film, and
   wherein each of the metallic lines is formed from the second side of a corresponding one of the trenches in a bottom-up manner.

9. The method for fabricating the semiconductor device as claimed in claim 1, further comprising forming a bit line on the mold structure, such that the bit line is connected to the vertical channel structure, and the bit line extends in a third direction perpendicular to the first direction and the second direction.

10. The method of claim 1, wherein:
    the channel insulating film comprises a tunnel insulating film, a blocking insulating film and a charge storage film between the tunnel insulating film and the blocking insulating film, and
    each metallic line directly contacts the blocking insulating film.

11. The method of claim 1, wherein:
    the vertical channel structure includes a vertical channel film and a vertical insulating pattern, the vertical channel film includes a conductive material,
the vertical insulating pattern includes insulating material, and
the channel insulating film directly contacts the vertical channel film.

12. The method of claim 11, wherein:
the semiconductor device is a memory device comprising:
    a common source line,
    a bit line, and
    a cell string electrically connected between the common source line and the bit line, and
the metallic lines are electrically connected to the vertical channel film.

13. The method of claim 1, wherein:
the semiconductor device is a memory device comprising:
    a common source line,
    a bit line, and
    a cell string electrically connected between the common source line and the bit line, and
the metallic lines are configured to control the cell string.

14. The method of claim 13, wherein:
the memory device further comprises word lines,
the word lines include the metallic lines,
the cell string includes memory cell transistors, and
the word lines are configured to be gate electrodes of the memory cell transistors.

15. The method of claim 14, wherein:
the channel insulating film comprises a tunnel insulating film, a blocking insulating film and a charge storage film between the tunnel insulating film and the blocking insulating film, and
each metallic line directly contacts the blocking insulating film.

16. The method of claim 13, wherein:
the memory device further comprises word lines and a ground selection line,
the word lines include a first set of the metallic lines,
the ground selection line include one of the metallic lines, which is other than the first set of the metallic lines,
the cell string includes memory cell transistors, and
the word lines are configured to be gate electrodes of the memory cell transistors.

17. The method of claim 13, wherein:
the memory device further comprises an erasure control line and a string selection line,
the erasure control line includes a first conductive line formed simultaneously with the metallic lines,
the string selection line includes a second conductive line formed simultaneously with the metallic lines.

* * * * *